(12) United States Patent
Hidaka

(10) Patent No.: US 6,359,805 B1
(45) Date of Patent: Mar. 19, 2002

(54) THIN FILM MAGNETIC MEMORY DEVICE CAPABLE OF EASILY CONTROLLING A DATA WRITE CURRENT

(75) Inventor: Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/805,043

(22) Filed: Mar. 14, 2001

(30) Foreign Application Priority Data

Oct. 17, 2000 (JP) ........................................ 2000-316867

(51) Int. Cl.$^7$ .............................................. G11C 11/14
(52) U.S. Cl. ........................................ 365/171; 365/173
(58) Field of Search ............................. 365/97, 171, 173

(56) References Cited

U.S. PATENT DOCUMENTS

| | | | |
|---|---|---|---|
| 5,640,343 A | 6/1997 | Gallagher et al. | 365/171 |
| 5,650,958 A | 7/1997 | Gallagher et al. | 365/173 |
| 5,734,605 A | 3/1998 | Zhu et al. | 365/173 |
| 5,835,314 A | 11/1998 | Moodera et al. | 360/113 |
| 6,034,887 A * | 3/2000 | Gupta et al. | 365/171 |
| 6,166,944 A * | 12/2000 | Ogino | 365/97 |
| 6,172,918 B1 * | 1/2001 | Hidaka | 365/189.11 |
| 6,191,972 B1 * | 2/2001 | Miura et al. | 365/171 |

OTHER PUBLICATIONS

"A 10ns Read and Write Non–Volatile Memory Array Using a Magnetic Tunnel Junction and FET Switch in Each Cell", Scheuerlein et al., ISSCC Digest of Technical Papers, TA7.2, Feb. 2000, pp. 94–95, 128–129, and 409–410.

"Nonvolatile RAM based on Magnetic Tunnel Junction Elements", Durlam et al., ISSCC Digest of Technical Papers, TA7.3, Feb. 2000, pp. 96–97, 130–131 and 410–411.

* cited by examiner

Primary Examiner—Richard Elms
Assistant Examiner—Hien Nguyen
(74) Attorney, Agent, or Firm—McDermott, Will & Emery

(57) ABSTRACT

Folded bit line pairs are provided corresponding to the respective MTJ (Magnetic Tunnel Junction) memory cell columns. Two bit lines forming each bit line pair are respectively coupled through a corresponding column selection gate to two data lines forming a data I/O line pair DI/OP. In the data write operation, an equalizing transistor provided corresponding to the respective bit line is turned ON to short-circuit the two bit lines. A data write current control circuit sets one of the two data lines to one of a high potential state and a low potential state as well as sets the other data line to the other potential state, whereby the direction of a data write current flowing though the bit line pair as reciprocating current can be easily controlled according to the write data level.

21 Claims, 36 Drawing Sheets

THIN FILM MAGNETIC MEMORY DEVICE CAPABLE OF EASILY CONTROLLING A DATA WRITE CURRENT

BACKGROUND OF THE INVENTION

1. Field of the Invention

The present invention relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device that stores data in a non-volatile manner using a plurality of thin film magnetic elements formed in a semiconductor integrated circuit and is capable of random access to each thin film magnetic element.

In particular, recent announcement shows that significant progress in performance of the MRAM device is achieved by using thin film magnetic elements having a magnetic tunnel junction (MTJ) as memory cells. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 41 is a schematic diagram showing the structure of a memory cell having a magnetic tunnel junction (hereinafter, also simply referred to as MTJ memory cell).

Referring to FIG. 41, the MTJ memory cell includes a magnetic tunnel junction MTJ having its resistance value varied according to the level of storage data, and an access transistor ATR. The access transistor ATR is formed by a field effect transistor, and is coupled between the magnetic tunnel junction MTJ and ground potential Vss.

For the MTJ memory cell are provided a write word line WWL for instructing a data write operation, a read word line RWL for instructing a data read operation, and a bit line BL serving as a data line for transmitting an electric signal corresponding to the level of storage data in the data read and write operations.

FIG. 42 is a conceptual diagram illustrating the data read operation from the MTJ memory cell.

Referring to FIG. 42, the magnetic tunnel junction MTJ has a magnetic layer FL having a fixed magnetic field of a fixed direction (hereinafter, also simply referred to as fixed magnetic layer FL), and a magnetic layer VL having a free magnetic field (hereinafter, also simply referred to as free magnetic layer VL). A tunnel barrier TB formed from an insulator film is provided between the fixed magnetic layer FL and free magnetic layer VL. According to the level of storage data, either a magnetic field of the same direction as that of the fixed magnetic layer FL or a magnetic field of the direction different from that of the fixed magnetic field FL has been written to the free magnetic layer VL in a non-volatile manner.

In reading the data, the access transistor ATR is turned ON in response to activation of the read word line RWL. As a result, a sense current Is flows through a current path formed by the bit line BL, magnetic tunnel junction MTJ, access transistor ATR and ground potential Vss. The sense current Is is supplied as a constant current from a not-shown control circuit.

The resistance value of the magnetic tunnel junction MTJ varies according to the relative relation of the magnetic field direction between the fixed magnetic layer FL and free magnetic layer VL. More specifically, in the case where the fixed magnetic layer FL and free magnetic layer VL have the same magnetic field direction, the magnetic tunnel junction MTJ has a smaller resistance value as compared to the case where both magnetic layers have different magnetic field directions.

Accordingly, in reading the data, a potential change at the magnetic tunnel junction MTJ due to the sense current Is varies according to the magnetic field direction stored in the free magnetic layer VL. Thus, for example, by starting supply of the sense current Is after precharging the bit line BL to a high potential, the level of storage data in the MTJ memory cell can be read by monitoring a potential level change on the bit line BL.

FIG. 43 is a conceptual diagram illustrating the data write operation to the MTJ memory cell.

Referring to FIG. 43, in writing the data, the read word line RWL is inactivated, and the access transistor ATR is turned OFF. In this state, a data write current for writing a magnetic field to the free magnetic layer VL is applied to the write word line WWL and bit line BL. The magnetic field direction of the free magnetic layer VL is determined by combination of the respective directions of the data write current flowing through the write word line WWL and bit line BL.

FIG. 44 is a conceptual diagram illustrating the relation between the respective directions of the data write current and magnetic field in the data write operation.

Referring to FIG. 44, a magnetic field Hx of the abscissa indicates the direction of a magnetic field H(WWL) produced by the data write current flowing through the write word line WWL. A magnetic field Hy of the ordinate indicates the direction of a magnetic field H(BL) produced by the data write current flowing through the bit line BL.

The magnetic field direction stored in the free magnetic layer VL is updated only when the sum of the magnetic fields H(WWL) and H(BL) reaches the region outside the asteroid characteristic line shown in the figure. In other words, the magnetic field direction stored in the free magnetic layer VL is not updated when a magnetic field corresponding to the region inside the asteroid characteristic line is applied.

Accordingly, in order to update the storage data of the magnetic tunnel junction MTJ by the data write operation, a current must be applied to both the write word line WWL and bit line BL. Once the magnetic field direction, i.e., the storage data, is stored in the magnetic tunnel junction MTJ, it is held therein in a non-volatile manner until a new data read operation is conducted.

The sense current Is flows through the bit line BL even in the data read operation. However, the sense current Is is generally set to a value that is smaller than the above-mentioned data write current by about one or two orders of magnitude. Therefore, it is less likely that the storage data in the MTJ memory cell is erroneously rewritten due to the sense current is during the data read operation.

The above-mentioned technical documents disclose a technology of forming an MRAM device, a random access memory, with such MTJ memory cells integrated on a semiconductor substrate.

FIG. 45 is a conceptual diagram showing the MTJ memory cells arranged in rows and columns in an integrated manner.

Referring to FIG. 45, with the MTJ memory cells arranged in rows and columns on the semiconductor substrate, a highly integrated MRAM device can be realized. FIG. 45 shows the case where the MTJ memory cells are arranged in n rows by m columns (where n, m is a natural number).

As described before, the bit line BL, write word line WWL and read word line RWL are provided for each MTJ memory cell. Accordingly, n write word lines WWL1 to WWLn, n read word lines RWL to RWLn, and m bit lines BL1 to BLm must be provided for the n×m MTJ memory cells.

Thus, for the MTJ memory cells, the independent word lines are generally provided for the read and write operations.

FIG. 46 is a diagram showing the structure of the MTJ memory cell formed on the semiconductor substrate.

Referring to FIG. 46, the access transistor ATR is formed in a p-type region PAR of a semiconductor main substrate SUB. The access transistor ATR has source/drain regions (n-type regions) 110, 120 and a gate 130. The source/drain region 10 is coupled to the ground potential Vss through a metal wiring formed in a first metal wiring layer M1. A metal wiring formed in a second metal wiring layer M2 is used as the write word line WWL. The bit line BL is formed in a third metal wiring layer M3.

The magnetic tunnel junction MTJ is formed between the second metal wiring layer M2 of the write word line WWL and the third metal wiring layer M3 of the bit line BL. The source/drain region 120 of the access transistor ATR is electrically coupled to the magnetic tunnel junction MTJ through a metal film 150 formed in a contact hole, the first and second metal wiring layers M1 and M2, and a barrier metal 140. The barrier metal 140 is a buffer material for providing electrical coupling between the magnetic tunnel junction MTJ and metal wirings.

As described before, in the MTJ memory cell, the read word line RWL is provided independently of the write word line WWL. In addition, in writing the data, a data write current for generating a magnetic field equal to or higher than a predetermined value must be applied to the write word line WLL and bit line BL. Accordingly, the bit line BL and write word line WWL are each formed from a metal wiring.

On the other hand, the read word line RWL is provided in order to control the gate potential of the access transistor ATR. Therefore, a current need not be actively applied to the read word line RWL. Accordingly, for the purpose of improving the integration degree, the read word line RWL is conventionally formed from a polysilicon layer, polycide structure, or the like in the same wiring layer as that of the gate 130 without forming an additional independent metal wiring layer.

Thus, integrating the MTJ memory cells on the semiconductor substrate requires a large number of wirings for the memory cells. Therefore, the total number of wirings is increased, resulting in increase in manufacturing cost. Moreover, since a large number of MTJ memory cells are always connected to the bit line BL, the bit line BL has a relatively large parasitic capacitance. Furthermore, the read word line RWL is formed from a polysilicon layer or polycide structure, as described above. As a result, it has been difficult to increase the read operation speed.

Even in writing the data, a relatively large data write current must be applied to the bit line BL. Moreover, the direction of the data write current must be controlled according to the level of write data, resulting in complicated circuitry for controlling the data write current.

SUMMARY OF THE INVENTION

It is an object of the present invention to achieve reduction in manufacturing cost by simplifying the structure of control circuitry for supplying a data write current in an MRAM device having MTJ memory cells.

It is another object of the present invention to improve the freedom of layout and thus reduce the layout area, i.e., the chip area, by separately providing respective drive circuits for read word lines and write word lines.

It is still another object of the present invention to achieve reduction in manufacturing cost by reducing the number of wirings required for each memory cell.

In summary, according to one aspect of the present invention, a thin film magnetic memory device includes a memory array, a plurality of write word lines, a plurality of bit line pairs, a data write control circuit, and a plurality of bit line current control circuits. The memory array has a plurality of magnetic memory cells arranged in rows and columns. Each magnetic memory cell has a resistance value that varies according to a level of storage data to be written when a data write magnetic field applied by first and second data write currents is larger than a predetermined magnetic field. The plurality of write word lines are provided corresponding to the respective rows of the magnetic memory cells, and are selectively activated according to an address selection result in a data write operation so as to cause the first data write current to flow therethrough. The plurality of bit line pairs are provided corresponding to the respective columns of the magnetic memory cells, and each includes first and second bit lines. In the data write operation, the data write control circuit sets one of the first and second bit lines included in one of the plurality of bit line pairs that is selected according to the address selection result, to one of a high potential state and a low potential state as well as sets the other bit line to the other potential state. The plurality of bit line current control circuits are provided respectively corresponding to the plurality of bit line pairs, for electrically coupling the corresponding first and second bit lines to each other in the data write operation so as to cause the second data write current to flow therethrough.

Accordingly, an advantage of the present invention mainly resides in the fact that the data write current can be made to flow through the short-circuited bit line pair as reciprocating current in the data write operation, and therefore the structure for controlling the data write current can be simplified.

According to another aspect of the present invention, a thin film magnetic memory device includes a memory array, a plurality of write word lines, a plurality of bit lines, a data line pair, a data write control circuit, a plurality of column selection gate circuits, and a plurality of bit line current control circuits. The memory array has a plurality of magnetic memory cells arranged in rows and columns. Each magnetic memory cell has a resistance value that varies according to a level of storage data to be written when a data write magnetic field applied by first and second data write currents is larger than a predetermined magnetic field. The plurality of write word lines are provided corresponding to the respective rows of the magnetic memory cells, for causing the first data write current to flow therethrough according to an address selection result in a data write operation. The plurality of bit lines are provided corresponding to the respective columns of the magnetic memory cells.

The data line pair is provided in common to the plurality of bit lines, and is formed by first and second data lines. The data write control circuit sets one of the first and second data lines to one of a high potential state and a low potential state as well as sets the other data line to the other potential state in the data write operation. The plurality of column selection gate circuits are provided corresponding to the respective columns, for connecting the corresponding bit line to the first data line according to the address selection result. The plurality of bit line current control circuits are provided corresponding to the respective columns, for electrically coupling the corresponding bit line to the second data line so as to cause the second data write current to flow therethrough in the data write operation.

In such a thin film magnetic memory device, the direction of the data write current flowing through the open bit line can be set by controlling the respective potential levels on the first and second data lines forming the data line pair. Therefore, the structure for controlling the data write current can be simplified.

According to a still another aspect of the present invention, a thin film magnetic memory device includes a memory array, a plurality of read word lines, a plurality of write word lines, a plurality of write data lines, and a plurality of read data lines. The memory array has a plurality of magnetic memory cells arranged in rows and columns. Each magnetic memory cell includes a storage portion having a resistance value that varies according to a level of storage data to be written when a data write magnetic field applied by first and second data write currents is larger than a predetermined magnetic field, and a memory cell selection gate for passing a data read current therethrough into the storage portion in a data read operation. The plurality of read word lines are provided corresponding to the respective rows of the magnetic memory cells, for actuating the corresponding memory cell selection gate according to an address selection result in the data read operation. The plurality of write word lines are provided corresponding to the respective columns of the magnetic memory cells, and are selectively driven to an active state according to an address selection result in a data write operation so as to cause the first data write current to flow therethrough. The plurality of write data lines are provided corresponding to the respective rows, for causing the second data write current to flow therethrough in the data write operation. The plurality of read data lines are provided corresponding to the respective columns, for causing the data read current to flow therethrough in the data read operation.

In such a thin film magnetic memory device, the read word lines and the write word lines are provided respectively corresponding to the rows and columns of the magnetic memory cells. Accordingly, a circuit for selectively driving the read word lines and a circuit for selectively driving the write word lines can be independently provided. As a result, the freedom of layout can be improved, resulting in improvement in integration degree.

According to yet another aspect of the present invention, a thin film magnetic memory device includes a memory array, a plurality of read word lines, a plurality of write word lines, a plurality of common lines, and a current control circuit. The memory array has a plurality of magnetic memory cells arranged in rows and columns. Each magnetic memory cell includes a storage portion having a resistance value that varies according to a level of storage data to be written when a data write magnetic field applied by first and second data write currents is larger than a predetermined magnetic field, and a memory cell selection gate for passing a data read current therethrough into the storage portion in a data read operation. The plurality of read word lines are provided corresponding to the respective rows of the magnetic memory cells, for actuating the corresponding memory cell selection gate according to an address selection result in the data read operation. The plurality of write data lines are provided corresponding to one of the respective rows and the respective columns, for causing the first data write current to flow therethrough in the data write operation. The plurality of common lines are provided corresponding to the other of the respective rows and the respective columns. Each common line selectively receives supply of the data read current according to the address selection result in the data read operation. Each common line is selectively driven to a first potential so as to cause the second data write current to flow therethrough in the data write operation. The current control circuit couples and disconnects a second potential to and from each of the common lines in the data read and write operations, respectively, the second potential being different from the first potential.

In such a thin film magnetic memory device, the common line is capable of having both the function of the read data line in the data read operation and the function of the write word line in the data write operation. As a result, the number of wirings can be reduced, whereby reduction in manufacturing cost can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the accompanying drawings.

First Embodiment

Figure 1:
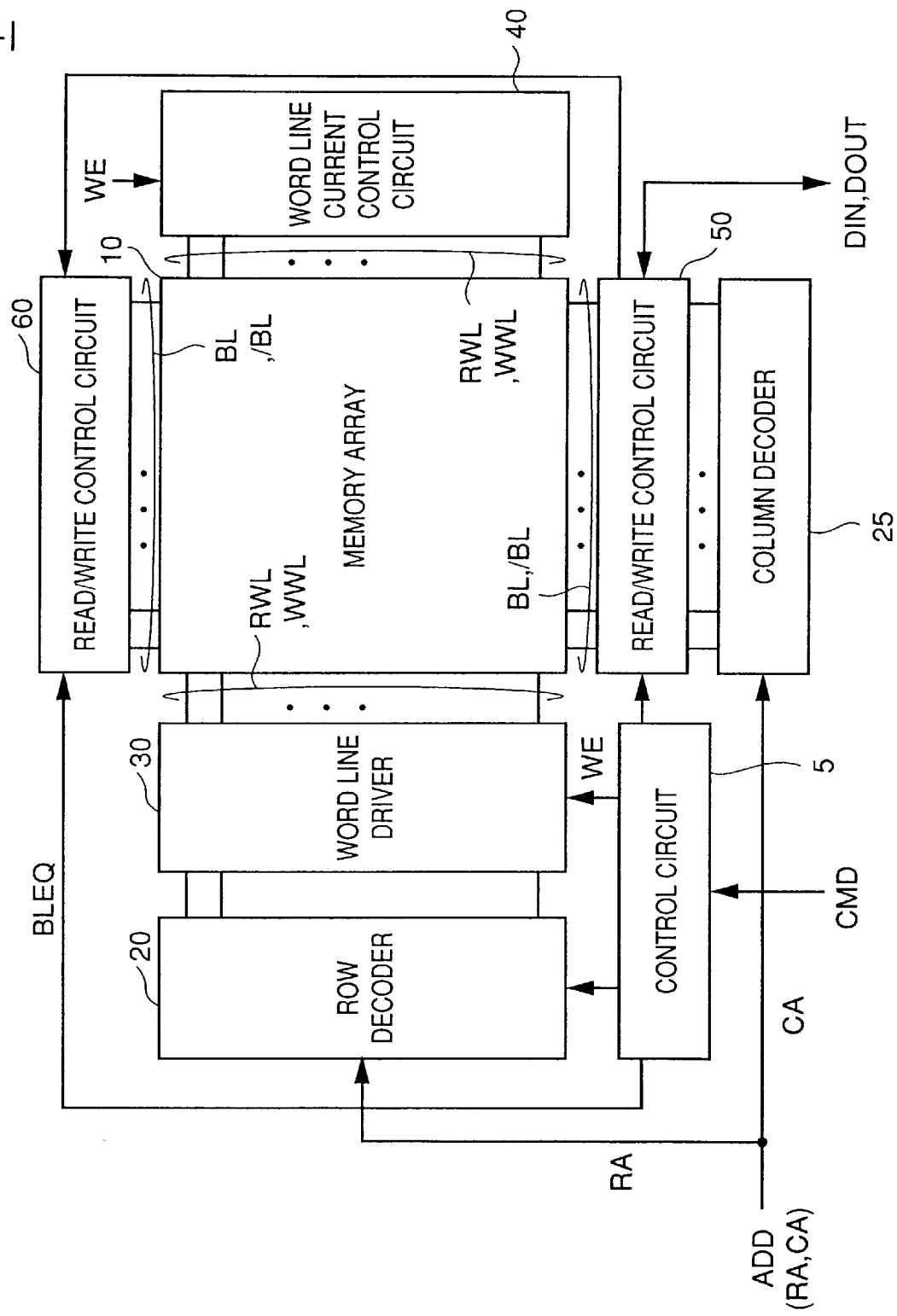
FIG. 1 is a schematic block diagram showing the overall structure of an MRAM device 1 according to a first embodiment of the present invention.

Referring to FIG. 1, an MRAM device 1 according to the first embodiment of the present invention conducts random access in response to an external control signal CMD and address signal ADD, thereby conducting input of write data DIN and output of read data DOUT.

The MRAM device 1 includes a control circuit 5 for controlling the overall operation of the MRAM device 1 in response to the control signal CMD, and a memory array 10 having a plurality of MTJ memory cells arranged in n rows by m columns. Although the structure of the memory array 10 will be described later in detail, a plurality of write lines WWL and a plurality of read word lines RWL are provided corresponding to the respective MTJ memory cell rows. Bit line pairs having a folded structure are provided corresponding to the respective MTJ memory cell columns. Each bit line pair is comprised of bit lines BL and /BL. Note that, hereinafter, a set of bit lines BL and /BL is also collectively referred to as a bit line pair BLP.

The MRAM device 1 further includes a row decoder 20 for conducting row selection of the memory array 10 according to a row address RA indicated by the address signal ADD, a column decoder 25 for conducting column selection of the memory array 10 according to a column address CA indicated by the address signal ADD, a word line driver 30 for selectively activating the read word line RWL and write word line WWL based on the row selection result of the row decoder 20, a word line current control circuit 40 for applying a data write current to the write word line WWL in the data write operation, and read/write control circuits 50, 60 for applying a data write current ±Iw and a sense current Is in the data read and write operations.

Figure 2:
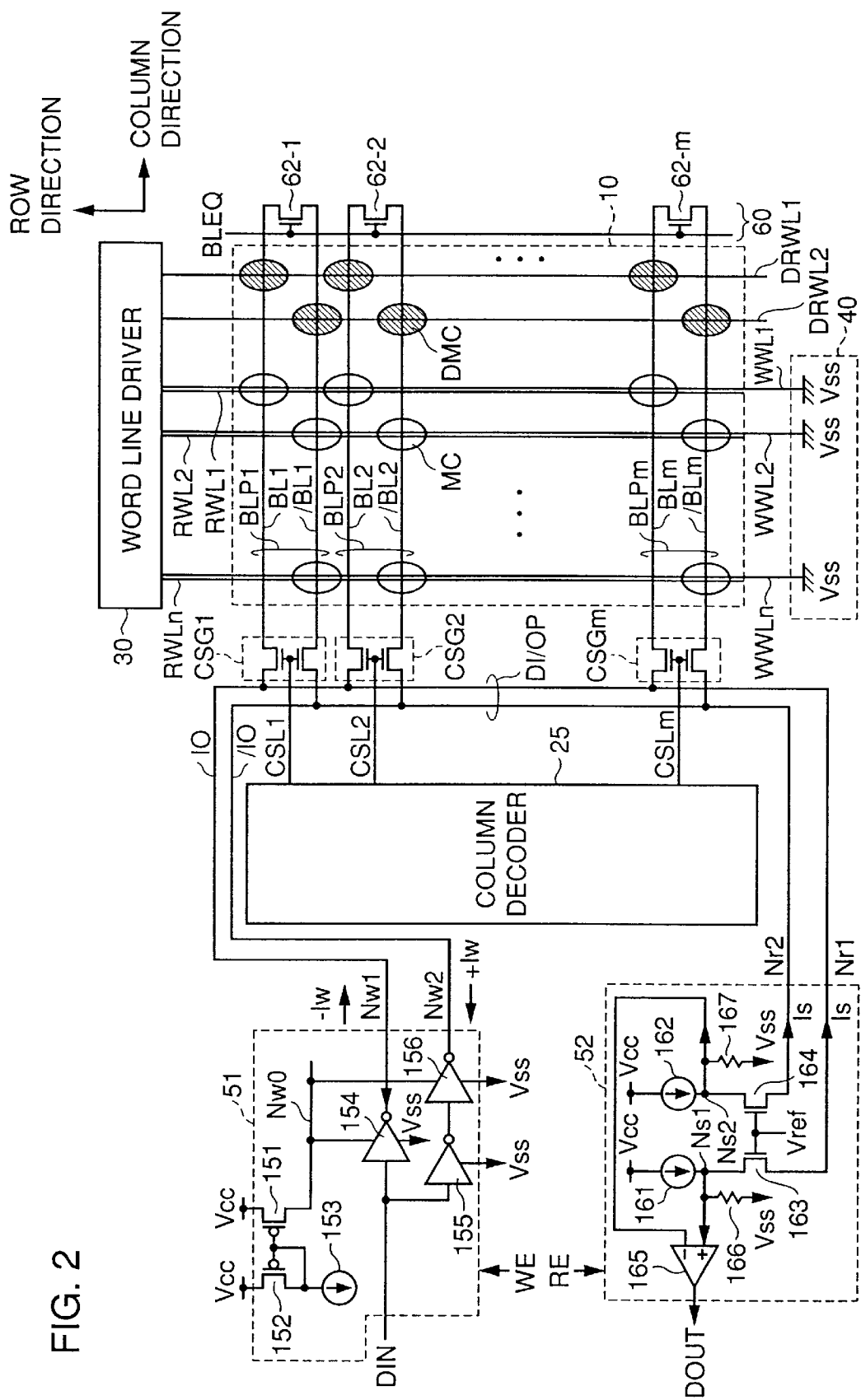
FIG. 2 is a diagram illustrating in detail the structure of a memory array 10 and its peripheral circuitry according to the first embodiment.
Figure 41:
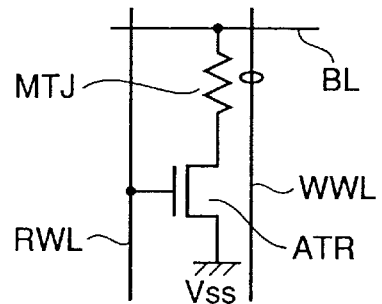
FIG. 41 is a schematic diagram showing the structure of a memory cell having a magnetic tunnel junction.
Figure 42:
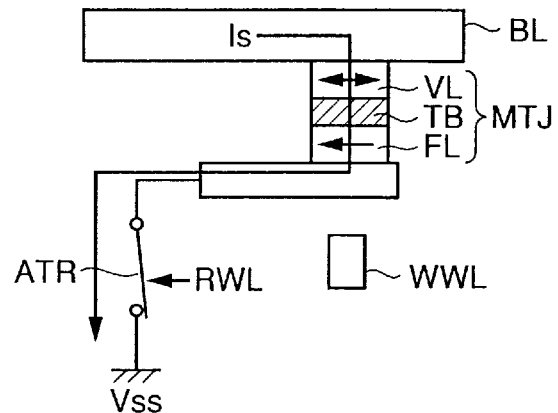
FIG. 42 is a conceptual diagram illustrating the data read operation from the MTJ memory cell.
Figure 43:
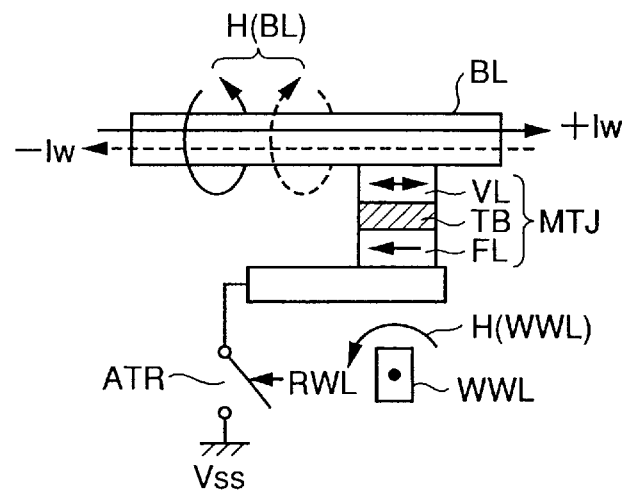
FIG. 43 is a conceptual diagram illustrating the data write operation to the MTJ memory cell.

Referring to FIG. 2, the memory array 10 has MTJ memory cells MC arranged in n rows by m columns. Each MTJ memory cell has the structure shown in FIG. 41. Read word lines RWL1 to RWLn and write word lines WWL1 to WWLn are provided corresponding to the respective MTJ memory cell rows (hereinafter, also simply referred to as memory cell rows).

Bit lines BL1, /BL1 to BLm, /BLm forming the bit line pairs are provided corresponding to the respective MTJ memory cell columns (hereinafter, also simply referred to as memory cell columns).

Note that, hereinafter, the write word lines, read word lines, bit lines and bit line pairs are generally denoted with WWW, RWL, BL (/BL) and BLP, respectively. A specific write word line, read word line, bit line and bit line pair are denoted with, for example, WWL1, RWL1, BL1 (/BL1) and BLP1, respectively.

The write word lines WWL1 to WWLn are coupled to the ground potential Vss by the word line current control circuit 40. Thus, a data write current Ip flows through the write word line WWL activated to the selected state high potential state: power supply potential Vcc) by the word line driver 30.

The column decoder 25 activates one of column selection lines CSL1 to CSLm provided corresponding to the respective memory cell columns to the selected state (H level) according to the decode result of the column address CA.

A data input/output (I/O) line pair DI/OP transmits the data write current ±Iw in the data write operation, and the sense current Is in the data read operation. In other words, the data I/O line pair DI/OP is common to the data read and write operations. The data I/O line pair DI/OP includes data lines IO and /IO.

Hereinafter, the structure of column selection gates CSG1 to CSGm, a data write current control circuit 51 and a data read circuit 52 that are included in the read/write control circuit 50 will be described.

The column selection gates CSG1 to CSGm are provided corresponding to the respective memory cell columns. One of the column selection gates CSG1 to CSGm is turned ON according to the column selection result of the column decoder 25, thereby coupling the data lines IO and /IO forming the data I/O line pair DI/OP to corresponding bit lines BL and /BL, respectively.

For example, the column selection gate CSG1 has a transistor switch electrically coupled between the data line IO and bit line BL1, and a transistor switch electrically coupled between the data line /IO and bit line /BL1. These transistor switches are turned ON/OFF according to the potential level on the column selection line CSL1. More specifically, when the column selection line CSLl is activated to the selected state (H level), the column selection gate CSG1 electrically couples the data lines IO and /IO to the bit lines BL1 and /BL1, respectively. The column selection gates CSG2 to CSGm provided corresponding to the other memory cell columns have the same structure.

The data write current control circuit 51 operates in response to a control signal WE that is activated in the data write operation.

The data write current control circuit 51 includes a P-type MOS transistor 151 for supplying a constant current to an internal node Nw0, a P-type MOS transistor 152 forming a current mirror circuit for controlling a passing current of the transistor 151, and a current source 153.

The data write current control circuit 51 further includes inverters 154, 155 and 156 operating in response to an operating current supplied from the internal node Nw0. The inverter 154 inverts the potential level of write data DIN for transmission to an internal node Nw1. The inverter 155 inverts the potential level of the write data DIN for transmission to an input node of the inverter 156. The inverter 156 inverts the output of the inverter 154 for transmission to an internal node Nw2. Thus, the data write current control circuit 51 sets the potential level on the data line IO to one of the power supply potential Vcc and ground potential Vss and the potential level on the data line /IO to the other potential, according to the potential level of the write data DIN.

The data read circuit 52 operates in response to a control signal RE that is activated in the data read operation, and outputs read data DOUT.

The data read circuit 52 includes current source 161 and 162 for receiving the power supply potential Vcc and supplying a constant current to internal nodes Ns1 and Ns2, respectively, an N-type MOS transistor 163 electrically coupled between the internal node Ns1 and an internal node Nr1, an N-type MOS transistor 164 electrically coupled between the internal node Ns2 and an internal node Nr2, and an amplifier 165 for amplifying the difference in potential level between the internal nodes Ns1 and Ns2 to output the read data DOUT.

A reference potential Vref is applied to the gates of the transistors 163 and 164. The reference potential Vref and the current supply amount of the current source 161 and 162 are set according to the amount of the sense current Is. Resistances 166 and 167 are provided in order to pull down the internal nodes Ns1 and Ns2 to the ground potential Vss, respectively. With such a structure, the data read circuit 52 supplies the sense current Is to each of the data lines 10 and /IO in the data read operation. Moreover, the data read circuit 52 amplifies the potential difference between the data lines IO and /IO according to the level of storage data in the MTJ memory cell connected thereto through the corresponding column selection gate and bit line pair, and outputs the read data DOUT.

The read/write control circuit 60 is disposed opposite to the column selection gates CSG1 to CSGm with the memory array 10 interposed therebetween.

The read/write control circuit 60 includes equalizing transistors 62-1 to 62-m that are turned ON/OFF in response to a bit line equalizing signal BLEQ. The equalizing transistors 62-1 to 62-m are provided corresponding to the respective memory cell columns. For example, the equalizing transistor 62-1 is provided corresponding to the first memory cell column, and electrically couples the bit lines BL1 and /BL1 to each other in response to activation (H level) of the bit line equalizing signal BLEQ.

Similarly, the equalizing transistors 62-2 to 62-m provided respectively corresponding to the other memory cell columns each electrically couples the bit lines BL and /BL forming a bit line pair to each other in the corresponding memory cell column in response to activation of the bit line equalizing signal BLEQ.

The bit line equalizing signal BLEQ is produced by the control circuit 5. The bit line equalizing signal BLEQ is activated to H level when the MRAM device 1 is in the stand-by state, when the memory array 10 is in the non-selected state during the active period of the MRAM device 1, and when the data write operation is conducted during the active period of the MRAM device 1. The bit line equalizing signal BLEQ is activated to H level in order to short-circuit the bit lines BL and /BL forming a folded bit line pair in each memory cell column.

The bit line equalizing signal BLEQ is inactivated to L level when the data read operation is conducted during the active period of the MRAM device 1. In response to this, the bit lines BL and /BL forming a bit line pair are disconnected from each other in each memory cell column.

First, the data write operation will be described. Hereinafter, description is exemplarily given for the case where the second memory cell column corresponding to the column selection line CSL2 is selected.

In response to the column selection result, the column selection line CSL2 is activated to the selected state (H level), and the column selection gate CSG2 is turned ON. As a result, the data lines IO and /IO are electrically coupled to the bit lines BL2 and /BL2 forming the bit line pair BLP2, respectively. In the data write operation, the equalizing transistor 62-2 is turned ON to short-circuit the bit lines BL2 and /BL2.

As described before, the data write current control circuit 51 sets the potential level of the data line IO to one of the power supply potential Vcc and ground potential Vss, and the potential level of the data line /IO to the other potential. For example, in the case where the write data DIN is at L level, the outputs of the inverters 154 and 155 are respectively set to the power supply potential Vcc high potential state) and ground potential level Vss (low potential state). Therefore, a data write current −Iw for writing the L level data flows through the data line IO.

The data write current −Iw is supplied to the bit line BL2 through the column selection gate CSG2. The data write current −Iw transmitted to the bit line BL2 is turned around by the equalizing transistor 62-2 so as to be transmitted along the other bit line /BL2 as a data write current +Iw of the opposite direction. The data write current +Iw flowing through the bit line /BL2 is transmitted to the data line /IO through the column selection gate CSG2.

One of the write word lines WWL1 to WWLn is activated to the selected state (H level), whereby the data write current Ip flows therethrough. Accordingly, in the memory cell column corresponding to the column selection line CSL2, the data is written to the MTJ memory cell corresponding to the selected write data line WWL through which the data write current flows. At this time, L-level data is written to the MTJ memory cell MC coupled to the bit line BL2, and H-level data is written to the MTJ memory cell MC coupled to the bit line /BL2.

On the other hand, in the case where the write data DIN is at H level, the respective potential levels at the internal nodes Nw1 and Nw2 become opposite to those described above. Therefore, the data write current flows through the bit lines BL2 and /BL2 in the direction opposite to that described above, whereby the opposite data level is written. Thus, the data write current ±Iw having a direction corresponding to the data level of the write data DIN is supplied to the bit lines BL and /BL.

Next, the data read operation will be described.

The MTJ memory cells MC in each row are coupled to either the bit lines BL or /BL. For example, in the case of the MTJ memory cells of the first memory cell column, the MTJ memory cell in the first row is coupled to the bit line BL1, and the MTJ memory cell in the second row is coupled to the bit line /BL1. Similarly, in the odd rows, the MTJ memory cells are each connected to one bit line of the corresponding bit line pair, BL1 to BLm, and in the even rows, the. MTJ memory cells are each connected to the other bit line of the corresponding bit line pair, /BL1 to /BLm.

Therefore, when the read word line RWL is selectively activated according to the row selection result, either the one bit lines BL1 to BLm or the other bit lines /BL1 to /BLm of the bit line pairs are coupled to the corresponding MTJ memory cells MC.

The memory array 10 further has a plurality of dummy memory cells DMC respectively coupled to the bit lines BL1, /BL1 to BLm, /BLm. The dummy memory cells are each coupled to one of dummy read word lines DRWL1 and DRWL2, and are arranged in two rows by m columns. The dummy memory cells coupled to the dummy read word line DRWL1 are respectively coupled to the bit lines BL1, BL2 to BLm. The remaining dummy memory cells coupled to the dummy read word line DRWL2 are respectively coupled to the bit lines /BL1, /BL2 to /BLm.

The dummy read word line DRWL1, DRWL2 is selectively activated such that the bit lines that are not connected to the MTJ memory cells MC of the selected memory cell row are respectively coupled to the dummy memory cells DMC. In other words, depending on the row selection, either the one bit lines BL1 to BLm or the other bit lines /BL1 to /BLm of the bit line pairs are respectively coupled to the dummy memory cells DMC.

As a result, the one bit lines BL1 to BLm and the other bit lines /BL1 to /BLm of the bit line pairs are respectively coupled to m MTJ memory cells MC corresponding to the selected memory cell row, and m dummy memory cells.

As described before, the data read circuit 52 supplies the sense current Is of the same direction to the data lines IO and /IO.

The data read operation will also be described for the case where the second memory cell column corresponding to the column selection line CSL2 is selected.

The column selection line CSL2 is activated to the selected state (H level) and the column selection gate CSG2 is turned ON. In response to this, the data lines IO and /IO forming the data I/O line pair DI/OP are respectively coupled to the bit lines BL2 and /BL2 like in the data write operation.

In the data read operation, however, the equalizing transistor 62-2 is turned OFF. Therefore, the sense current Is supplied from the data read circuit 52 flows through the bit lines BL2 and /BL2 in the same direction.

One of the read word lines RWL1 to RWLn is activated to the selected state (H level), so that the corresponding MTJ memory cell MC is coupled to one of the bit lines BL2 and /BL2. Moreover, one of the dummy read word lines DRWL1 and DRWL2 is activated, so that the other of the bit lines BL2 and /BL2, i.e., the bit line that is not connected to the MTJ memory cell MC, is coupled to the dummy memory cell DMC.

In the case where an odd row is selected according to the row selection result and the bit line BL2 is coupled to the MTJ memory cell MC, the dummy read word line DRWL2 is activated so that the bit line /BL2 is coupled to the dummy memory cell DMC. On the contrary, in the case where an even row is selected according to the row selection result and the bit line /BL2 is coupled to the MTJ memory cell MC, the dummy read word line DRWL1 is activated so that the bit line BL2 is coupled to the dummy memory cell DMC.

As described before, the resistance value of the MTJ memory cell MC varies according to the level of storage data. Assuming that the MTJ memory cell MC storing H-level data has a resistance value Rh and the MTJ memory cell MC storing L-level data has a resistance value Rl, a resistance value Rd of the dummy memory cell DMC is set to an intermediate value of Rl and Rh. Thus, the level of the storage data to be read can be sensed by comparison between a potential change on one bit line coupled to the dummy memory cell DMC and a potential change on the other bit line coupled to the MTJ memory cell MC.

The potential difference between the bit lines BL2 and /BL2 is transmitted through the data I/O line pair DI/OP to the internal nodes Ns1 and Ns2 in the data read circuit 52. The potential level difference between the internal nodes Ns1 and Ns2 is amplified by the amplifier 165 and output as read data DOUT.

Accordingly, in the case where L-level data is stored in the MTJ memory cell MC coupled to the bit line BL, and in the case where H-level data is stored in the MTJ memory cell MC coupled to the bit line /BL, L-level data is output as the read data DOUT. On the contrary, in the case where H-level data is stored in the MTJ memory cell MC coupled to the bit line BL, and in the case where L-level data is stored in the MTJ memory cell MC coupled to the bit line /BL, H-level data is output as the read data DOUT.

Thus, by providing the folded bit line pairs BLP corresponding to the respective memory cell columns, and turning around the data write current by the equalizing transistor, the data write current of the opposite directions can be easily supplied. In other words, the data write current of the opposite directions can be supplied by merely controlling the potential level at one end of the bit line BL to one of the power supply potential Vcc and ground potential Vss as well as controlling the potential level at one end of the other bit line /BL to the other potential. Thus, a potential of different polarity (negative potential) is not necessary. Moreover, the direction of the current can be switched by merely setting the potential on the data line IO to one of the power supply potential and ground potential as well as setting the potential on the other data line /IO to the other potential. As a result, the circuit structure of the data write current control circuit 51 can be simplified. Moreover, the read/write control circuit 60 can be formed simply with the equalizing transistors 62-1 to 62-m.

Moreover, since the data read operation is conducted using the dummy memory cells, the MTJ memory cells can be efficiently arranged in the structure provided with the folded bit line pairs BLP.

Second Embodiment

Figure 3:
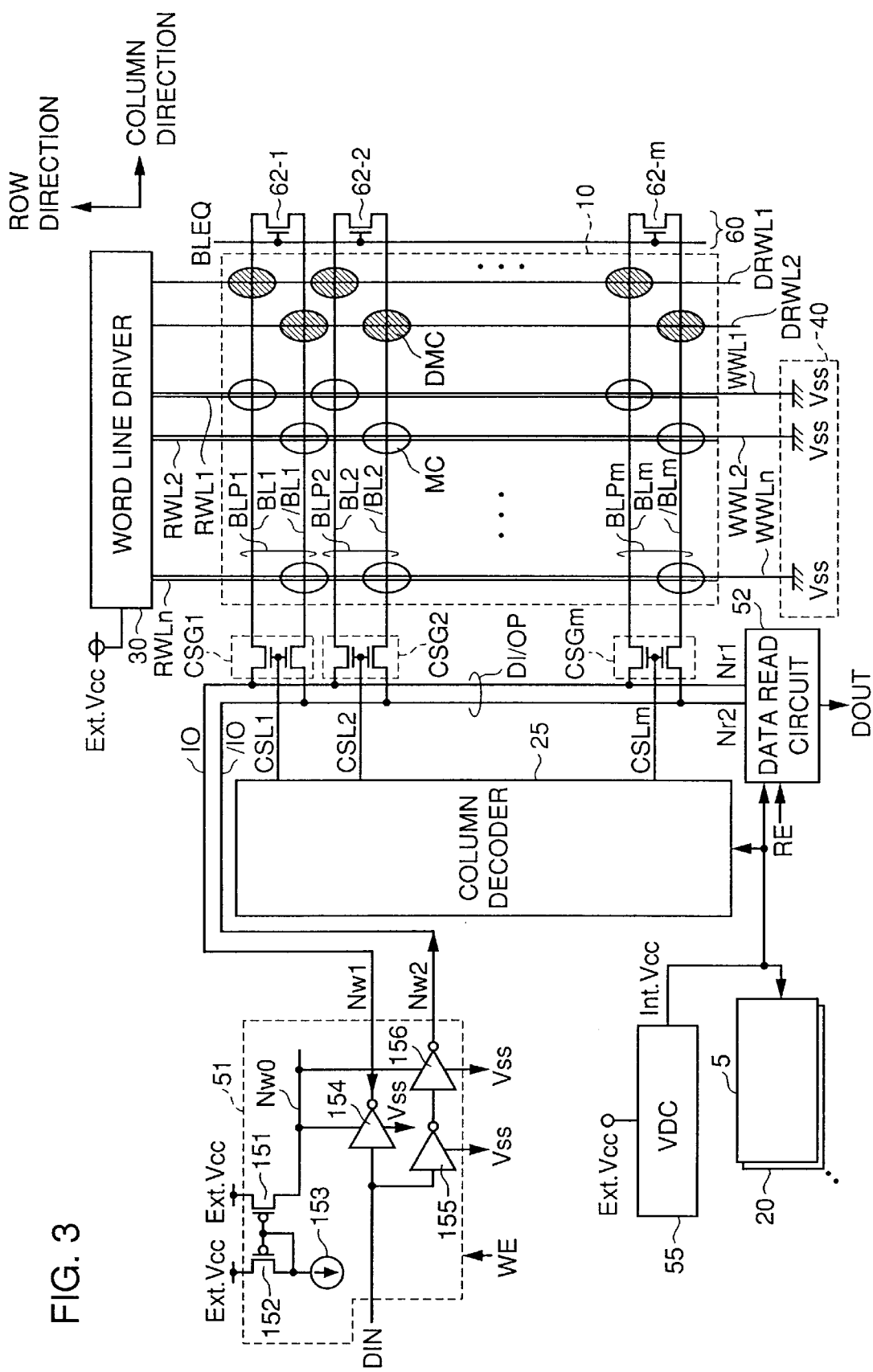
FIG. 3 is a block diagram illustrating a power supply system according to a second embodiment.

Referring to FIG. 3, like the first embodiment, in the memory array 10 according to the second embodiment, folded bit line pairs are provided corresponding to the respective memory cell columns, and equalizing transistors 62-1 to 62-m are provided in the read/write control circuit 60.

In the second embodiment, an external power supply potential Ext.Vcc, which is externally supplied to the MRAM device 1, is supplied directly to the data write current control circuit 51 for supplying a data write current in the data write operation, and the word line driver 30 for activating a word line WWL.

The MRAM device 1 further includes a voltage down converter (VDC) 55 for down-converting the external power supply potential Ext.Vcc into an internal power supply potential Int.Vcc.

The internal power supply potential Int.Vcc produced by the voltage down converter 55 is supplied to internal circuitry for conducting a data read operation and address processing, such as data read circuit 52, column decoder 25, control circuit 5 and row decoder 20. Note that, in the data read and write operations, each element operates in the same manner as that in the first embodiment. Therefore, detailed description thereof will not be repeated.

With such a structure, in the data write operation, the data write current control circuit 51 for supplying a relatively large data write current ±Iw and the word line driver 30 for supplying a data write current Ip to the write word line WWL are driven with the external power supply potential Ext.Vcc, so that these data write currents can be rapidly supplied.

Moreover, the internal circuitry except for the circuits for supplying the data write currents is driven with the down-converted internal power supply potential Int.Vcc. As a result, power consumption of the internal circuitry can be reduced as well as reliability corresponding to the dimensional reduction of the device for the increased integration degree can be ensured.

Third Embodiment

In the first embodiment, the output nodes Nw1 and Nw2 of the data write current control circuit 51 are respectively connected to the data lines IO and /IO at one end of the data I/O line pair DI/OP provided along the row direction. With such a structure, however, the path length of the data write current ±Iw varies depending on a memory cell column to be selected.

For example, in the structure shown in FIG. 2, the output nodes Nw1 and Nw2 of the data write current control circuit 51 are respectively connected to the data lines IO and /IO on the side of the column selection line CSL1. Therefore, the data write current has a short path length when the column selection line CSL1 is selected, but has a long path length when the column selection line CSLm located on the opposite side is activated to the selected state. Thus, the path length through which the data write current is transmitted varies depending on a memory cell column to be selected. Therefore, the resistance value of the data write current path and thus the amount of data write current are varied, resulting in the difference in write operation margin between the memory cell columns.

Accordingly, the write margin may be insufficient for a memory cell column having a long path of the data write current. If the data write current is set corresponding to the memory cell column for which the write margin is most likely to be insufficient (e.g., the first and mth columns located at the ends of the memory array in FIG. 2, or the memory cell column including a memory cell for which the margin is insufficient due to variation in characteristics of the memory cells), the data write current becomes too large for the other memory cell columns, resulting in excessive power consumption and undesirable magnetic noise.

Figure 4:
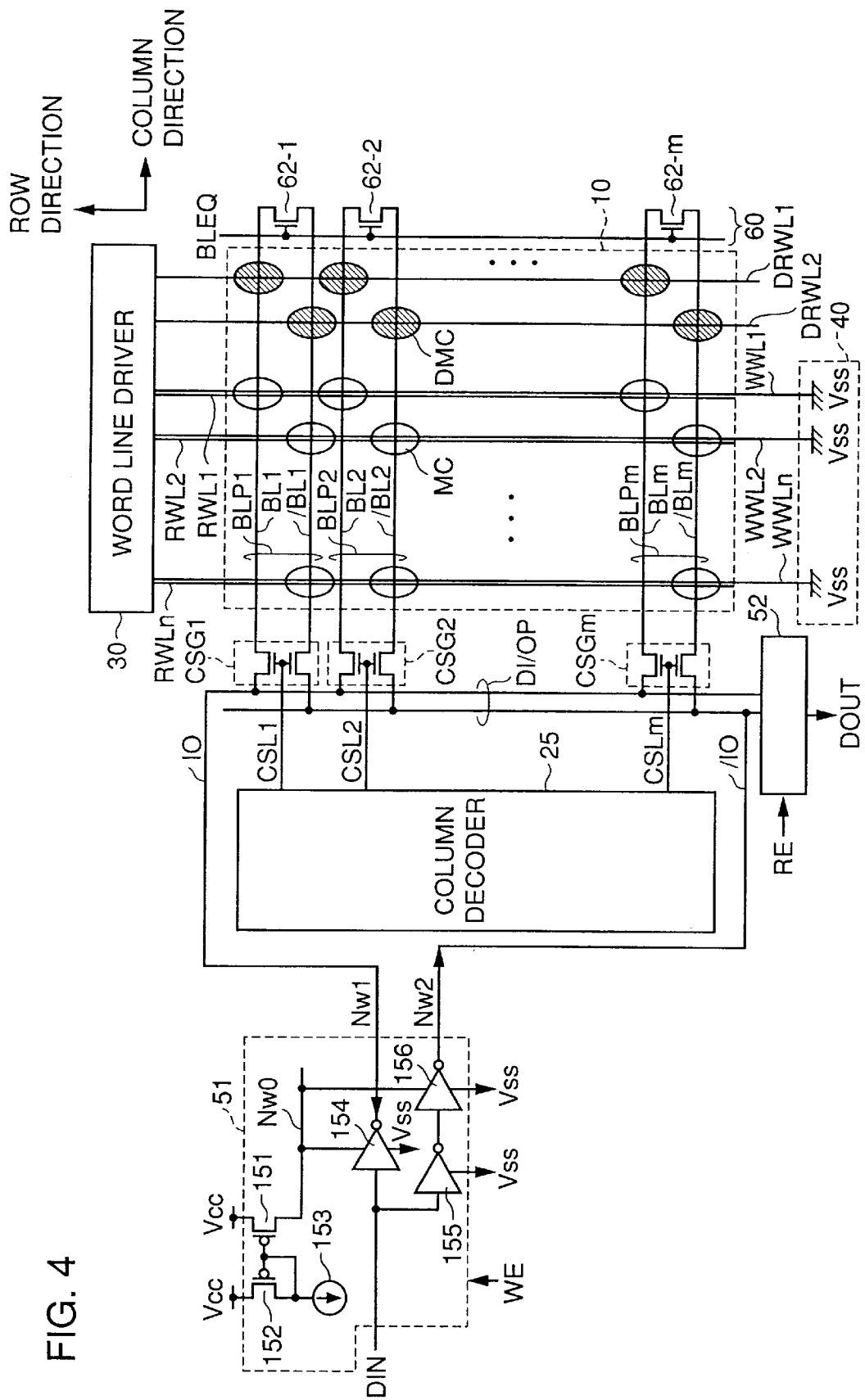
FIG. 4 is a block diagram showing the structure of a memory array 10 and its peripheral circuitry according to a third embodiment.

Referring to FIG. 4, in the structure of the third embodiment, the data write current control circuit 51 is coupled to the data lines IO and /IO forming the data I/O line pair DI/OP, on the side of the top memory cell column (the first column) and the last memory cell column (the mth column), respectively.

With such a structure, the path length of the data write current ±Iw formed by the node Nw1 (data write current control circuit 51), data line IO, bit line BL, equalizing transistor, bit line /BL, data line /IO and node Nw2 (data write current control circuit 51) can be made constant regardless of the position of the memory cell column to be selected. As a result, variation in resistance value can be prevented, whereby the value of the data write current ±Iw can be maintained at a constant level.

Thus, not only the same effects as those described in the first embodiment can be obtained, but also the write operation margin can be properly set for every memory cell column while suppressing excessive power consumption and undesirable magnetic noise.

First Modification of Third Embodiment

Figure 5:
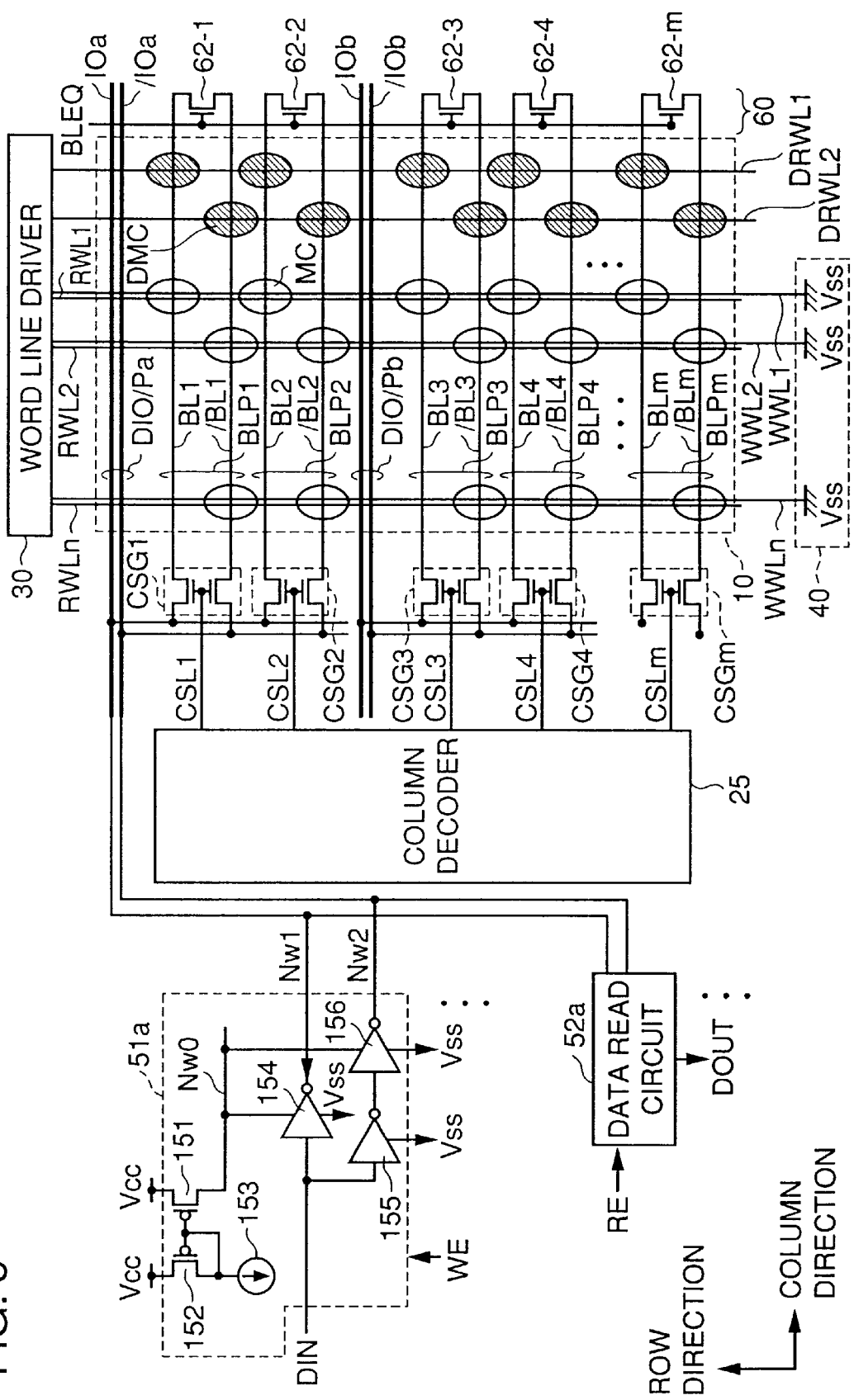
FIG. 5 is a block diagram showing the structure of a memory array 10 and its peripheral circuitry according to a first modification of the third embodiment.

Referring to FIG. 5, in the structure according to the first modification of the third embodiment, a plurality of data I/O line pairs DI/OP are provided in the entire memory array 10. The data I/O line pair DI/OP is located every M memory cell columns (where M is a natural number). FIG. 5 shows the structure of M=2. More specifically, in FIG. 5, a single data I/O line pair DI/OP is provided for every two memory cell column.

FIG. 5 does not shows all of the data I/O line pairs DI/OP, but shows only the data I/O line pair DI/OPa provided for the first and second columns, and the data I/O line pair DI/OPb provided for the third and fourth columns.

The data write current control circuit 51 and data read circuit 52 are provided corresponding to each data I/O line pair. For example, a data write current control circuit 51a and a data read circuit 52a are provided for the data I/O line pair DI/OPa. In other words, (m/M) data write current control circuits 51 and (m/M) data read circuits 52 are provided for the entire memory array 10.

One of the data write current control circuits 51 and one of the data read circuits 52 are activated corresponding to the selected memory cell column, thereby supplying the data write current ±Iw and sense current Is. Since the structure and operation of the other portions are the same as those of the first embodiment, detailed description thereof will not be repeated.

Providing the data I/O line pair DI/OP every M memory cell columns also effectively prevents the path length i.e. resistance value for the data write current from being varied depending on the position of the memory cell column to be selected, and thus prevents variation in the current level. As a result, the same effects as those of the third embodiment can be obtained.

Second Modification of Third Embodiment

Figure 6:
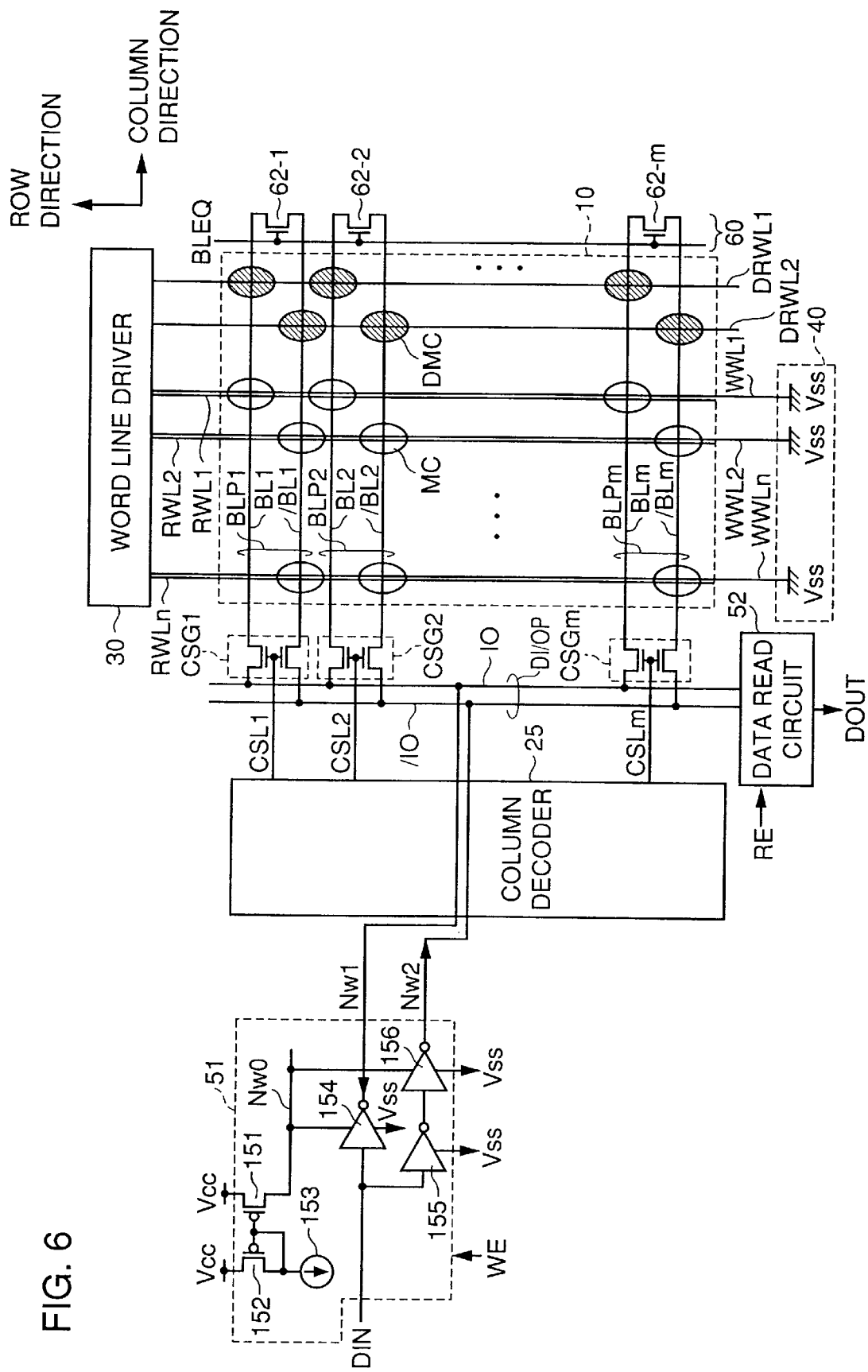
FIG. 6 is a block diagram showing the structure of a memory array 10 and its peripheral circuitry according to a second modification of the third embodiment.

Referring to FIG. 6, the second modification of the third embodiment is different from the third embodiment shown in FIG. 4 in that the output nodes Nw1 and Nw2 of the data write current control circuit 51 are electrically coupled to the respective data lines IO and /IO at the center portion of the data line pair DI/IO.

Such a structure also prevents the resistance value of the data write current path from being varied depending on the position of the memory cell column to be selected. As a result, the same effects as those of the third embodiment can be obtained.

Third Modification of Third Embodiment

Figure 7:
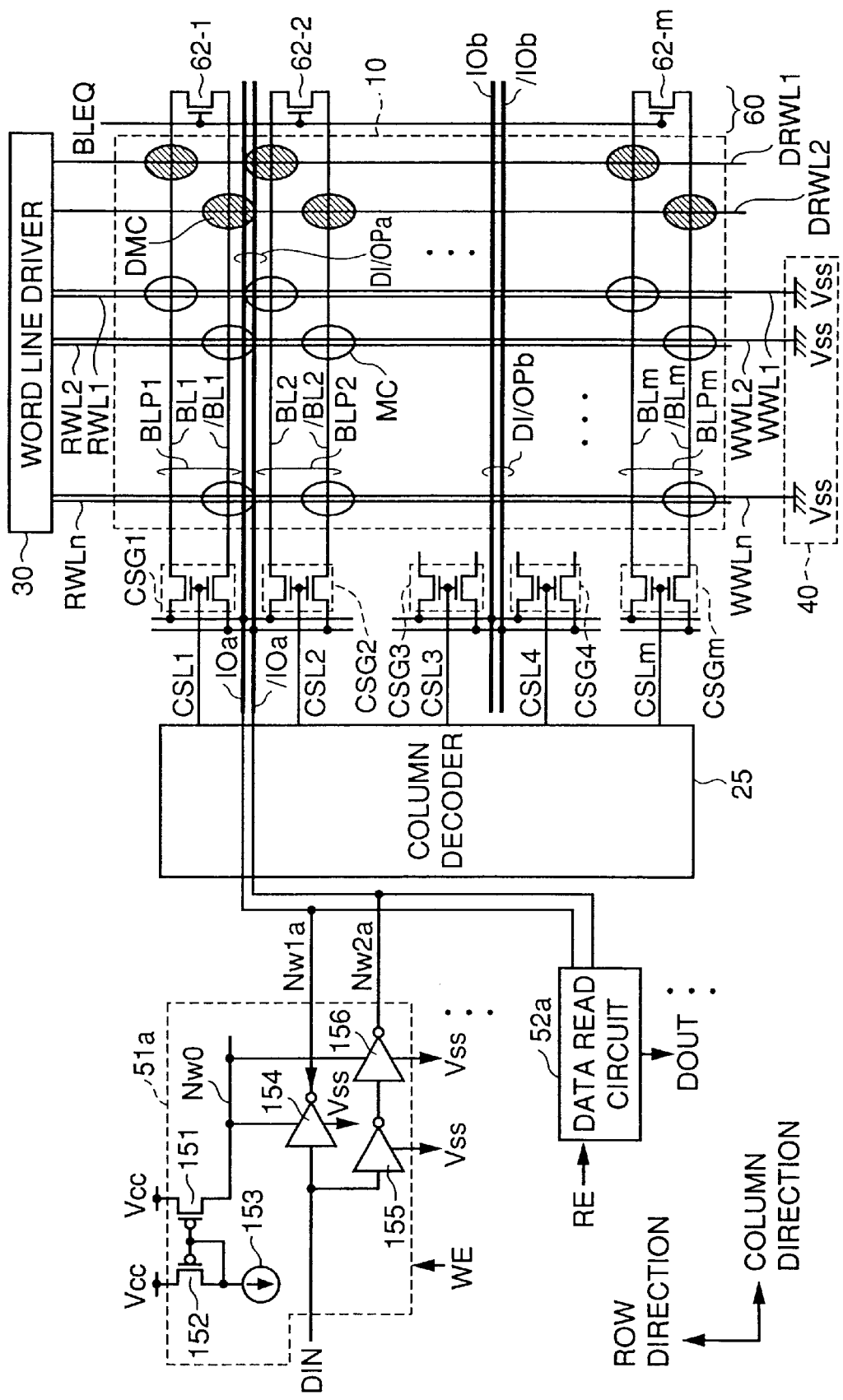
FIG. 7 is a block diagram showing the structure of a memory array 10 and its peripheral circuitry according to a third modification of the third embodiment.

Referring to FIG. 7, in the third modification of the third embodiment, an independent data I/O line DI/OP is provided every M memory cell columns, as in the first modification of the third embodiment described in connection with FIG. 5. The number of data I/O line pairs DI/OP as well as arrangement and selection of corresponding data write current control circuits 51 and data read circuits 52 are the same as those described in connection with FIG. 5. Therefore, description thereof will not be repeated.

In the third modification of the third embodiment, each data I/O line pair DI/OP is located in the middle of the corresponding M memory cell columns. FIG. 7 exemplarily illustrates the structure of M=2. In FIG. 7, the data I/O line pair DI/OPa provided corresponding to the first and second columns is located between the first and second memory cell columns.

Such a structure further suppresses variation in data write current depending on the position of the memory cell column to be selected, as compared to the first modification of the third embodiment. As a result, the write operation margin can be more properly set for every memory cell column.

Fourth Embodiment

In the first to third embodiments, the data write current ±Iw and sense current Is are supplied to the MTJ memory cells MC through the common bit line BL.

However, since the amount of data write current ±Iw is significantly different from that of sense current Is, it is also effective to divide the bit line BL into a read bit line RBL for supplying the sense current in the data read operation and a write bit line WBL for supplying the data write current ±Iw in the data write operation.

Such a variation of the MTJ memory cell structure will be described later in detail. The fourth embodiment describes the structure for suppressing variation in data write current regardless of the position of the memory cell column to be selected, in the case where the write bit lines WBL for supplying the data write current ±Iw are independently provided.

Figure 8:
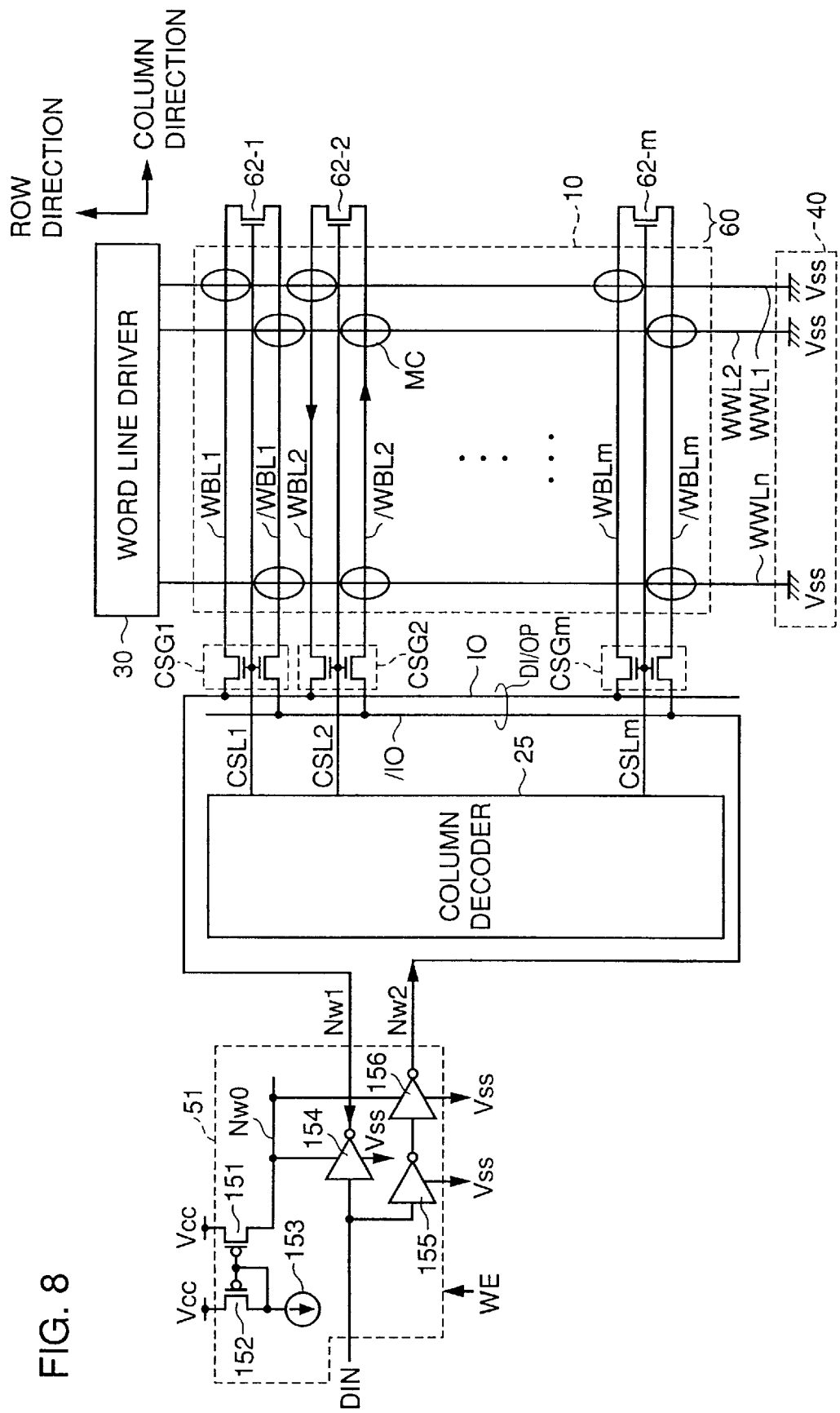
FIG. 8 is a block diagram showing a portion associated with a data write operation in the structure of a memory array 10 and its peripheral circuitry according to a fourth embodiment.

Referring to FIG. 8, in the memory array 10 of the fourth embodiment, complementary write bit line pairs WBL, /WBL for supplying the data write current ±Iw are provided corresponding to the respective memory cell columns. Note that the write bit lines WBL (/WBL) and read bit lines RBL (/RBL) are generally denoted with WBL (/WBL) and RBL (/RBL), respectively, and a specific write bit line is denoted with WBL1, /WBL1, RBL1, /RBL1 or the like.

The equalizing transistors 62-1 to 62-m of the read/write control circuit 60 electrically couple the write bit lines WBL and /WBL to each other in the respective memory cell columns. Like the column selection gates CSG1 to CSGm, the equalizing transistors 62-1 to 62-m are turned ON/OFF according to the potential level on the respective column selection lines CSL1 to CSLm.

With such a structure, when the column selection line CSL2, for example, is activated to the selected state (H level) according to the column selection result, the column selection gate CSG2 and equalizing transistor 62-2 are turned ON, whereby a current path is formed by the node Nw1 (data write current control circuit 51), data line IO, bit line WBL2, equalizing transistor 62-2, bit line /WBL2, data line /IO and node Nw2 (data write current control circuit 51).

Thus, the data write current is turned around by the equalizing transistor so as to flow in the opposite directions through the complementary write bit lines WBL and /WBL forming a write bit line pair. As a result, the data write operation can be conducted in the same manner as that of the first embodiment.

Like the structure shown in FIG. 4, the internal nodes Nw1 and Nw2 of the data write current control circuit 51 are coupled to the data lines IO and /IO forming the data I/O line pair DI/OP, on the side of the top memory cell column (the first column) and the last memory cell column (the mth column), respectively.

Accordingly, the wiring length of the data write current path, i.e., the resistance value thereof, can be made constant regardless of the position of the memory cell column to be selected, whereby variation in data write current can be prevented. Thus, like the third embodiment, a proper write margin can be ensured for every memory cell column without causing excessive power consumption.

First Modification of Fourth Embodiment

Figure 9:
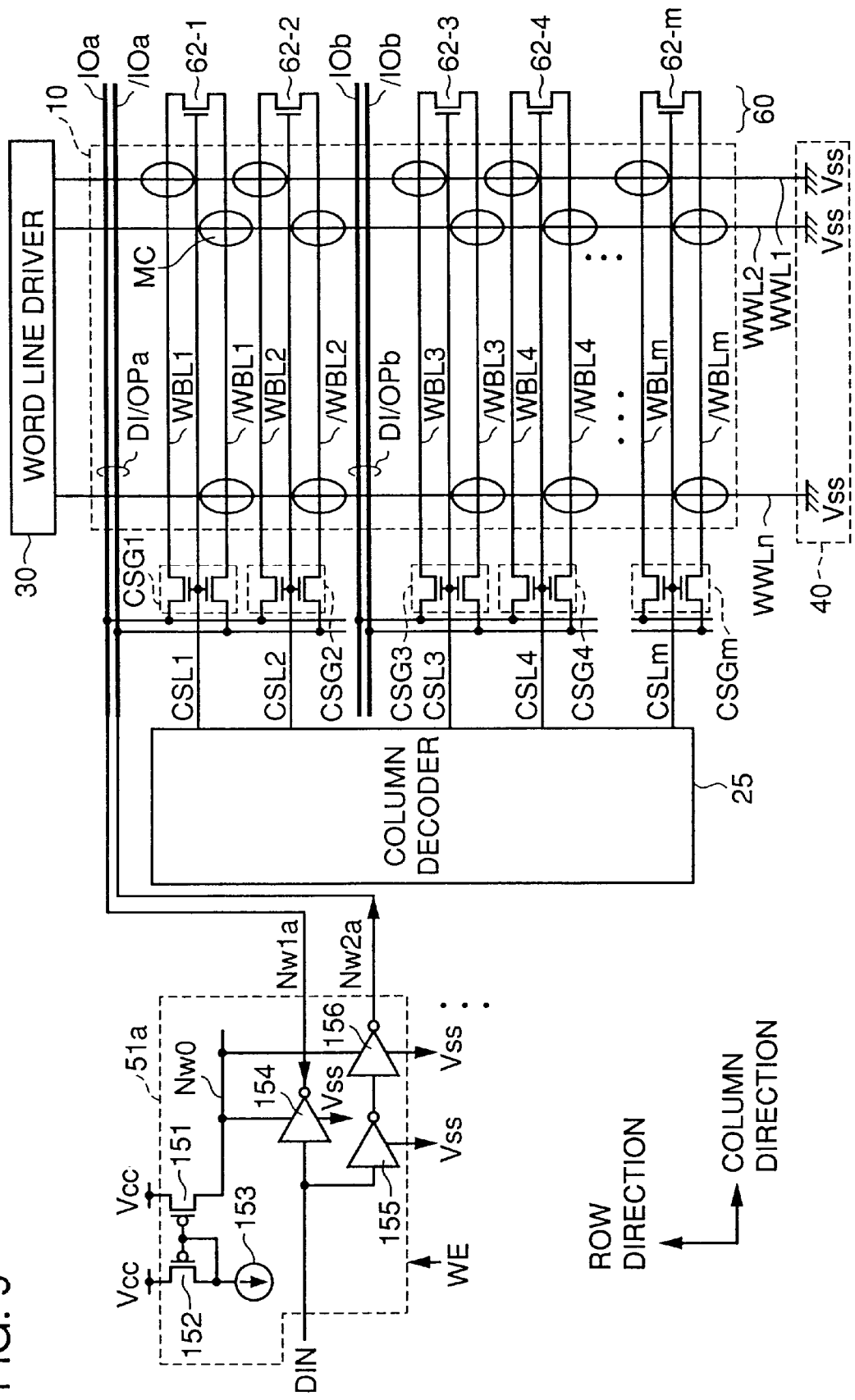
FIG. 9 is a block diagram showing a portion associated with a data write operation in the structure of a memory array 10 and its peripheral circuitry according to a first modification of the fourth embodiment.

Referring to FIG. 9, in the first modification of the fourth embodiment, the data I/O line pair DI/OP is provided every M memory cell columns as in the case of FIG. 5. The data write current control circuits 51 are also provided respectively corresponding to (m/M) data I/O line pairs DI/OP in the entire memory array 10. As in the case of FIG. 8, the equalizing transistors 62-1 to 62-m are turned ON/OFF according to the potential level on the respective column selection lines CSL1 to CSLm. As a result, the data write operation is conducted in the same manner as that of the first embodiment.

With such a structure, the same effects as those of the first modification of the third embodiment can be obtained even in the case where the bit line BL is divided into the read bit line RBL and write bit line WBL.

Second Modification of Fourth Embodiment

Figure 10:
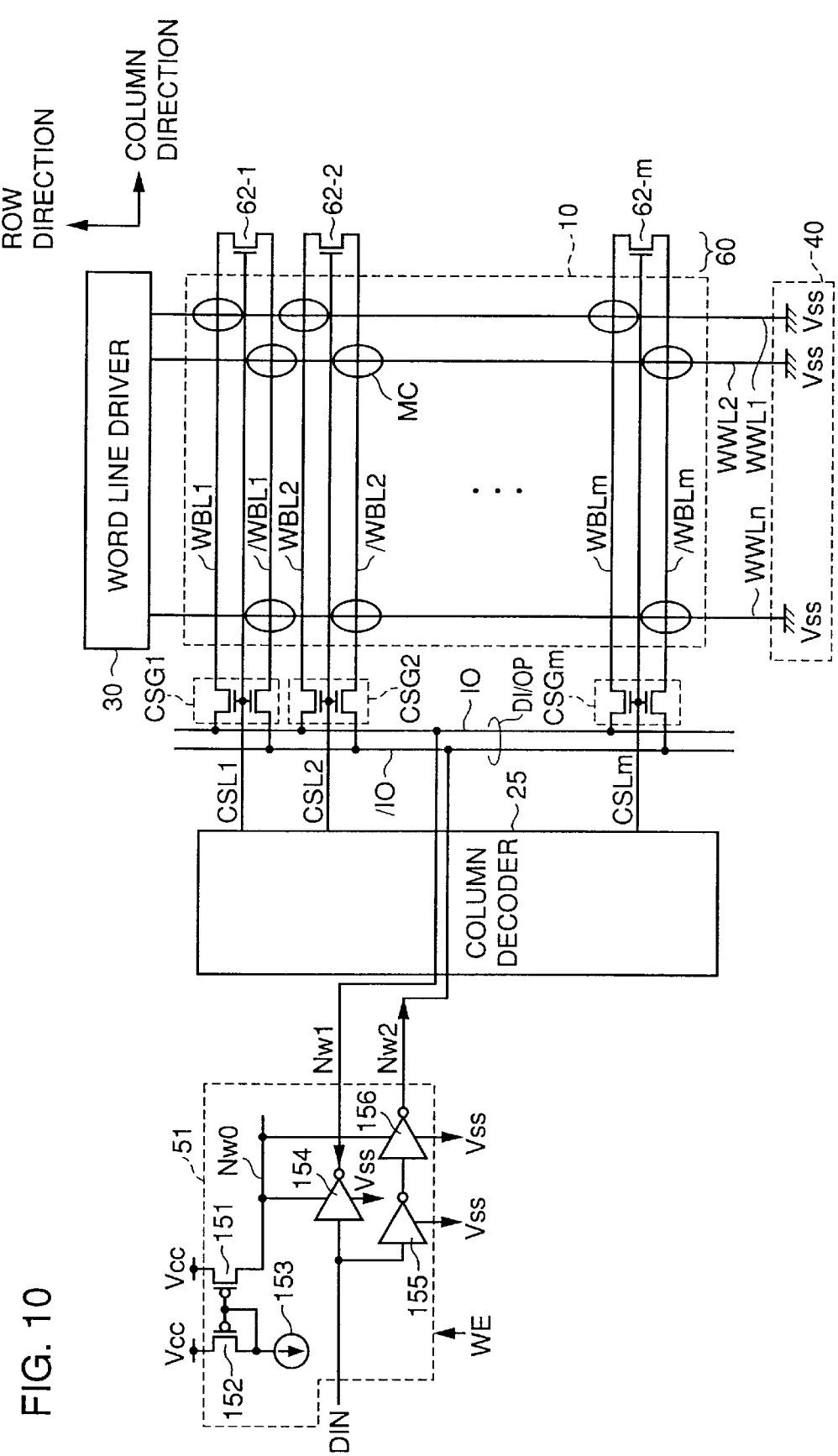
FIG. 10 is a block diagram showing a portion associated with a data write operation in the structure of a memory array 10 and its peripheral circuitry according to a second modification of the fourth embodiment.

Referring to FIG. 10, in the second modification of the fourth embodiment, like the structure shown in FIG. 6, the output nodes Nw1 and Nw2 of the data write current control circuit 51 are respectively coupled to the data lines IO and /IO at the center of the data line pair DI/OP provided in common to each memory cell column. As in the case of FIG. 8, the equalizing transistors 62-1 to 62-m are turned ON/OFF according to the potential level on the respective column selection lines CSL1 to CSLm. As a result, the data write operation is conducted in the same manner as that of the first embodiment.

With such a structure, the same effects as those of the second modification of the third embodiment can be obtained even in the case where the bit line BL is divided into the read bit line RBL and write bit line WBL.

Third Modification of Fourth Embodiment

Figure 11:
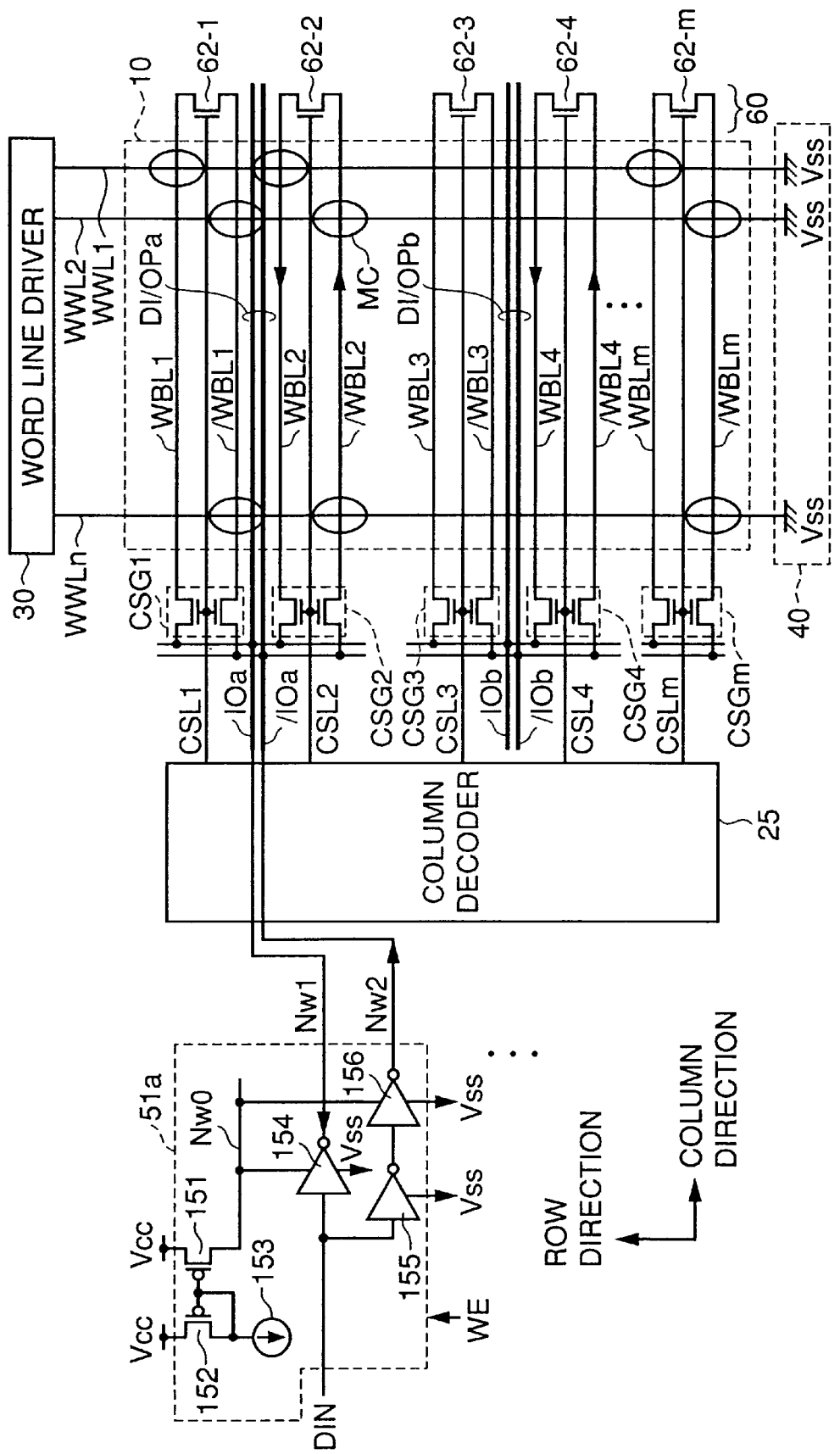
FIG. 11 is a block diagram showing a portion associated with a data write operation in the structure of a memory array 10 and its peripheral circuitry according to a third modification of the fourth embodiment.

Referring to FIG. 11, in the third modification of the fourth embodiment, the data I/O line pair DI/OP is provided every M memory cell columns, as in the case of FIG. 7. Each data I/O line pair DI/OP is located in the middle of the corresponding M memory cell columns. As in the case of FIG. 8, the equalizing transistors 62-1 to 62-m are turned ON/OFF according to the potential level on the respective column selection lines CSL1 to CSLm. As a result, the data write operation is conducted in the same manner as that of the first embodiment.

With such a structure, the same effects as those of the second modification of the third embodiment can be obtained even in the case where the bit line BL is divided into the read bit line RBL and write bit line WBL.

Although description of the structure associated with the data read operation is omitted in the fourth embodiment and the first to third modifications thereof, the data read operation using the dummy memory cells DMC can be conducted based on the potential change on the read bit lines RBL in the same manner as that of the first to third embodiments.

Note that, in the first to fourth embodiments, the data read operation is conducted using the dummy memory cells DMC, and the MTJ memory cells MC in each row are provided corresponding to either the bit lines BL or bit lines /BL. However, the MTJ memory cells MC may alternatively be provided at each intersection of the bit lines BL, /BL and word lines. In this case, the data read operation can be conducted without using the dummy memory cells DMC, and therefore the dummy memory cells DMC need not be provided.

Thus, in the case where the MTJ memory cells are provided in each memory cell row at each intersection with the bit lines BL, /BL, there are two MTJ memory cells provided for 1-bit storage data. With such a structure, two MTJ memory cells storing complementary data levels are respectively coupled to the bit lines BL and /BL in response to activation of the read word line RWL. Accordingly, the read data level is set based on comparison between the respective potential changes caused by these MTJ memory cells storing the complementary data. As a result, a sufficient read margin can be ensured as compared to the case where the level of the read data DOUT is sensed using the dummy memory cells DMC.

Fifth Embodiment

Figure 12:
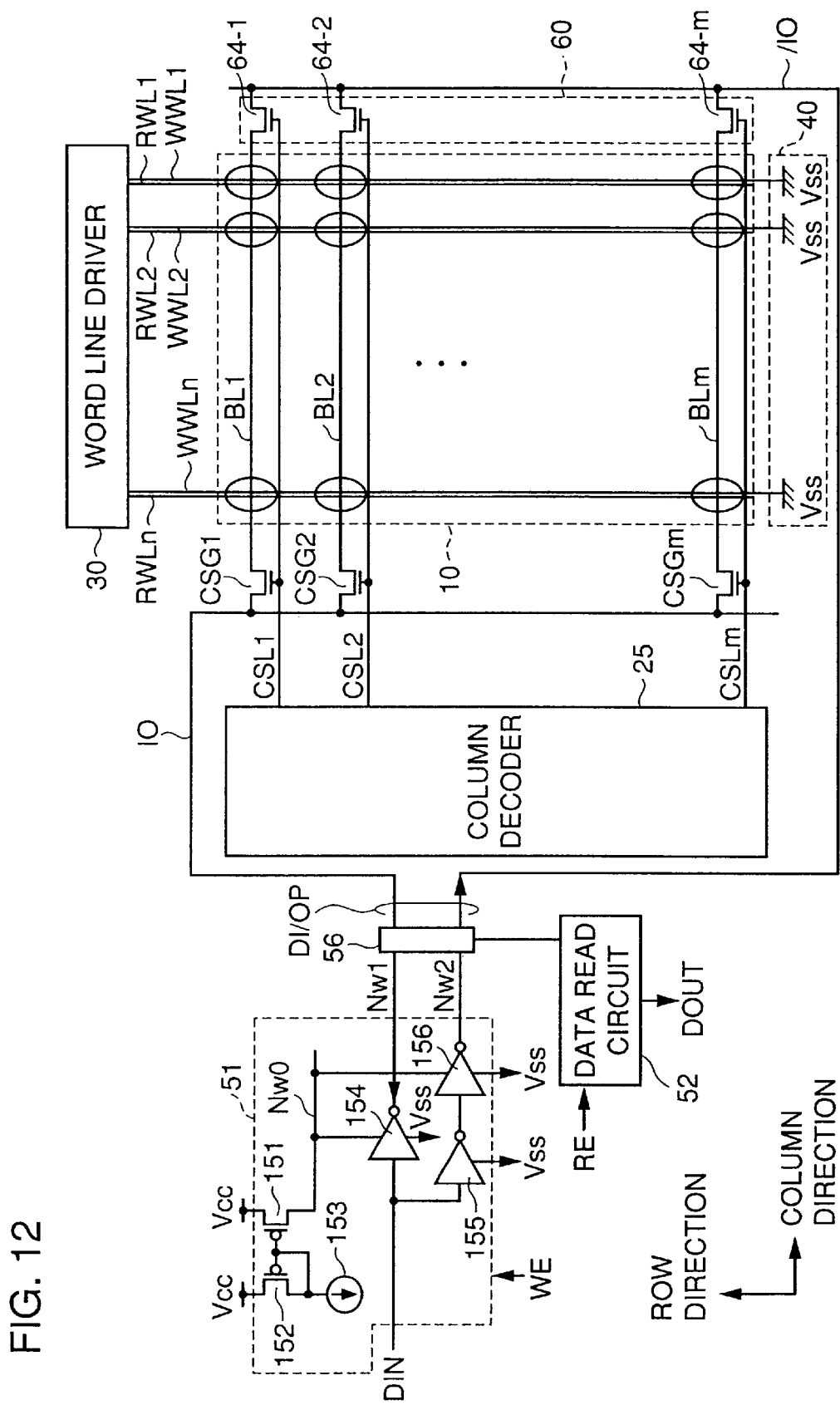
FIG. 12 is a block diagram showing the structure of a memory array 10 and its peripheral circuitry according to a fifth embodiment.

Referring to FIG. 12, in the fifth embodiment, open bit lines are provided corresponding to the respective memory cell columns, instead of the folded bit lines. In other words, the bit lines BL1 to BLm are provided respectively corresponding to m memory cell columns.

The MTJ memory cells MC are provided in each memory cell row at each intersection with bit lines BL. The data lines IO and /IO forming the data I/O line pair DI/OP are provided adjacent to the memory array 10 in the column direction so as to be opposite to each other with the memory array 10 interposed therebetween.

The column selection gates CSG1 to CSGm are turned ON/OFF by the respective column selection lines CSL1 to CSLm, and each couples one of the data I/O line pair DI/OP, i.e., the data line IO, to a corresponding bit line BL.

The read/write control circuit 60 has current control transistors 64-1 to 64-m coupled between the respective bit lines BL1 to BLm and the other of the data I/O line pair DI/OP, i.e., the data line /IO. Like the column selection gates CSG1 to CSGm, the current control transistors 64-1 to 64-m are turned ON/OFF according to the respective column selection lines CSL1 to CLSm.

A current switching circuit 56 is provided between the data I/O line pair DI/OP and the data write current control circuit 51 and data read circuit 52. The current switching circuit 56 selectively supplies the data write current ±Iw from the data write current control circuit 51 and the sense current Is from the data read circuit 52 to the data I/O line pair DI/OP.

Figure 13:
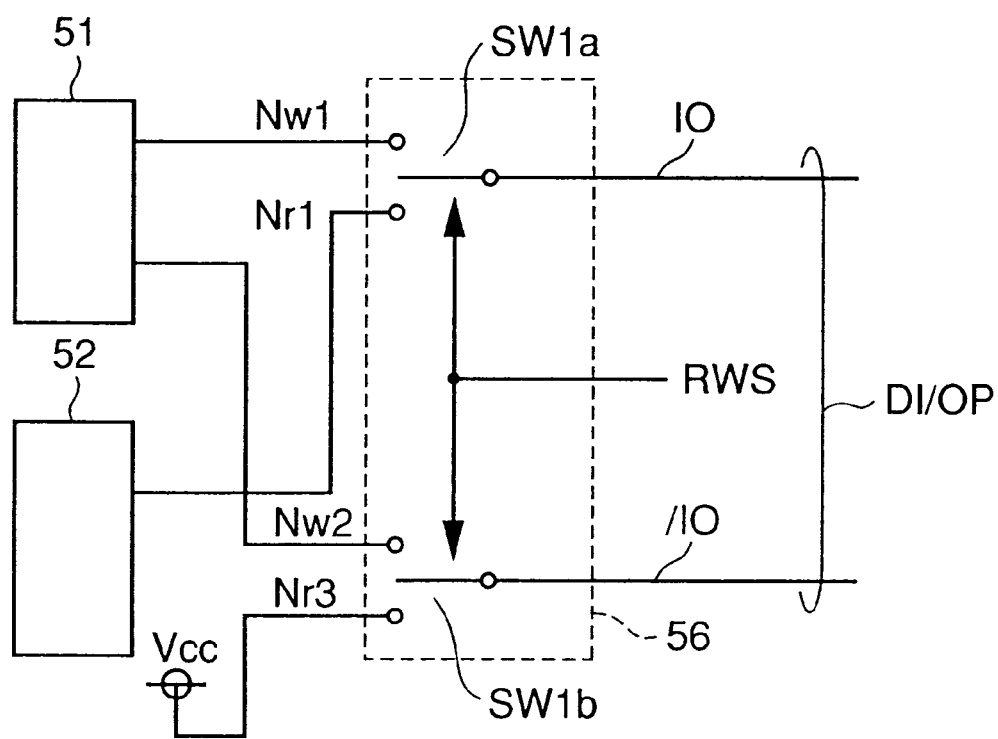
FIG. 13 is a block diagram showing the structure of a current switching circuit 56.

Referring to FIG. 13, the current switching circuit 56 has a switch SW1a for selectively coupling one of the output node Nw1 of the data write current control circuit 51 and the output node Nr1 of the data read circuit 52 to the data line IO, and a switch SW1b for selectively coupling one of the output node Nw2 of the data write current control circuit 51 and node Nr3 connected with the power supply potential Vcc to the data line /IO.

The switches SW1a and SW1b operate according to, for example, a common control signal RWS. More specifically, in the data read operation, the switches SW1a and SW1b respectively couple the output nodes Nr1 and Nr3 to the data lines IO and /IO, according to the control signal RWS.

In the fifth embodiment, the data read circuit 52 supplies the sense current Is to the data line IO with the data line /IO pulled up to the power supply potential Vcc, and senses the level of the read data DOUT based on the comparison between the voltage drop on the data line IO and a reference voltage drop amount ΔVr. Provided that the data line IO has a voltage drop ΔVh upon reading H-level data and has a voltage drop ΔVl upon reading L-level data, ΔVr is set to an intermediate value of ΔVh and ΔVl.

Such a structure of the data read control circuit is realized by, for example, modifying the structure of the data read circuit 52 shown in FIG. 2 as follows: the transistor 164 is omitted and the node Nr2 is coupled to the power supply potential Vcc, and also, a resistance value of the resistance 167 is set such that the potential level at the internal node Ns2 becomes (Vcc−ΔVr).

On the other hand, in the data write operation, the switches SW1a and SW1b respectively couple the output nodes Nw1 and Nw2 of the data write current control circuit 51 to the data lines IO and /IO, according to the control signal RWS.

Referring back to FIG. 12, in the data write operation, the data write current can be supplied through the path formed by the node Nw1 (data write current control circuit 51), data line IO, bit line BL, data line /IO and node Nw2 (data write current control circuit 51). Thus, even in the structure having the open bit lines, the data write current of the different directions can be supplied by merely controlling the potential level at the output node Nw1 of the data write current control circuit 51 to one of the power supply potential Vcc and ground potential Vss and controlling the potential level at the output node Nw2 thereof to the other potential, as in the first embodiment. Thus, since the potential of different polarity (negative potential) need not be produced, the circuit structure of the data write current control circuit 51 can be simplified. Similarly, the read/write control circuit 60 can be formed simply with the current control transistors 64-1 to 64-m.

Moreover, the data write current control circuit 51 is coupled to the data lines IO and /IO forming the data I/O line pair DI/OP on the side of the top memory cell column (the first column) and the last memory cell column (the mth column), respectively. Accordingly, like the third and fourth embodiments, the wiring length of the data write current path, i.e., the resistance value, can be kept constant regardless of the position of the memory cell column to be selected. As a result, variation in data write current is prevented, whereby a proper write margin can be assured for each memory cell without causing excessive power consumption.

Modification of Fifth Embodiment

Figure 14:
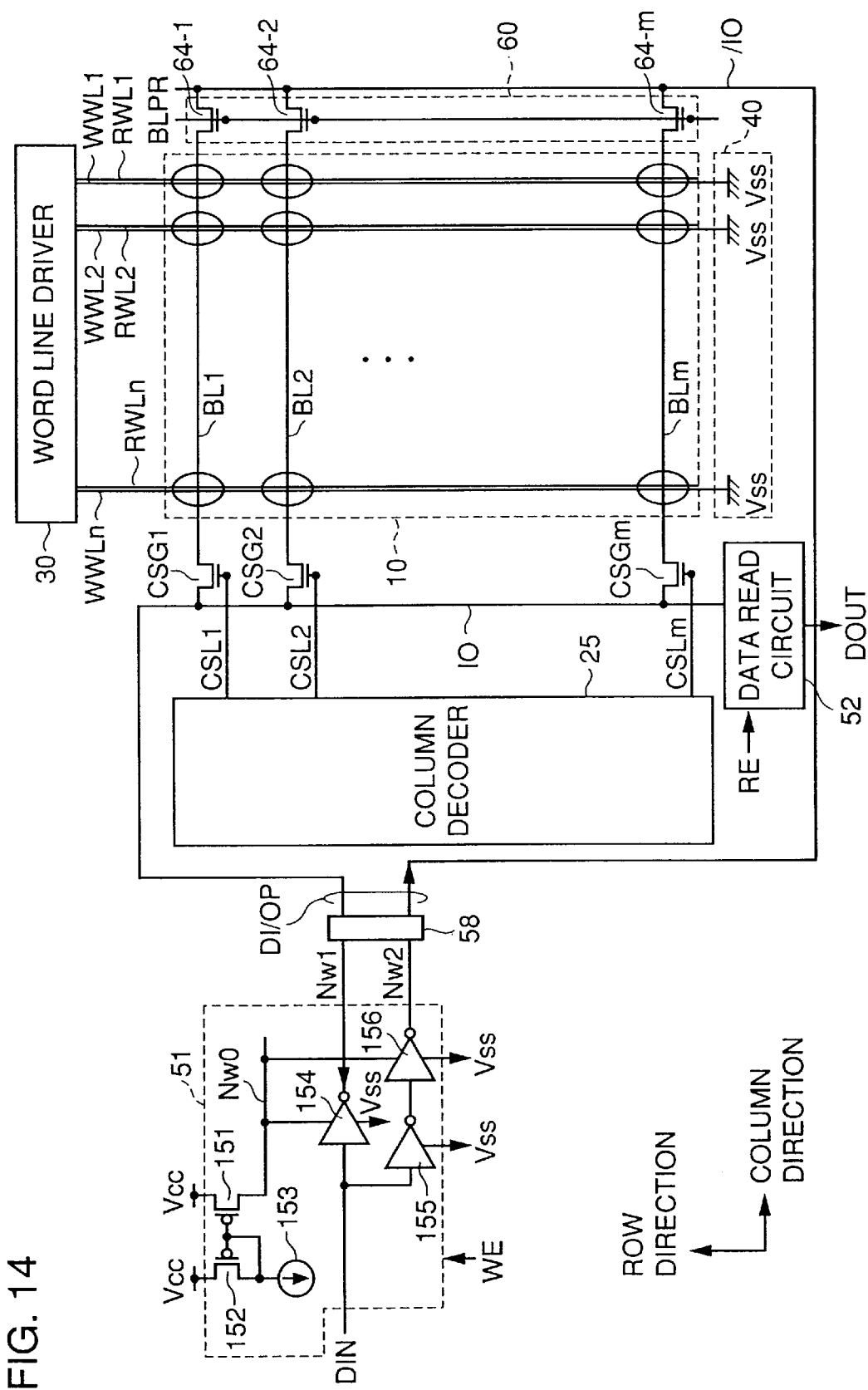
FIG. 14 is a block diagram showing the structure of a memory array 10 and its peripheral circuitry according to a modification of the fifth embodiment.

Referring to FIG. 14, the modification of the fifth embodiment is different from the structure of FIG. 12 in that the current control transistors 64-1 to 64-m included in the read/write control circuit 60 is turned ON/OFF according to a bit line precharging signal BLPR. The signal level of the bit line precharging signal BLPR is set in the same manner as that of the bit line equalizing signal BLEQ described before.

Moreover, instead of the current switching circuit 56, a current switching circuit 58 is coupled between the data write current control circuit 51 and the data I/O line pair DI/OP. The data read circuit 52 supplies the sense current Is to one of the data I/O line pair, i.e., the data line IO, in response to the control signal RE.

Figure 15:
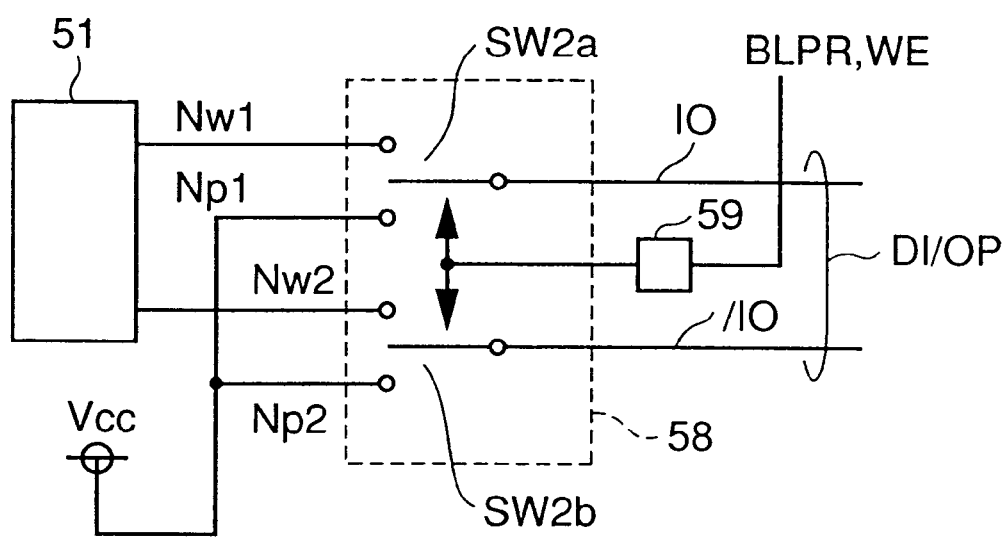
FIG. 15 is a block diagram showing the structure of a current switching circuit 58.

FIG. 15 is a block diagram showing the structure of the current switching circuit 58.

Referring to FIG. 15, the current switching circuit 58 has a switch SW2a provided between the data line IO and the output node Nw1 of the data write current control circuit 51 and a precharge node Np1 for supplying the power supply potential Vcc, and a switch SW2b provided between the data line /IO and the output node Nw2 of the data write current control circuit 51 and a precharge node Np2 for supplying the power supply potential Vcc.

In the data write operation, the switches SW2a and SW2b electrically couple the data lines IO and /IO to the output nodes Nw1 and Nw2 of the data write current control circuit 51, respectively. In the precharge operation conducted prior to the data read operation, the switches SW1b and SW2b electrically couple the data lines IO and /IO to the precharge nodes Np1 and Np2, respectively.

In the data read operation, however, the switches SW1b and SW2b disconnect the precharged data lines IO and /IO from both the output nodes Nw1, Nw2 of the data write current control circuit 51 and precharge nodes Np1, Np2.

Based on the signal levels of the control signal WE and bit line precharging signal BLPR described before, a switch control circuit 59 determines which one of the data write operation, data read operation and precharge operation is a current operation, and controls connection of the switches SW2a and SW2b accordingly.

With such a structure, in the data read operation, the bit line precharging signal BLPR is inactivated to L level so as to turn OFF the current control transistors 64-1 to 64-m and to disconnect the data lines IO and /IO from both the data write current control circuit 51 and precharge nodes Np1, Np2.

Moreover, the data read circuit 52 having the same structure as that of the fifth embodiment supplies the sense current Is to the bit line BL through the data line IO and the column selection gate corresponding to the selected memory cell column. The data read circuit 52 can sense the level of the read data DOUT based on the comparison between the voltage drop produced on the bit line BL by the MTJ memory cell MC coupled thereto in response to activation of the read word line RWL and the reference voltage drop ΔVr.

In the data write operation, the bit line precharging signal BLPR is activated to H level, whereby the current control transistors 64-1 to 64-m are turned ON. Accordingly, in the selected memory cell column, a current path is formed by the node Nw1 (data write current control circuit 51), data line IO, bit line BL, current control transistor, data line /IO, and node Nw2 (data write current control circuit 51). Thus, the data write current ±IW corresponding to the level of the write data DIN can be supplied to the bit line BL. As a result, the data write operation can be conducted in the same manner as that of the fifth embodiment.

Sixth Embodiment

In the sixth embodiment, a variation of wiring arrangement for the MTJ memory cells MC will be described.

Figure 16:
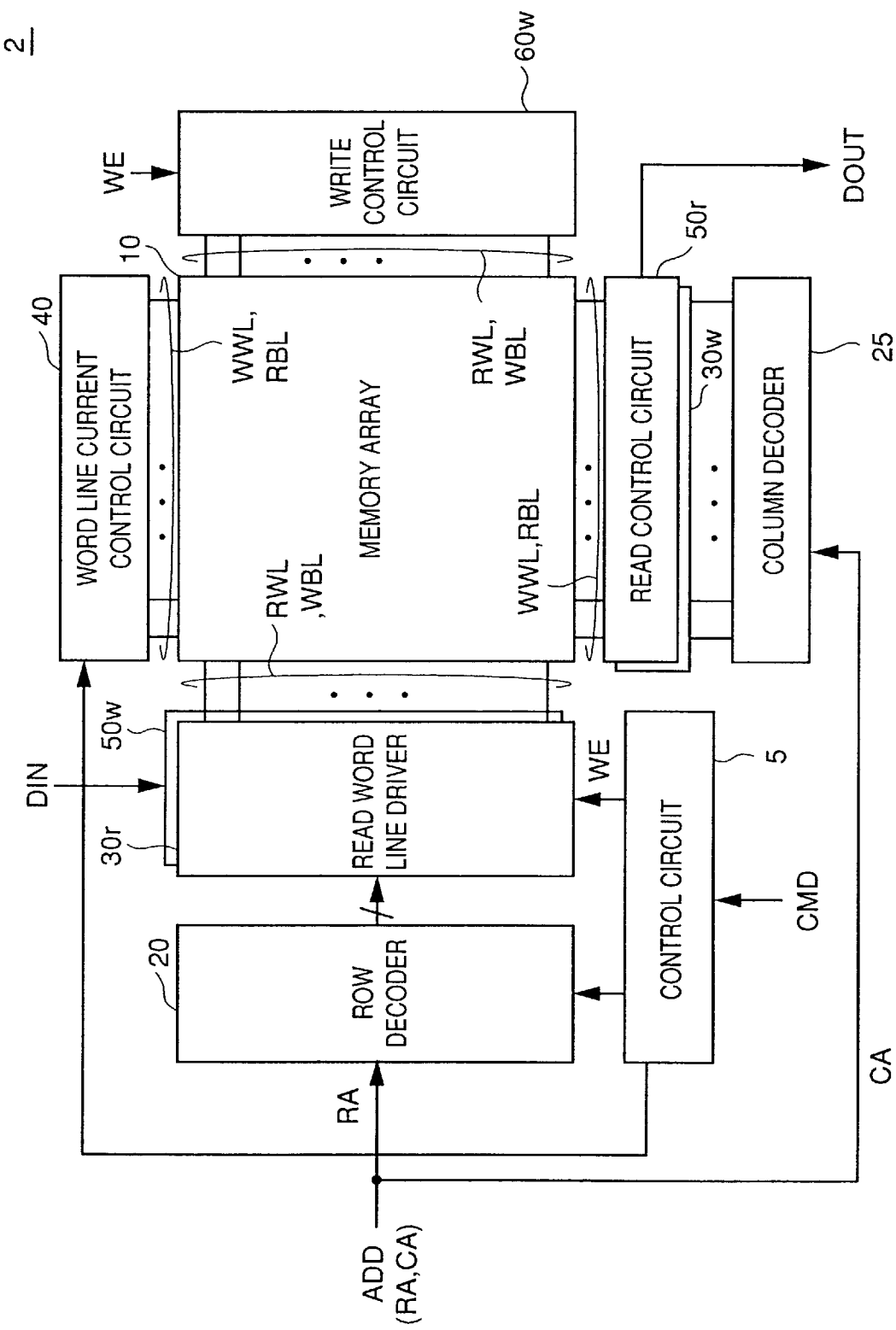
FIG. 16 is a schematic block diagram showing the overall structure of an MRAM device 2 according to a sixth embodiment of the present invention.

Referring to FIG. 16, like the MRAM device 1, an MRAM device 2 according to the sixth embodiment of the present invention conducts random access in response to an external control signal CMD and address signal ADD, thereby conducting input of write data DIN and output of read data DOUT. A memory array 10 has a plurality of MTJ memory cells arranged in n rows by m columns. Although the structure of the memory array 10 will be described later in detail, a plurality of read word lines RWL and a plurality of write bit lines WBL are provided corresponding to the respective memory cell rows, and a plurality of write word lines WWL and a plurality of read bit lines RBL are provided corresponding to the respective memory cell columns.

Thus, in the sixth embodiment, the bit line BL for supplying a data write current ±Iw and sense current Is is divided into a read bit line RBL for supplying the sense current Is in the data read operation, and a write bit line WBL for supplying the data write current ±Iw in the data write operation. The read word line RWL and write word line WWL extend in the different directions.

The MRAM device 2 further includes a row decoder 20 for conducting row selection in the memory array 10 according to a row address RA indicated by the address signal ADD, a column decoder 25 for conducting column selection in the memory array 10 according to a column address CA indicated by the address signal ADD, a read word line driver 30r for selectively activating the read word line RWL in the data read operation based on the row selection result of the row decoder 20, write control circuits 50w, 60w for supplying the data write current to the write bit line WBL in the data write operation based on the row selection result of the row decoder 20, a write word line driver 30w for selectively activating the write word line WWL in the data write operation based on the column selection result of the column decoder 25, a word line current control circuit 40 for supplying the data write current to the activated write word line WWL, and a read control circuit 50r for supplying the sense current Is to the read bit line RBL in the data read operation.

The write control circuit 50w is equivalent to a circuit having both the function of the data write current control circuit 51 described in the first embodiment and the function of selection gates for conducting row selection. The write control circuit 60w operates cooperatively with the write control circuit 50w, and controls the direction of the data write current ±Iw by controlling the potentials at both ends of the write bit line WBL at both ends of the memory array 10 according to the level of the write data DIN.

The read control circuit 50r is equivalent to a circuit having both the function of the data read circuit 52 described in connection with FIG. 2 and the function of the column selection gates CSG1 to CSGm for conducting column selection.

The word line current control circuit 40 couples each write word line WWL to the ground potential Vss in order to supply the data write current to the write word line WWL activated to the selected state (high potential state: H level).

Figure 17:
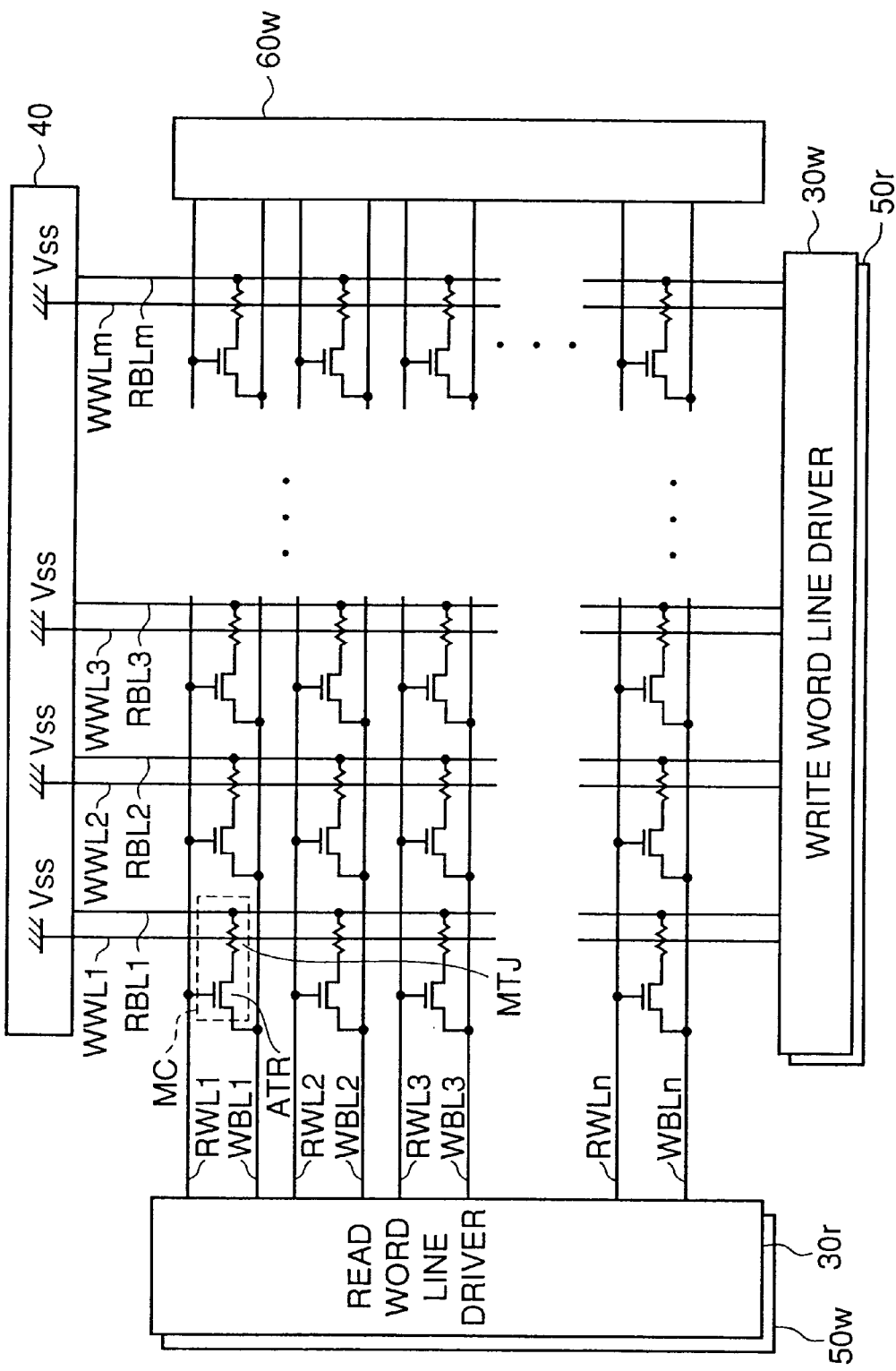
FIG. 17 is a block diagram showing the structure of a memory array 10 according to the sixth embodiment.

Referring to FIG. 17, the memory array 10 according to the sixth embodiment has a plurality of MTJ memory cells MC arranged in n rows by m columns. In the structure according to the sixth embodiment, the read word line RWL, write word line WWL, read bit line RBL and write bit line WBL are provided for each MTJ memory cell MC. The read word lines RWL and write bit lines WBL extend in the row direction so as to correspond to the respective memory cell rows. The write word lines WWL and read bit lines RBL extend in the column direction so as to correspond to the respective memory cell columns.

As a result, the read word lines RWL1 to RWLn, write word lines WWL1 to WWLm, read bit lines RBL1 to RBLm, and write bit lines WBL1 to WBLn are provided in the entire memory array 10.

Note that, hereinafter, the read bit lines are generally denoted with RBL, and a specific read bit line is denoted with RBL1, RBLm or the like.

The word line current control circuit 40 couples the write word lines WWL1 to WWLm to the ground potential Vss. Thus, when the write word line WWL is activated to the selected state (H level: power supply potential Vcc) by the write word line driver 30w, the data write current Ip can be supplied to the activated write word line WWL.

Figure 18:
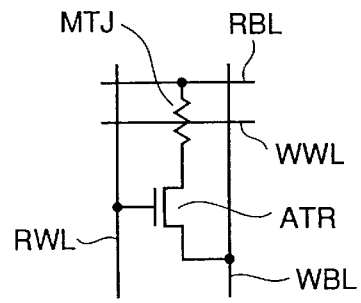
FIG. 18 is a circuit diagram showing the connection state of an MTJ memory cell according to the sixth embodiment.

Referring to FIG. 18, according to the sixth embodiment, the read word line RWL, write word line WWL, write bit line WBL and read bit line RBL are provided for each MTJ memory cell that is formed by a magnetic tunnel junction MTJ and an access transistor ATR. As described before, a MOS transistor, which is a field effect transistor formed on a semiconductor substrate, is typically applied to the access transistor ATR.

The access transistor ATR has its gate coupled to the read word line RWL. The access transistor ATR is turned ON in response to activation of the read word line RWL to the selected state (H level: power supply potential Vcc), thereby forming a current path including the magnetic tunnel junction MTJ. When the read word line RWL is inactivated to the non-selected state (L level: ground potential Vss), the access transistor ATR is turned OFF. Therefore, the current path including the magnetic tunnel junction MTJ is not formed.

The write word line WWL and write bit line WBL extend perpendicular to each other in the vicinity of the magnetic tunnel junction MTJ. Thus, by providing the read word line RWL and write word line WWL extending perpendicularly to each other, the read word line driver 30r and write word line driver 30w can be located separately from each other. The read word line RWL and write word line WWL are independently activated in the data read and write operations. Therefore, these drivers can be originally designed as independent elements. Accordingly, the write word line driver 30w and read word line driver 30r each having a reduced size can be provided in different regions adjacent to the memory array 10. As a result, the freedom of layout can be improved, and the layout area, i.e., the chip area of the MRAM device, can be reduced.

The magnetic tunnel junction MTJ is electrically coupled between the read bit line RBL and access transistor ATR. Accordingly, in the data read operation, the potential level on the write bit line WBL that requires no current supply is set to the ground potential Vss. As a result, a current path is formed by the read bit line RBL, magnetic tunnel junction MTJ, access transistor ATR and write bit line WBL (ground potential Vss) in response to turning-ON of the access transistor ATR. By supplying the sense current Is to this current path, a potential change corresponding to the level of storage data in the magnetic tunnel junction MTJ is produced on the read bit line RBL, whereby the storage data can be read.

Figure 44:
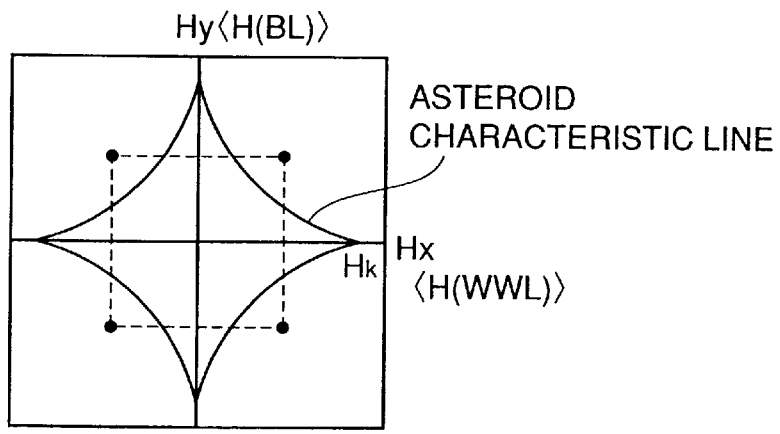
FIG. 44 is a conceptual diagram illustrating the relation between the direction of a data write current and the direction of a magnetic field in the data write operation.
Figure 45:
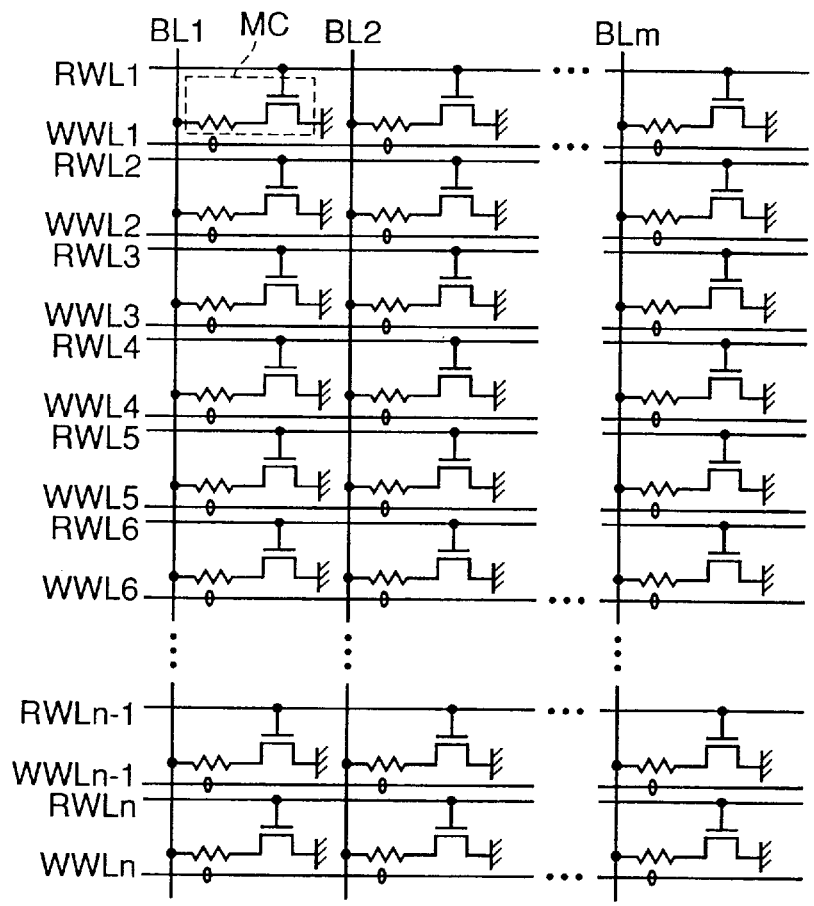
FIG. 45 is a conceptual diagram showing the MTJ memory cells arranged in rows and columns in an integrated manner.
Figure 46:
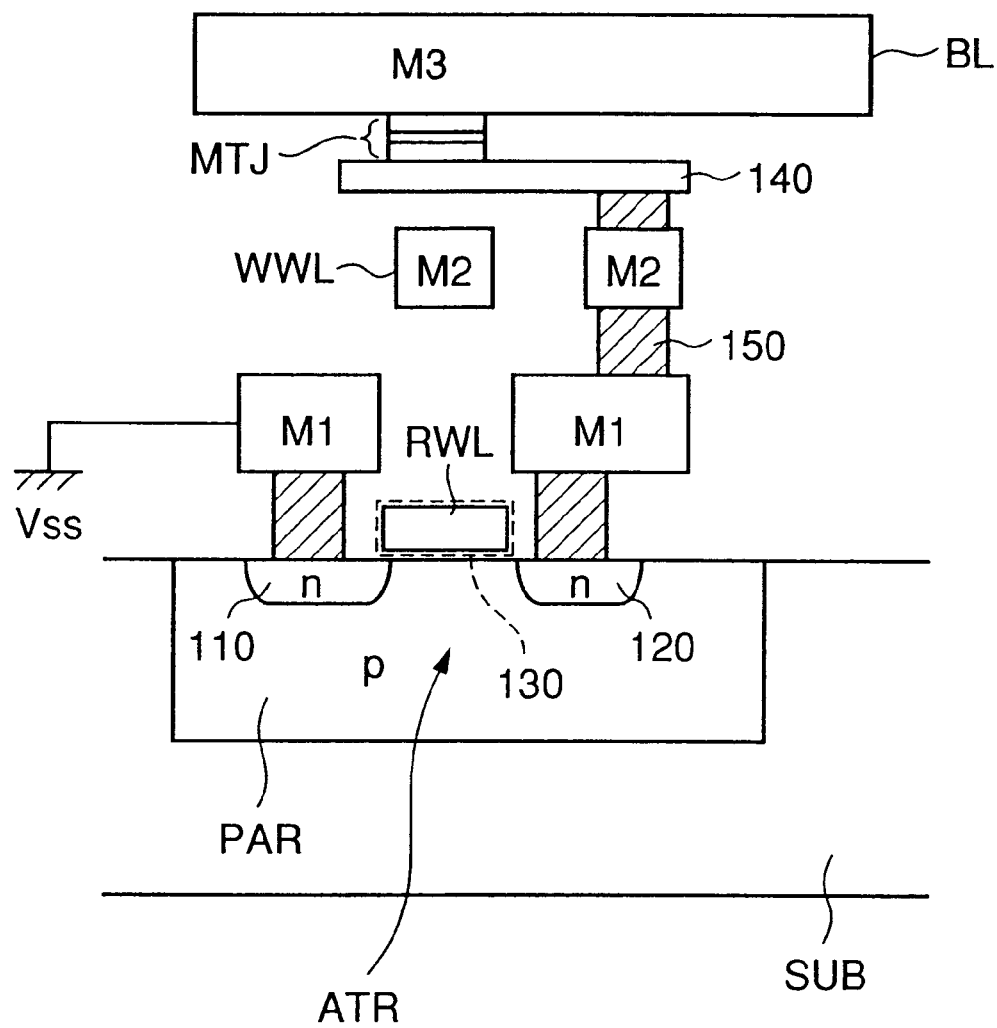
FIG. 46 is a structural diagram of a MTJ memory cell provided on a semiconductor substrate.

In the data write operation, the data write current is supplied to the write word line WWL and write bit line WBL. When the sum of the magnetic fields produced by these data write currents reaches a fixed magnetic field, i.e., the region beyond the asteroid characteristic line shown in FIG. 44, the storage data is written to the magnetic tunnel junction MTJ.

Hereinafter, the data write and read operations to and from the MTJ memory cells according to the sixth embodiment will be described with reference to FIG. 19.

First, the data write operation will be described.

According to the column selection result of the column decoder 25, the write word line driver 30w drives the potential on the write word line WWL corresponding to the selected column to the selected state (L level). In the non-selected columns, the potential levels on the write word lines WWL are held in the non-selected state (L level). Since each write word line WWL is coupled to the ground potential Vss by the word line current control circuit 40, the data write current Ip flows through the write word line WWL in the selected column.

In the data write operation, the read word lines RWL are held in the non-selected state (L level). In the data write operation, the read control circuit 50r does not supply the sense current Is, but precharges the read bit lines RBL to the high potential state (Vcc). Since the access transistors ATR are held in the OFF state, no current flows through the read bit lines RBL in the data write operation.

The write control circuits 50w and 60w control the potential on the write bit line WBL at both ends of the memory array 10, thereby producing a data write current in the direction corresponding to the level of the write data DIN. For example, in order to write the storage data "1", the bit line potential on the side of the write control circuit 60w is set to the high potential state (power supply potential Vcc), and the bit line potential on the opposite side, i.e., on the side of the write control circuit 50w, is set to the low potential state (power supply potential Vss). As a result, the data write current ±Iw flows through the write bit line WBL from the write control circuit 60w toward 50w. In order to write the storage data "0", the bit line potentials on the side of the write control circuits 50w and 60w are respectively set to the high and low potential states, whereby the data write current −Iw flows through the write bit line WBL from the write control circuit 50w toward 60w. At this time, the data write current ±Iw is selectively applied to the write bit line WBL corresponding to the selected row according to the row selection result of the row decoder 20.

By setting the directions of the data write currents Ip and ±Iw in this way, one of the data write currents +Iw and −Iw of the opposite directions is selected according to the level "1" or "0" of the storage data to be written, and the data write current Ip on the write word line WWL can be made to flow in the fixed direction regardless of the data level. Thus, the data write current Ip flowing through the write word line WWL can be always kept in the fixed direction. As a result, the structure of the word line current control circuit 40 can be simplified, as described before.

Next, the data read operation will be described.

In the data read operation, the write word lines WWL are held in the non-selected state (L level), and the potential level thereof is fixed to the ground potential Vss by the word line current control circuit 40. In the data read operation, the write control circuits 50w and 60w set the write bit lines WBL to the ground potential Vss and discontinue supply of the data write current.

The read word line driver 30r drives the read word line RWL corresponding to the selected row to the selected state (H level), according to the row selection result of the row decoder 20. In the non-selected rows, the potential levels on the read word lines RWL are held in the non-selected state (L level). In the data read operation, the read control circuit 50r supplies the read bit line RBL of the selected column with a fixed amount of sense current Is for conducting the data read operation. The read bit lines RBL are precharged to the high potential state (Vcc) before the data read operation. Therefore, when the access transistor ATR is turned ON in response to activation of the read word line RWL, a current path of the sense current Is is formed within the MTJ memory cell, whereby a potential change (drop) corresponding to the storage data is produced on the read bit line RBL.

Figure 19:
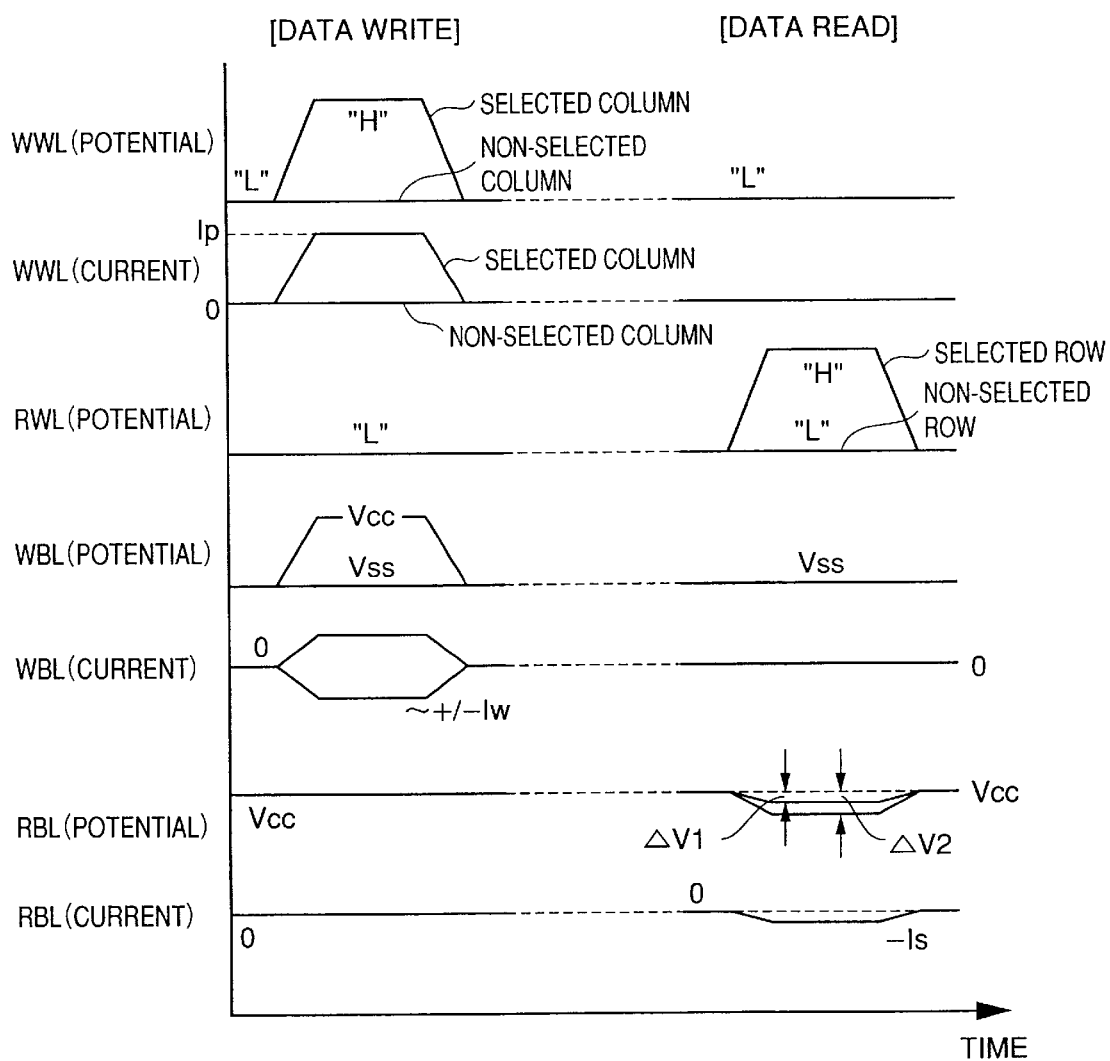
FIG. 19 is a timing chart illustrating the data read and write operations from and to the MTJ memory cell according to the sixth embodiment.

It is now assumed in FIG. 19 that the fixed magnetic layer FL and free magnetic layer VL have the same magnetic field direction when the data level of "1" is stored. In this case, the read bit line RBL has a small potential change ΔV1 when the storage data is "1", and has a potential change ΔV2 larger than ΔV1 when the storage data is "0". The storage data of the MTJ memory cell can be read by sensing the difference between the potential drops ΔV1 and ΔV2.

The precharge level of the read bit lines RBL (Vcc in FIG. 19) is equal to the potential level of the read bit lines RBL in the data write operation. As a result, a precharge operation prior to the read data operation can be performed efficiently, whereby the data read operation speed can be increased. Similarly, when the precharge level of the read bit lines RBL is set at the ground potential Vss, the potential level of the read bit lines RBL in the data write operation should be set at same potential Vss.

Figure 20:
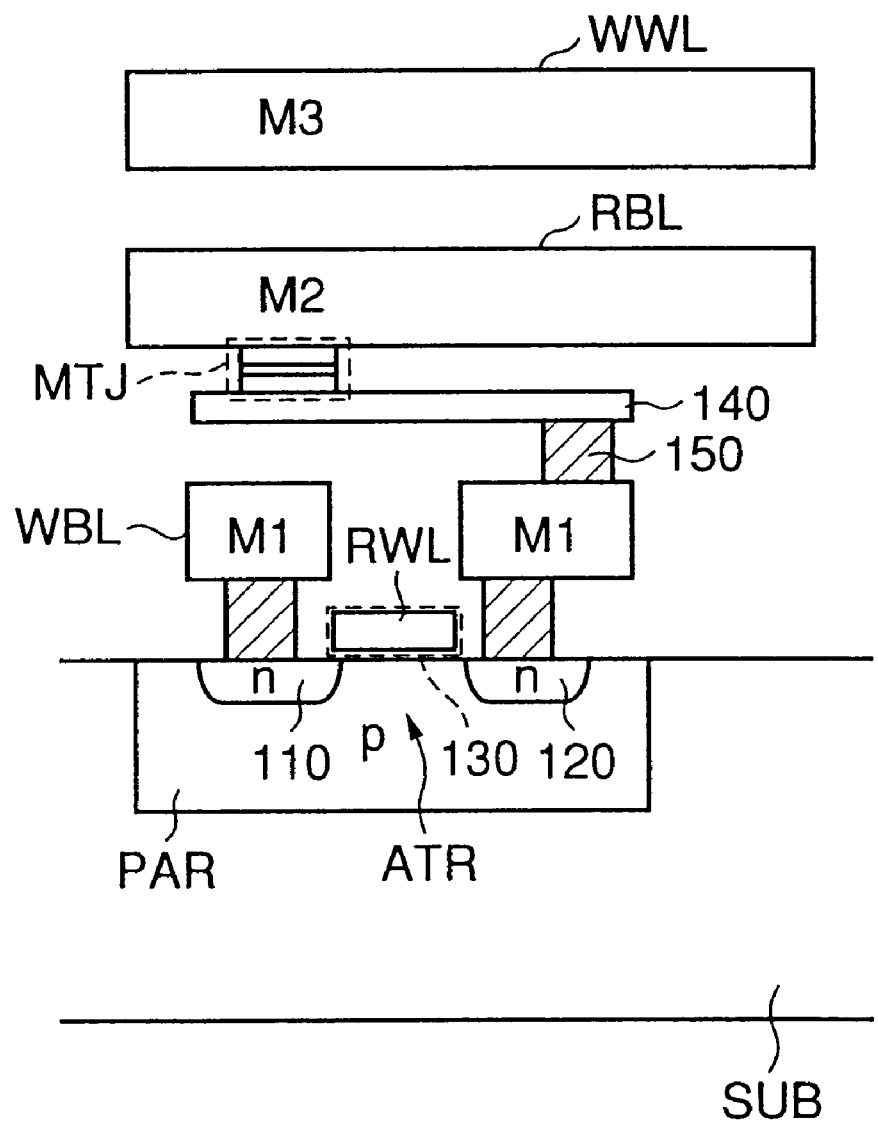
FIG. 20 is a structural diagram illustrating the arrangement of the MTJ memory cell according to the sixth embodiment.

Referring to FIG. 20, in the MTJ memory cell according to the sixth embodiment, the access transistor ATR is formed in a p-type region PAR of a semiconductor main substrate SUB. The write bit line WBL is formed in a first metal wiring layer M1 so as to be electrically coupled to one of the source/drain regions, i.e., 110, of the access transistor ATR. The other source/drain region 120 is electrically coupled to the magnetic tunnel junction MTJ through a metal wiring formed in the first metal wiring layer M1, a barrier metal 140 and a metal film 150 formed in a contact hole.

The read bit line RBL is formed in a second metal wiring layer M2 so as to be electrically coupled to the magnetic tunnel junction MTJ. The write word line WWL is formed in a third metal wiring layer M3. The write word line WWL can be independently provided without being coupled to another portion of the MTJ memory cell. Therefore, the write word line WWL can be arbitrarily arranged so as to enhance the magnetic coupling with the magnetic tunnel junction MTJ.

With such a structure, the read word line RWL and write word line WWL are provided for the MTJ memory cell so as to extend perpendicularly to each other, and the read word line driver 30r and write word line driver 30w respectively corresponding to the read word line RWL and write word line WWL are independently provided. Thus, the freedom of layout can be improved. Moreover, a word line drive current is prevented from being excessively increased in the data read operation, whereby generation of undesirable magnetic noise can be prevented.

First Modification of Sixth Embodiment

Figure 21:
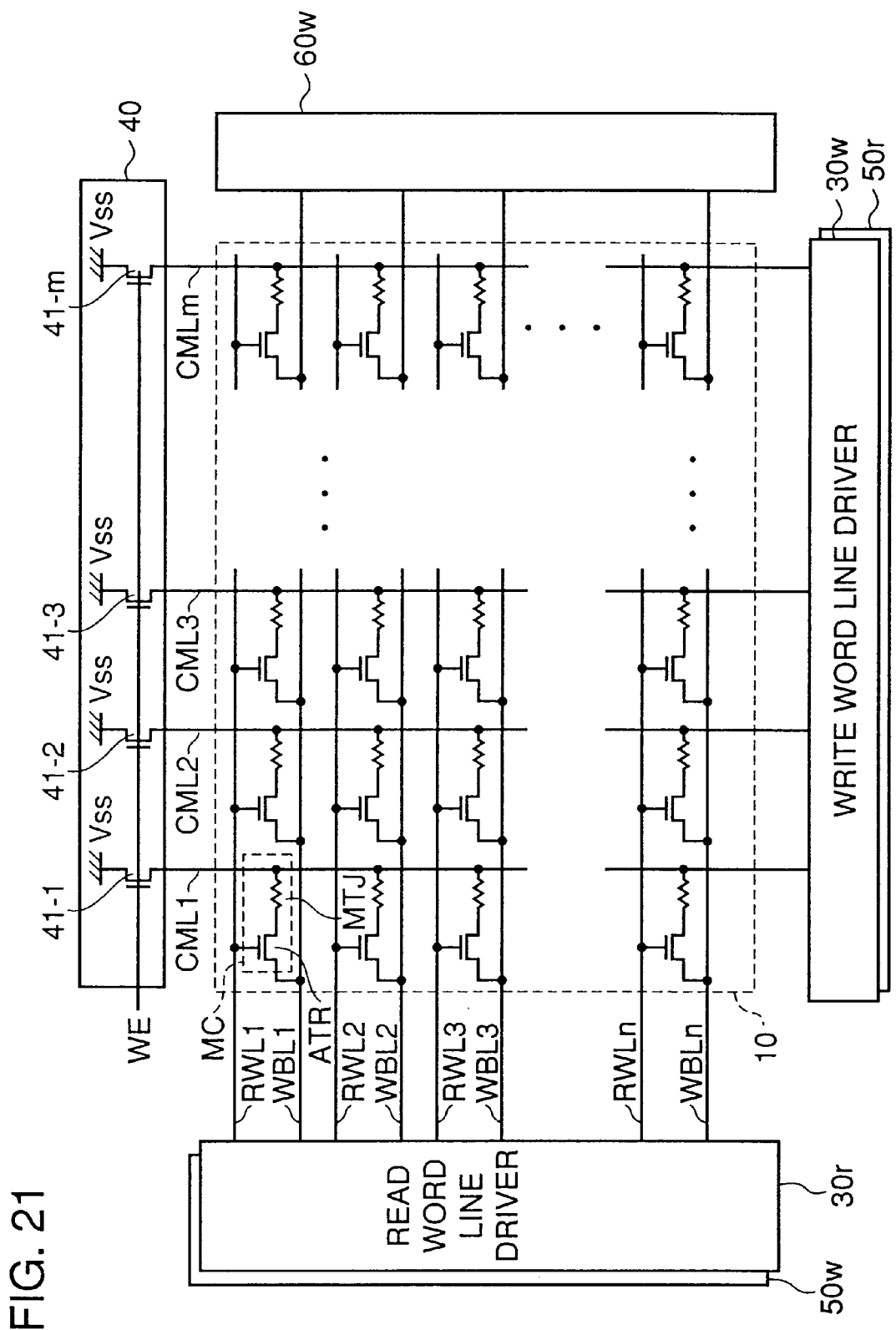
FIG. 21 is a block diagram showing the structure of a memory array 10 according to a first modification of the sixth embodiment.

Referring to FIG. 21, the memory array 10 has MTJ memory cells MC arranged in n rows by m columns. The read word lines RWL and write bit lines WBL are provided corresponding to the respective memory cell rows, and common lines CML are provided corresponding to the respective memory cell columns. Note that the common lines CML are generally denoted with CML, and a specific common line is denoted with CML1, CM2 or the like. The common lines CML are wirings having both functions of the read bit line RBL and write word line WWL. Accordingly, the read word lines RWL1 to RWLn, write bit lines WBL1 to WBLn and common lines CML1 to CMLm are provided in the entire memory array 10.

The word line current control circuit 40 has current control transistors 41-1 to 41-m coupled between the respective common lines CML1 to CMLm and the ground potential Vss. In the data write operation, the current control transistors 41-1 to 41-m couple the respective common lines CML1 to CMLm to the ground potential Vss in order to make the respective common lines CML operate as write word lines WWL. In the operation other than the data write operation, the current control transistors 41-1 to 41-m are turned OFF, whereby the common lines CML are disconnected from the ground potential Vss.

Thus, in the first modification of the sixth embodiment, the current control transistors 41-1 to 41-m enable the common lines CML to be used as read bit lines RBL in the data read operation, and as write word lines WWL in the data write operation. Accordingly, the common lines CML have both functions of the read bit line RBL and write word line WWL, whereby the number of wirings can be reduced.

Figure 22:
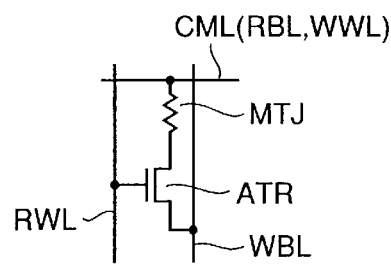
FIG. 22 is a circuit diagram showing the connection state of an MTJ memory cell according to the first modification of the sixth embodiment.

Referring to FIG. 22, the access transistor ATR is electrically coupled between the magnetic tunnel junction MTJ and write bit line WBL. The magnetic tunnel junction MTJ is coupled between the access transistor ATR and common line CML. The access transistor ATR has its gate coupled to the read word line RWL. In the structure of FIG. 22 as well, the read word line RWL and write word line WWL extend perpendicularly to each other.

The data write and read operations to and from the MTJ memory cell according to the first modification of the sixth embodiment will be described with reference to FIG. 23.

Figure 23:
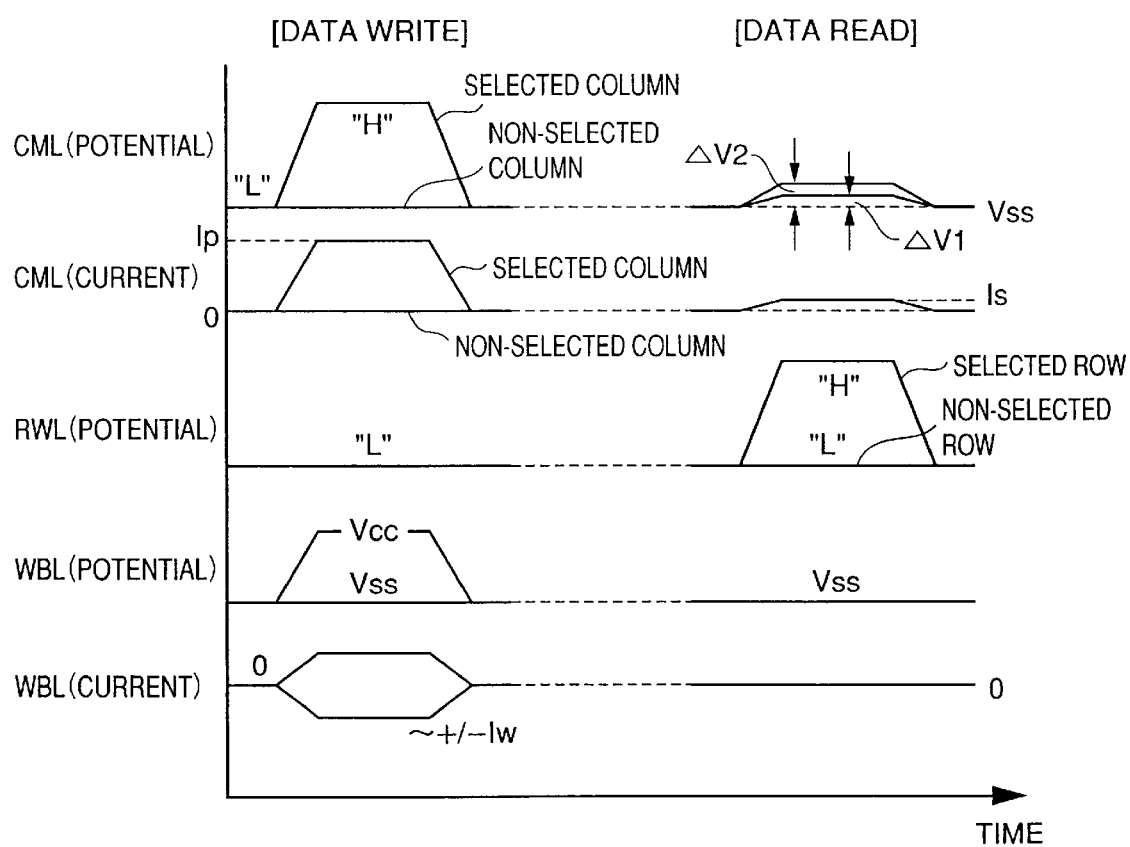
FIG. 23 is a timing chart illustrating the data write and read operations to and from the MTJ memory cell according to the first modification of the sixth embodiment.

Referring to FIG. 23, in the data write operation, the data write current ±Iw is supplied to the write bit lines WBL. Moreover, in response to turning-ON of the current control transistors 41-1 to 41-m, the data write current Ip flows through the common line CML corresponding to the selected column according to the column selection result. Thus, the potential and current on the common lines CML in the data write operation are set in the same manner as those of the write word lines WWL shown in FIG. 19. As a result, the magnetic field corresponding to the level of the write data DIN can be written to the magnetic tunnel junction MTJ. Moreover, as shown in FIG. 19, the read bit lines RBL are not required for the data write operation. Therefore, the read bit lines RBL and write word lines WWL can be integrated into the common lines CML.

In the operation other than the data write operation, the current control transistors 41-1 to 41-m are turned OFF. The common lines CML are precharged to the ground potential Vss prior to the data read operation.

In the data read operation, the potential level on the write bit lines WBL is set to the ground potential level Vss, and the read word line RWL is activated to the selected state (H level). Thus, the access transistor ATR is turned ON, so that the sense current Is can be supplied through the path formed by the common line CML, magnetic tunnel junction MTJ, access transistor ATR, and write bit line WBL.

When the current path of the sense current Is is formed in the MTJ memory cell, a potential change (rise) corresponding to the storage data is produced on the common line CML.

It is now assumed in FIG. 23 that the fixed magnetic layer FL and free magnetic layer VL have the same magnetic field direction when the data level of "1" is stored. In this case, the common line CML has a small potential change ΔV1 when the storage data is "1", and has a potential change ΔV2 larger than ΔV1 when the storage data is "0". The storage data of the MTJ memory cell can be read by sensing the difference between the potential changes ΔV1 and ΔV2 on the common line CML.

The precharge level of the common lines CML functioning as the read bit lines RBL in data read operation is equal to the potential level of the common lines CML in the data write operation. As a result, a precharge operation prior to the read data operation can be performed efficiently, whereby the data read operation speed can be increased.

Moreover, as shown in FIG. 19, the write word lines WWL are not required for the data read operation. Therefore, the write word lines WWL and read bit lines RBL can be integrated into the common lines CML.

Figure 24:
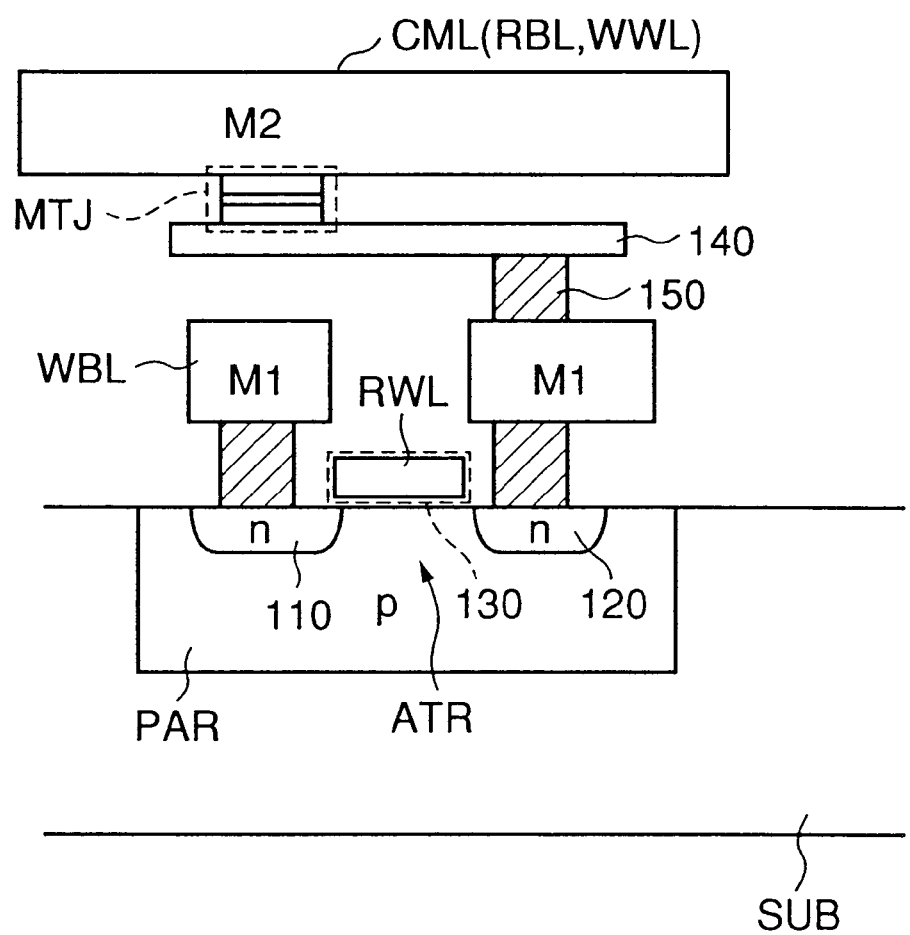
FIG. 24 is a structural diagram illustrating the arrangement of the MTJ memory cell according to the first modification of the sixth embodiment.

Referring to FIG. 24, in the MTJ memory cell according to the first modification of the sixth embodiment, the write bit line WBL is formed in the first metal wiring layer M1, and the read word line RWL is formed in the same layer as that of the gate 130 of the access transistor ATR.

The write bit line WBL is electrically coupled to the source/drain region 110 of the access transistor ATR. The other source/drain region 120 is coupled to the magnetic tunnel junction MTJ through the metal wiring formed in the first metal wiring layer M1, the barrier metal 140, and the metal film 150 formed in the contact hole.

The common line CML is formed in the second metal wiring layer M2 so as to be electrically coupled to the magnetic tunnel junction MTJ. Since the common line CML has both functions of the read bit line RBL and write word line WWL, reduction in the respective numbers of wirings and metal wiring layers and thus in the manufacturing cost can be achieved in addition to the effects obtained by the MTJ memory cells according to the sixth embodiment.

Second Modification of Sixth Embodiment

Figure 25:
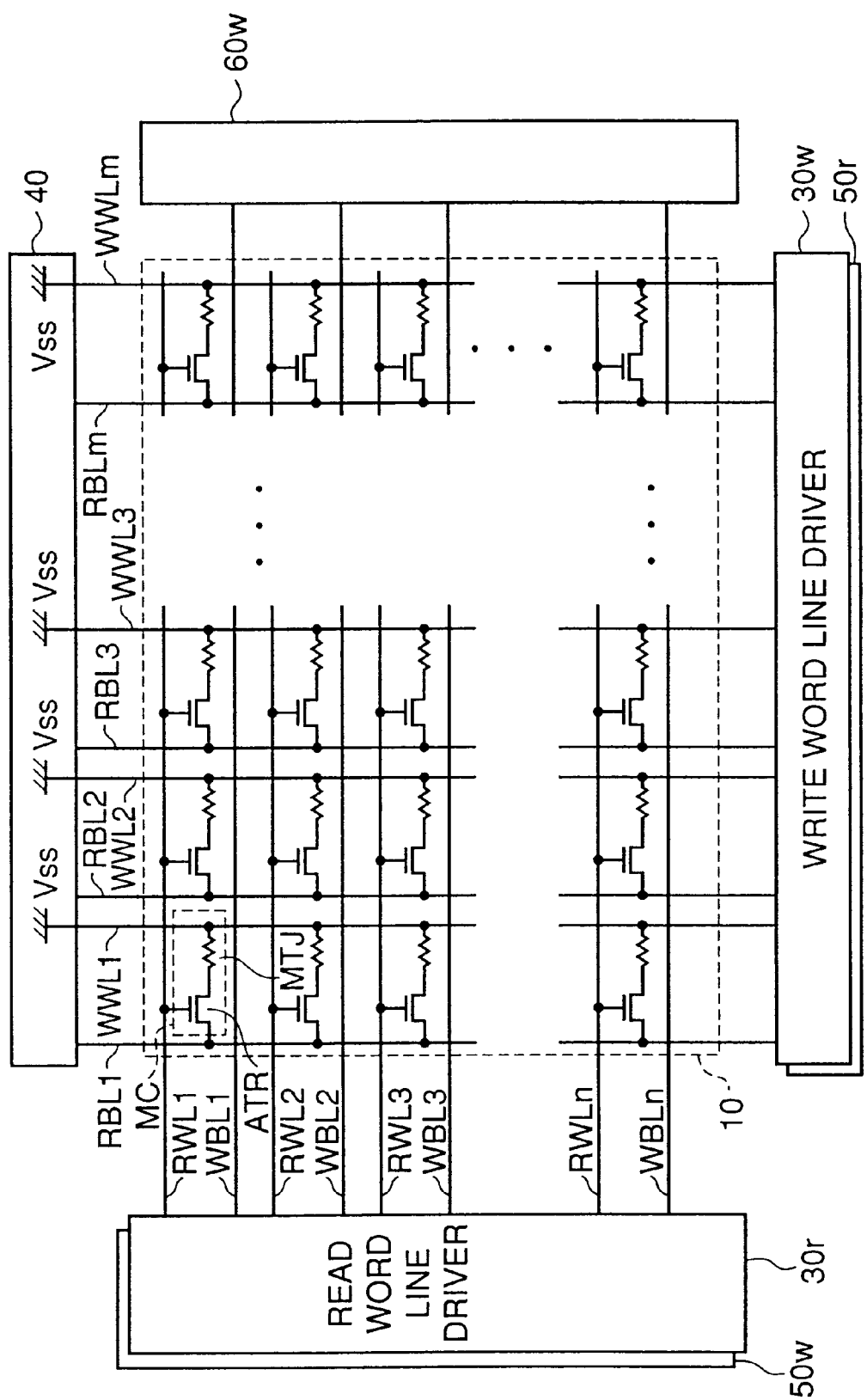
FIG. 25 is a block diagram showing the structure of a memory array 10 according to a second modification of the sixth embodiment.

Referring to FIG. 25, in the second modification of the sixth embodiment as well, the memory array 10 has MTJ memory cells MC arranged in n rows by m columns. The read word lines RWL and write bit lines WBL are provided corresponding to the respective memory cell rows. The read bit lines RBL and write word lines WWL are provided corresponding to the respective memory cell columns. Accordingly, the read word lines RWL1 to RWLn, write bit lines WBL1 to WBLn, read bit lines RBL1 to RBLm, and write word lines WWL1 to WWLm are provided in the entire memory array 10. The word line current control circuit 40 couples each write word line WWL to the ground potential Vss.

Figure 26:
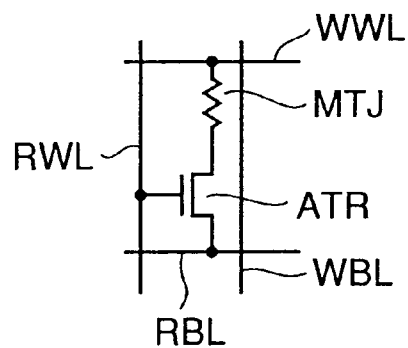
FIG. 26 is a circuit diagram showing the connection state of an MTJ memory cell according to the second modification of the sixth embodiment.

Referring to FIG. 26, in the MTJ memory cell according to the second modification of the sixth embodiment, the read bit line RBL is coupled to the magnetic tunnel junction MTJ through the access transistor ATR. The magnetic tunnel junction MTJ is coupled between the write word line WWL and access transistor ATR. The read word line RWL is coupled to the gate of the access transistor ATR. In the structure of FIG. 26 as well, the read word line RWL and write word line WWL extend perpendicularly to each other.

Figure 27:
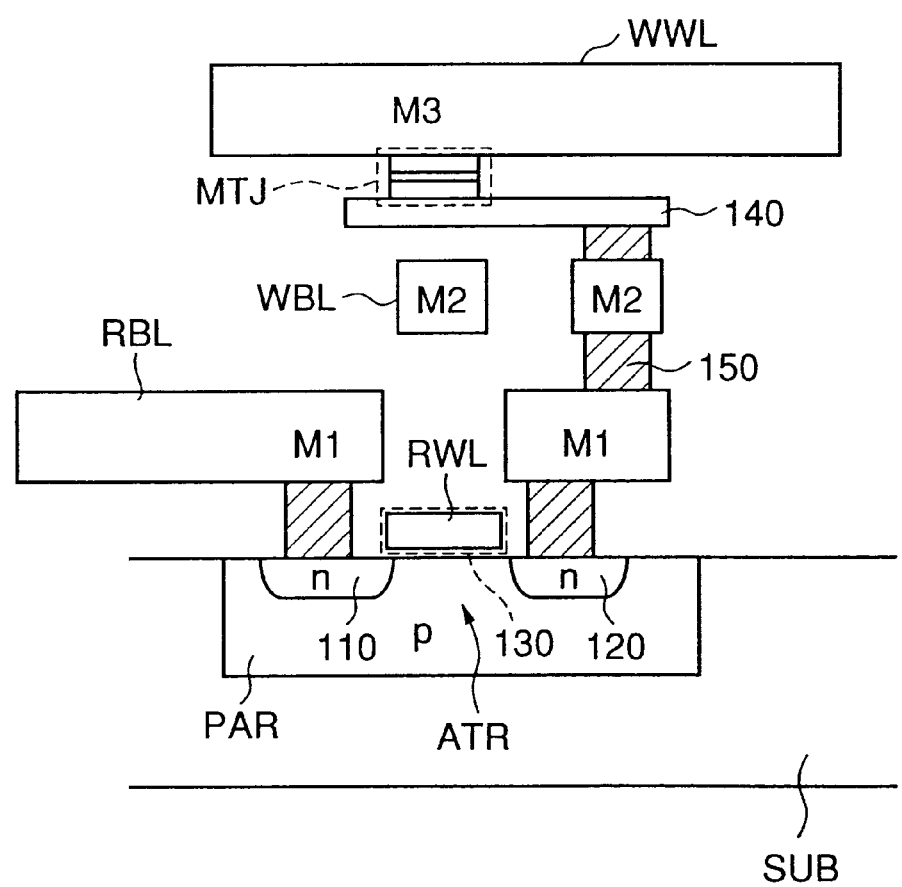
FIG. 27 is a structural diagram showing the arrangement of the MTJ memory cell according to the second modification of the sixth embodiment.

Referring to FIG. 27, in the MTJ memory cell according to the second modification of the sixth embodiment, the read bit line RBL is formed in the first metal wiring layer M1. The read word line RWL is formed in the same layer as that of the gate 130 of the access transistor ATR. The read bit line RBL is coupled to the source/drain region 110 of the access transistor ATR. The source/drain region 120 is coupled to the magnetic tunnel junction MTJ through the metal wirings respectively formed in the first and second metal wiring layers M1 and M2, the barrier metal 140, and the metal film 150 formed in the contact hole.

The write bit line WBL is formed in the second metal wiring layer M2 in the vicinity of the magnetic tunnel junction MTJ. The write word line WWL is formed in the third metal wiring layer M3 so as to be electrically coupled to the magnetic tunnel junction MTJ.

With such a structure, the read bit line RBL is coupled to the magnetic tunnel junction MTJ through the access transistor ATR. Thus, the read bit line RBL is electrically coupled only to the MTJ memory cell MC to be read, i.e., the MTJ memory cell MC in the memory cell row corresponding to the read word line RWL activated to the selected state (H level). As a result, the capacitance of the read bit line RBL is reduced, whereby the data read operation speed can be increased.

Third Modification of Sixth Embodiment

Figure 28:
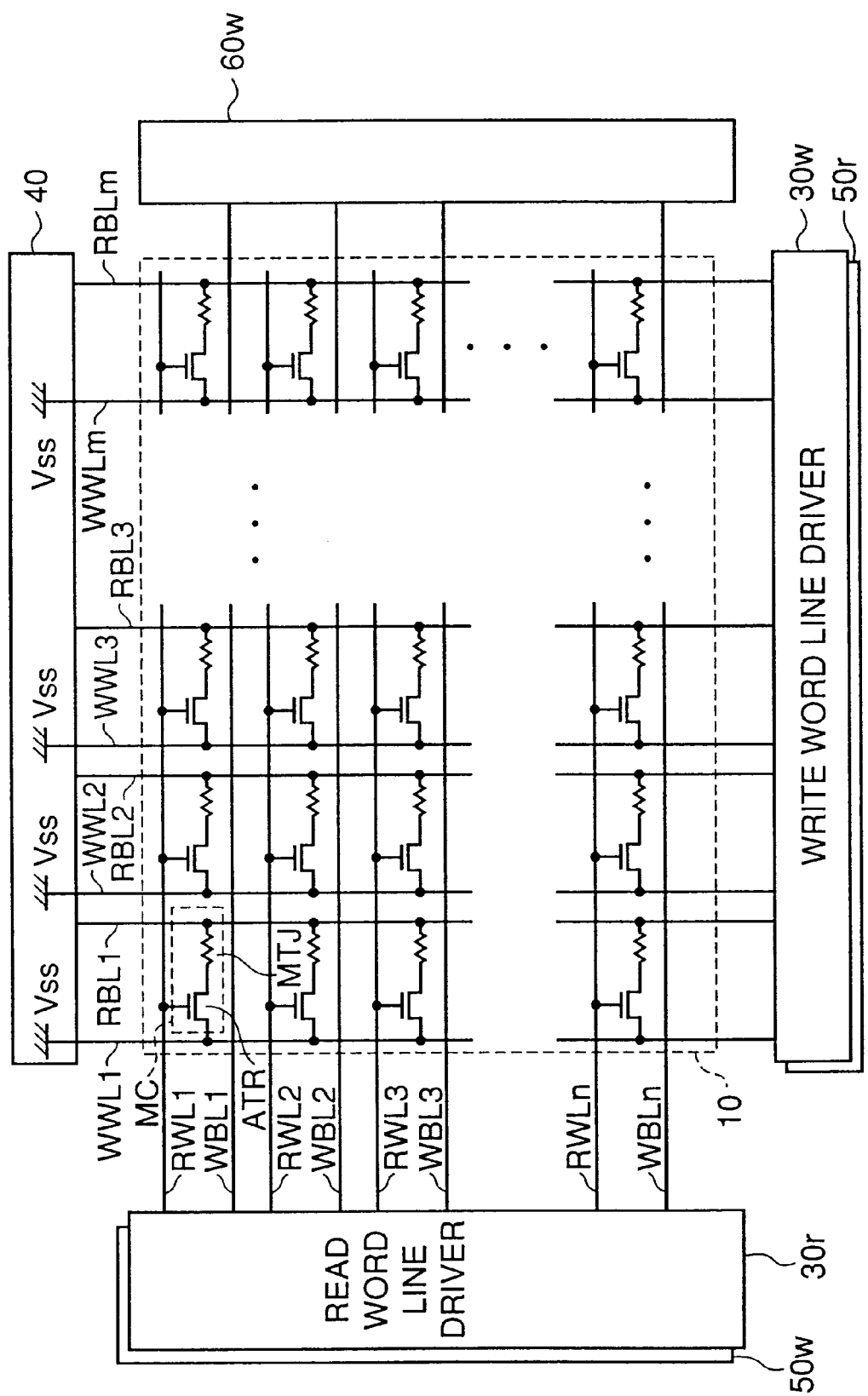
FIG. 28 is a block diagram showing the structure of a memory array 10 according to a third modification of the sixth embodiment.

Referring to FIG. 28, the memory array 10 according to the third modification of the sixth embodiment also has a plurality of MTJ memory cells MC arranged in n rows by m columns. The third modification of the sixth embodiment is different from the second modification thereof shown in FIGS. 25 to 27 in that the write word lines WWL and the read bit lines RBL are switched in position. Since the structure is otherwise the same as that of the second modification of the sixth embodiment, description thereof is not repeated.

Figure 29:
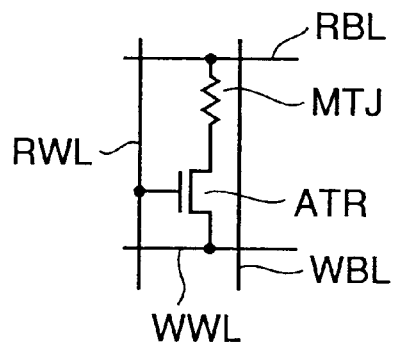
FIG. 29 is a circuit diagram showing the connection state of an MTJ memory cell according to the third modification of the sixth embodiment.

Referring to FIG. 29, the MTJ memory cell according to the third modification of the sixth embodiment is different from that of the second modification thereof shown in FIG. 26 in that the read bit line RBL and the write word line WWL are switched in position. Since the arrangement of the lines is otherwise the same as that of FIG. 26, description thereof is not repeated. In such a structure as well, the read word line RWL and write word line WWL can be made to extend perpendicularly to each other.

Figure 30:
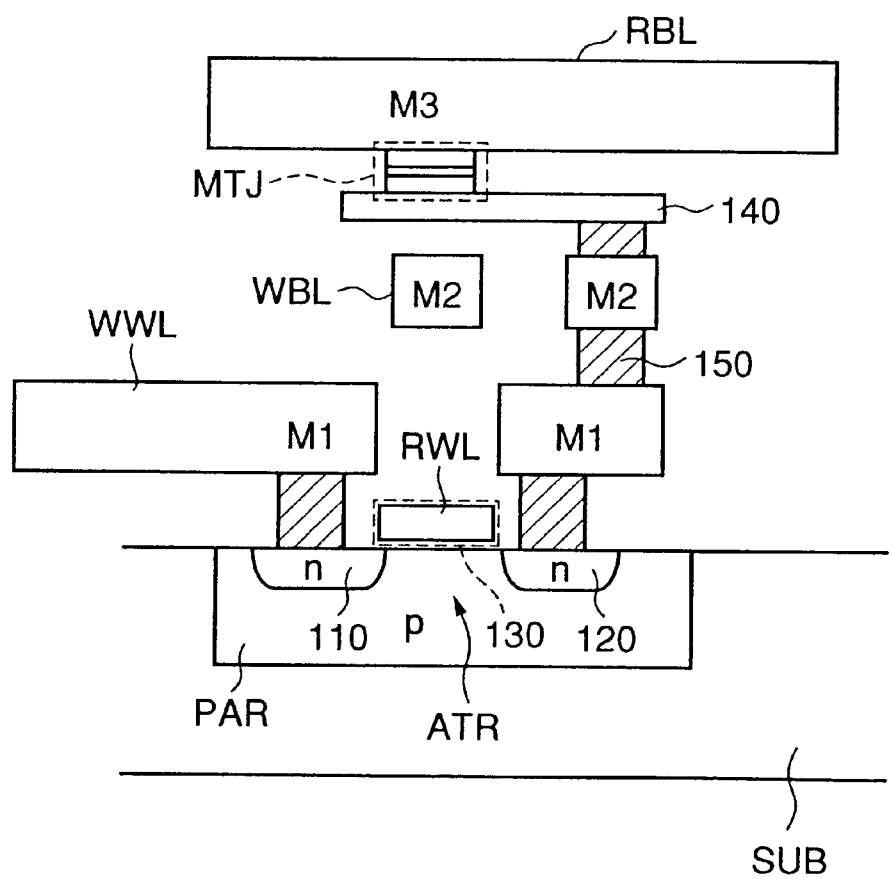
FIG. 30 is a structural diagram showing the arrangement of the MTJ memory cell according to the third modification of the sixth embodiment.

Referring to FIG. 30, the MTJ memory cell according to the third modification of the sixth embodiment is different from that of the second modification thereof shown in FIG. 27 in that the write word line WWL and the read bit line RBL are switched in position. More specifically, the write word line WWL is formed in the first metal wiring layer M1 so as to be coupled to the source/drain region 110 of the access transistor ATR. The read bit line RBL is formed in the third metal wiring layer M3 so as to be electrically coupled to the magnetic tunnel junction MTJ.

In the third modification of the sixth embodiment, the read bit line RBL is directly coupled to the magnetic tunnel junction MTJ. Therefore, such an increased read operation speed as in the second modification of the sixth embodiment cannot be achieved. However, in the structure of the third modification of the sixth embodiment as well, the read word line driver 30r and the write word line driver 30w can be independently provided, whereby the same effects as those of the sixth embodiment can be obtained.

Fourth Modification of Sixth Embodiment

Figure 31:
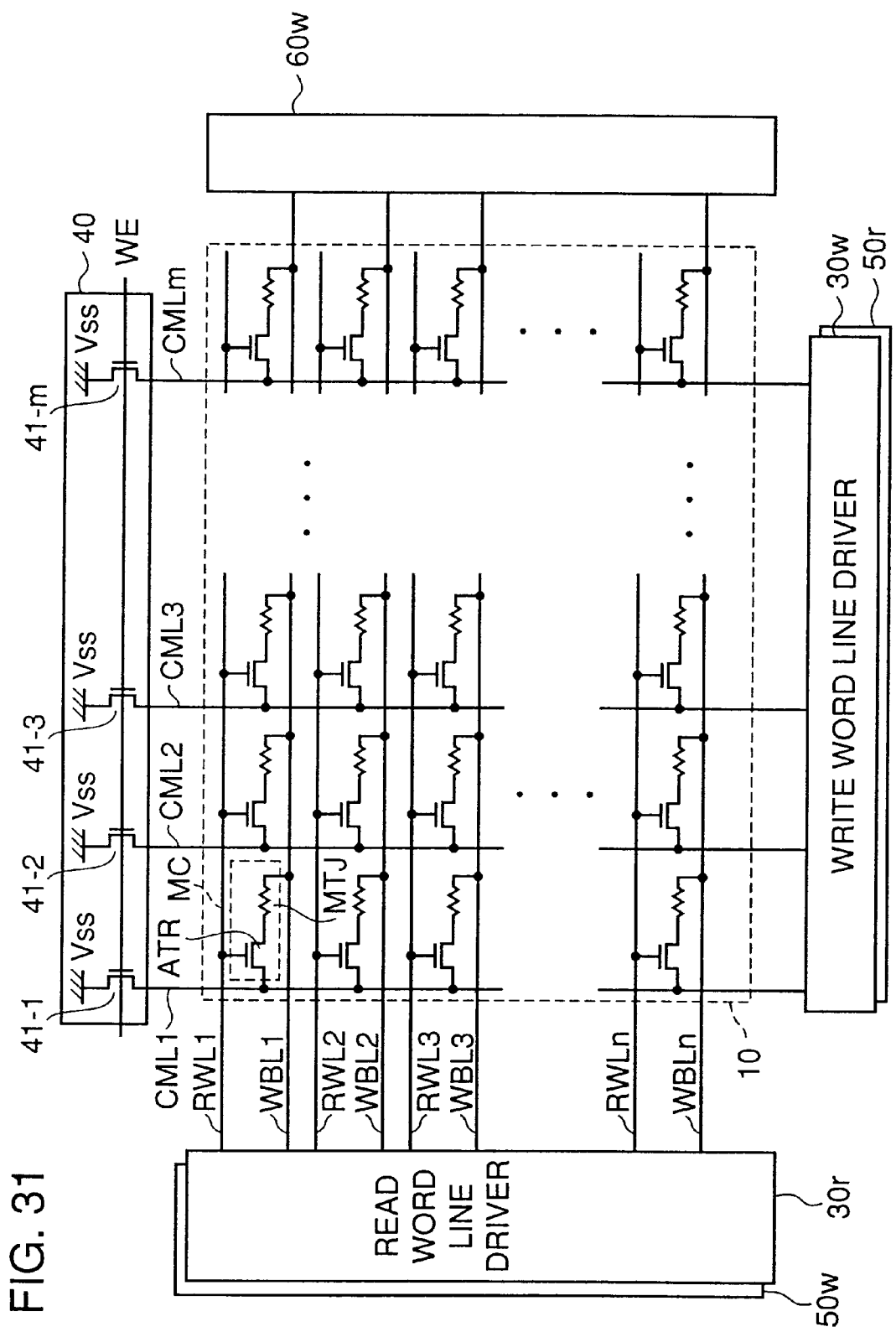
FIG. 31 is a block diagram showing the structure of a memory array 10 according to a fourth modification of the sixth embodiment.

Referring to FIG. 31, the memory array 10 according to the fourth modification of the sixth embodiment also has a plurality of MTJ memory cells MC arranged in n rows by m columns. The read word lines RWL and write bit lines WBL are provided corresponding to the respective memory cell rows, and the common lines CML are provided corresponding to the respective memory cell columns. Accordingly, the read word lines RWL1 to RWLn, write bit lines WBL1 to WBLn, and common lines CML1 to CMLm are provided in the entire memory array 10.

The word line current control circuit 40 has current control transistors 41-1 to 41-m electrically coupled between the respective common lines CML1 to CMLm and the ground potential Vss. In the data write operation, the current control transistors 41-1 to 41-m couple the respective common lines CML to the ground potential Vss. In the operation other than the data write operation, the common lines CML1 to CMLm are disconnected from the ground potential Vss. The common lines CML are precharged to the ground potential Vss prior to the data read operation.

Figure 32:
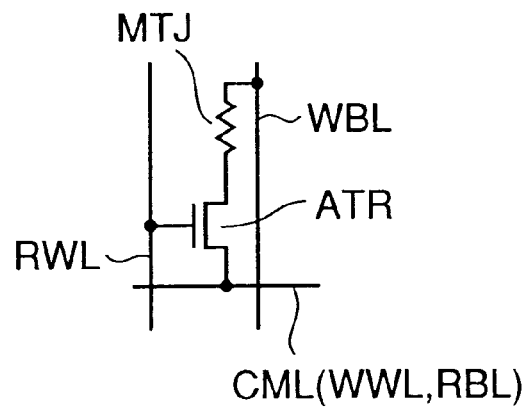
FIG. 32 is a circuit diagram showing the connection state of an MTJ memory cell according to the fourth modification of the sixth embodiment.

Referring to FIG. 32, in the MTJ memory cell according to the fourth modification of the sixth embodiment, the access transistor ATR is coupled between the common line CML and magnetic tunnel junction MTJ. The read word line RWL is coupled to the gate of the access transistor ATR. The write bit line WBL extends in the same direction as that of the read word line RWL, and is electrically coupled to the magnetic tunnel junction MTJ.

In the data write operation, like the write word line WWL, the common line CML is selectively activated by the write word line driver 30w. In the data read operation, the common line CML is supplied with the sense current Is from the read control circuit 50r.

In the data write operation, in response to turning-ON of the current control transistors 41-1 to 41-m, the data write current Ip flows through the common line CML activated to the selected state (H level), like the write word line WWL. In the data read operation, the current control transistors 41-1 to 41-m are turned OFF, whereby the sense current Is flows through a path formed by the common line CML, magnetic tunnel junction MTJ, access transistor ATR and write bit line WBL (ground potential Vss). As a result, a potential change corresponding to the storage data of the magnetic tunnel junction MTJ is produced on the common line CML, as described in connection with FIG. 23, Thus, the common line CML functions as write word line WWL in the data write operation and also functions as read bit line RBL in the data read operation. As a result, the number of wirings can be reduced.

Moreover, the read word line RWL and the common line CML functioning as a write word line in the data write operation extend perpendicularly to each other. Therefore, the read word line driver 30r and the write word line driver 30w can be independently provided, whereby the same effects as those of the sixth embodiment can be obtained.

Figure 33:
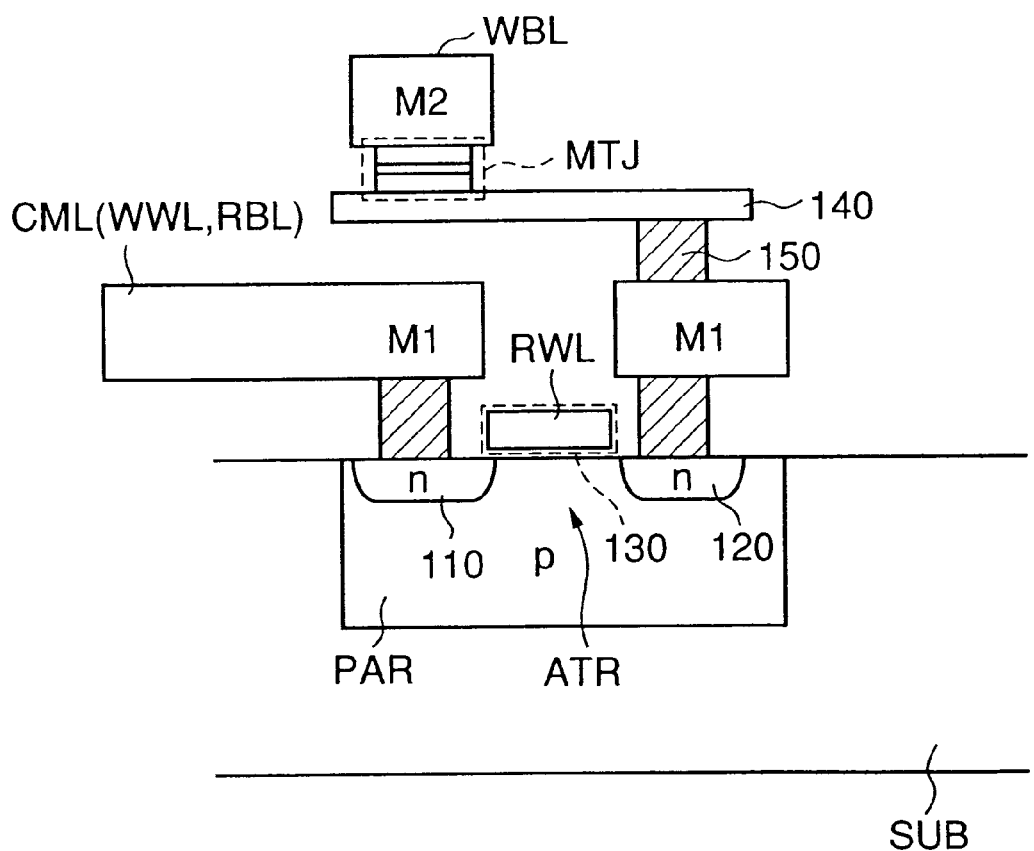
FIG. 33 is a structural diagram showing the arrangement of the MTJ memory cell according to the fourth modification of the sixth embodiment.

Referring to FIG. 33, in the MTJ memory cell according to the fourth modification of the sixth embodiment, the common line CML is formed in the first metal wiring layer M1 so as to be electrically coupled to the source/drain region 110 of the access transistor ATR. The read word line RWL is formed in the same layer as that of the gate 130 of the access transistor ATR.

The source/drain region 120 is coupled to the magnetic tunnel junction MTJ through the metal wiring formed in the first metal wiring layer M1, the barrier metal 140, and the metal film 150 formed in the contact hole. The write bit line WBL is formed in the second metal wiring layer M2 so as to be electrically coupled to the magnetic tunnel junction MTJ.

Thus, since the common line CML and the magnetic tunnel junction MTJ are coupled to each other through the access transistor ATR, the common line CML is coupled to the magnetic tunnel junction MTJ only when the access transistor ATR is turned ON. As a result, the capacitance of the common line CML functioning as read bit line RBL in the data read operation is reduced, whereby the data read operation speed can further be increased.

Fifth Modification of Sixth Embodiment

Figure 34:
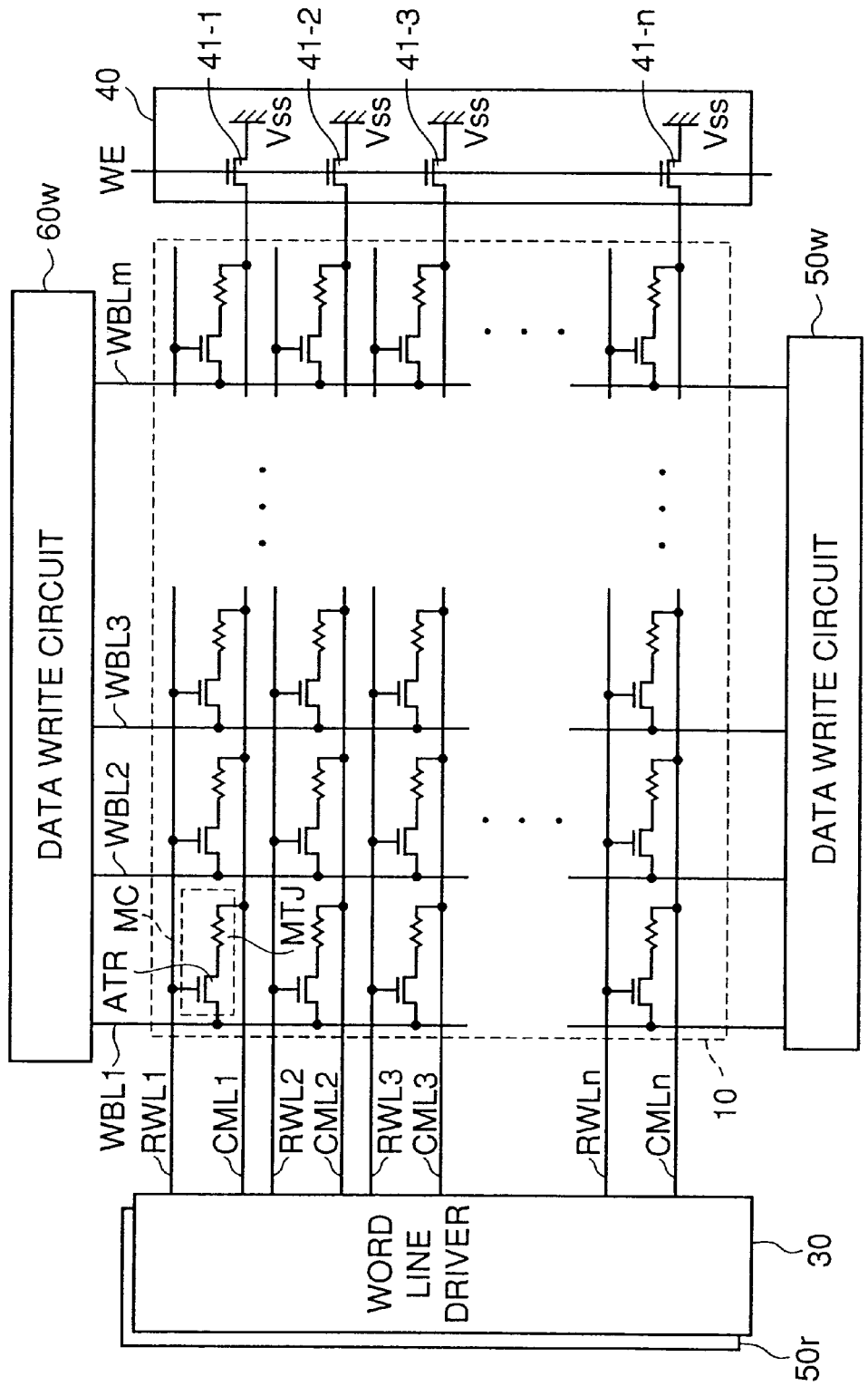
FIG. 34 is a block diagram showing the structure of a memory array 10 according to a fifth modification of the sixth embodiment.

Referring to FIG. 34, the memory array 10 according to the fifth modification of the sixth embodiment also has a plurality of MTJ memory cells MC arranged in n rows by m columns. The read word lines RWL and common lines CML are provided for the respective memory cell rows. The write bit lines WBL are provided corresponding to the respective memory cell columns. Accordingly, the read word lines RWL1 to RWLn, common lines CML1 to CMLn and write bit lines WBL1 to WBLm are provided in the entire memory array 10.

The word line current control circuit 40 has current control transistors 41-1 to 41-n electrically coupled between the respective common lines CML1 to CMLn and the ground potential Vss. The current control transistors 41-1 to 41-n couple the respective common lines CML to the ground potential Vss in the data write operation. In the operation other than the data write operation, the common lines CML1 to CMLn are disconnected from the ground potential Vss. In particular, the common lines CML are precharged to the ground potential Vss prior to the data read operation.

Figure 35:
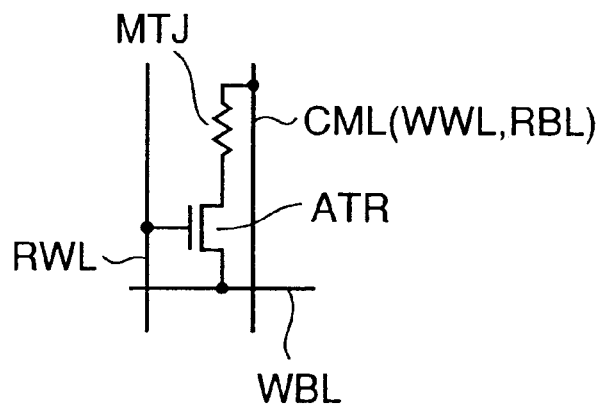
FIG. 35 is a circuit diagram showing the connection state of an MTJ memory cell according to the fifth modification of the sixth embodiment.

Referring to FIG. 35, in the MTJ memory cell according to the fifth modification of the sixth embodiment, the access transistor ATR is coupled between the write bit line WBL and magnetic tunnel junction MTJ. The read word line RWL is coupled to the gate of the access transistor ATR. The common line CML extends in the same direction as that of the read word line RWL, and is electrically coupled to the magnetic tunnel junction MTJ.

The common line CML operates in the same manner as that in the fourth modification of the sixth embodiment. The common line CML functions as write word line WWL in the data write operation, and functions as read bit line RBL in the data read operation.

According to the structure of the fifth modification of the sixth embodiment, the common line CML is directly electrically coupled to the magnetic tunnel junction MTJ. Therefore, the capacitance of the common line CML in the data read operation cannot be reduced. However, since the write word lines WWL and read bit lines RBL can be integrated into the common lines CML, the number of metal wiring layers to be formed in the manufacturing process is reduced, whereby reduction in manufacturing cost can be achieved.

Figure 36:
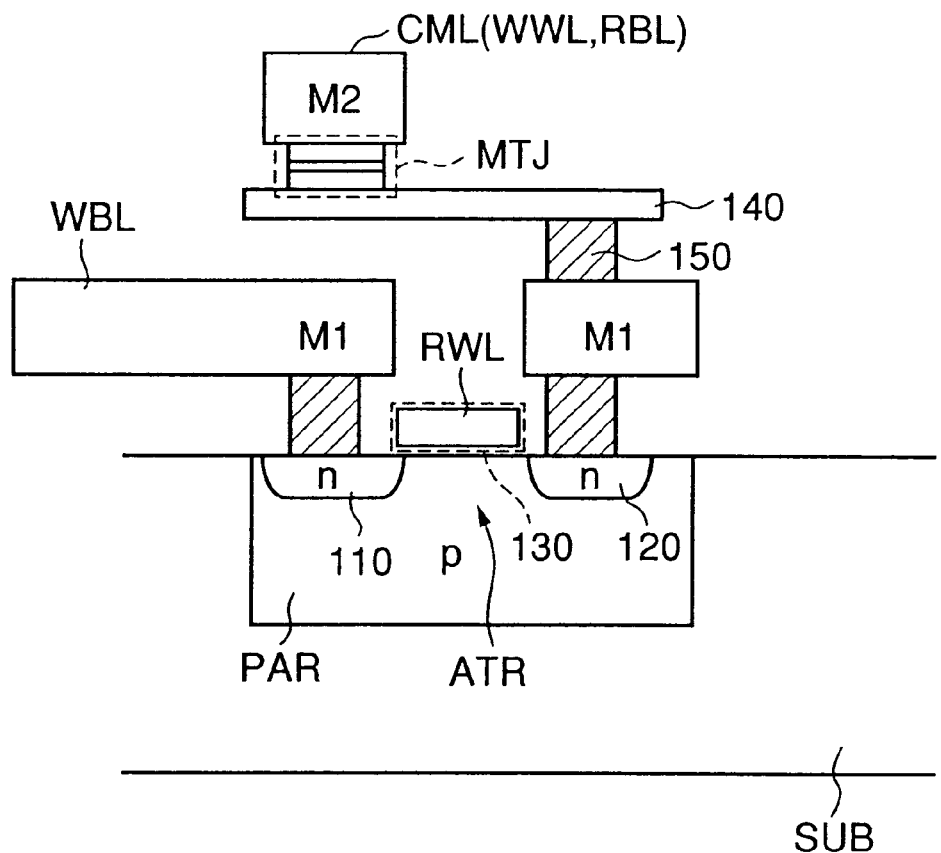
FIG. 36 is a structural diagram showing the arrangement of the MTJ memory cell according to the fifth modification of the sixth embodiment.

Referring to FIG. 36, in the MTJ memory cell according to the fifth modification of the sixth embodiment, the write bit line WBL is formed in the first metal wiring layer M1 so as to be electrically coupled to the source/drain region 110 of the access transistor ATR. The read word line RWL is formed in the same layer as that of the gate 130 of the access transistor ATR. The source/drain region 120 is coupled to the magnetic tunnel junction MTJ through the metal wiring formed in the first metal wiring layer M1, the barrier metal 140, and the metal film 150 formed in the contact hole.

The common line CML is formed in the second metal wiring layer M2 so as to be electrically coupled to the magnetic tunnel junction MTJ.

Sixth Modification of Sixth Embodiment

Figure 37:
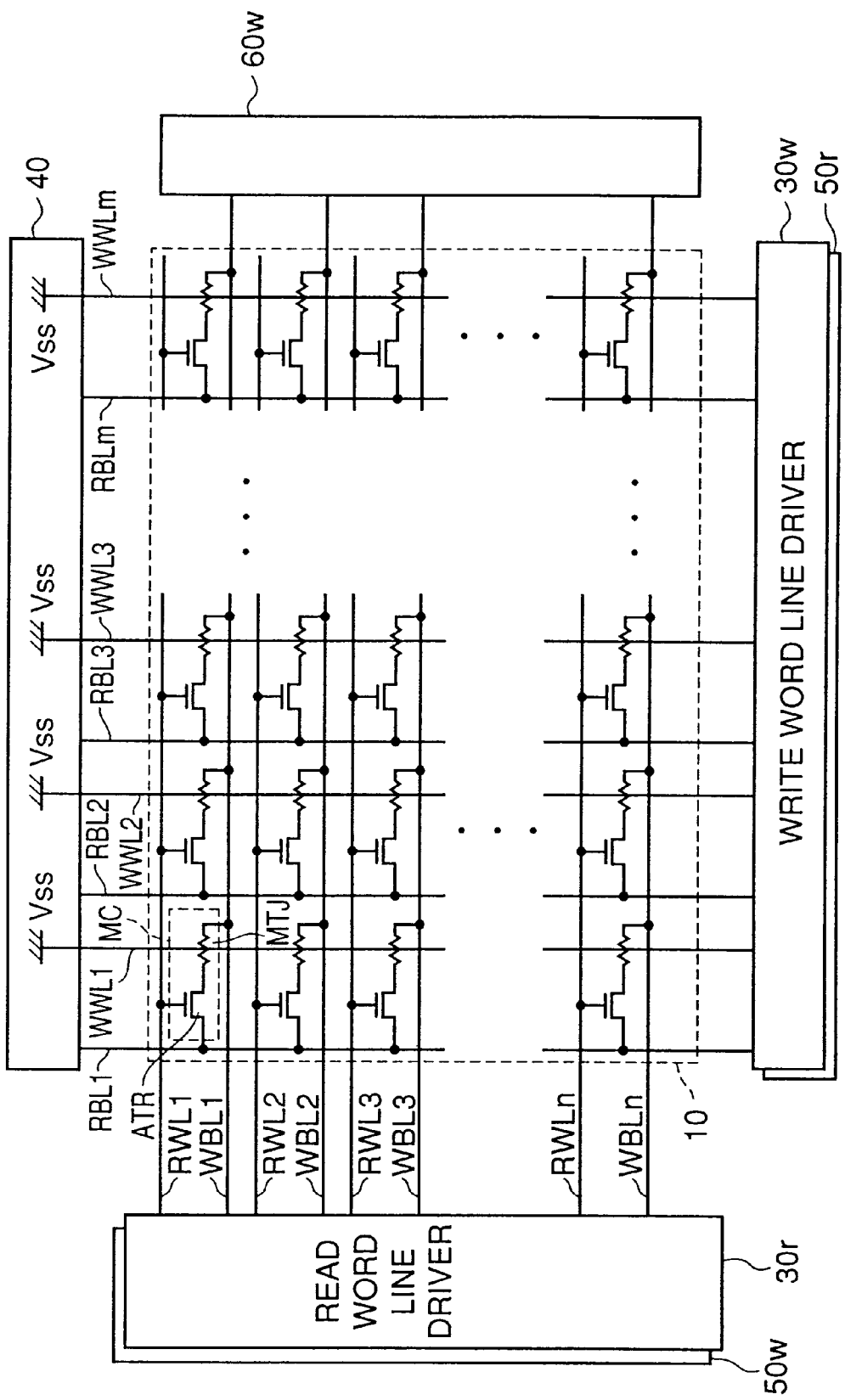
FIG. 37 is a block diagram showing the structure of a memory cell array 10 according to a sixth modification of the sixth embodiment.

Referring to FIG. 37, the memory array 10 according to the sixth modification of the sixth embodiment has a plurality of MTJ memory cells MC arranged in n rows by m columns. The read word lines RWL and write bit lines WBL are provided corresponding to the respective memory cell rows. The write word lines WWL and read bit lines RBL are provided corresponding to the respective memory cell columns. Accordingly, the read word lines RWL1 to RWLn, write bit lines WBL1 to WBLn, read bit lines RBL1 to RBLm, and write word lines WWL1 to WWLm are provided in the entire memory array 10.

Figure 38:
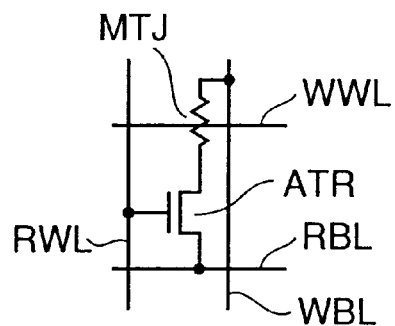
FIG. 38 is a circuit diagram showing the connection state of an MTJ memory cell according to the sixth modification of the sixth embodiment.

Referring to FIG. 38, in the MTJ memory cell according to the sixth modification of the sixth embodiment, the access transistor ATR has its gate coupled to the read word line RWL. The access transistor ATR is electrically coupled between the read bit line RBL and magnetic tunnel junction MTJ. The magnetic tunnel junction MTJ is coupled to the write bit line WBL extending in the same direction as that of the read word line RWL.

The write word line WWL extends perpendicularly to the write bit line WBL in the vicinity of the magnetic tunnel junction MTJ. Accordingly, the read word line driver 30r and the write word line driver 30w can be independently provided, whereby the same effects as those of the sixth embodiment can be obtained.

Moreover, the write word line WWL can be independently provided without being coupled to another portion of the MTJ memory cell. Therefore, the write word line WWL can be arranged in order to improve the magnetic coupling with the magnetic tunnel junction MTJ. As a result, the data write current Ip flowing through the write word line WWL can be reduced, whereby reduction in power consumption of the MRAM device can be achieved.

Moreover, the read bit line RBL is coupled to the magnetic tunnel junction MTJ through the access transistor ATR. Therefore, the number of magnetic tunnel junctions MTJ coupled to the read bit lines RBL is reduced, and the capacitance of the read bit line RBL is reduced. As a result, the data read speed can be increased.

Figure 39:
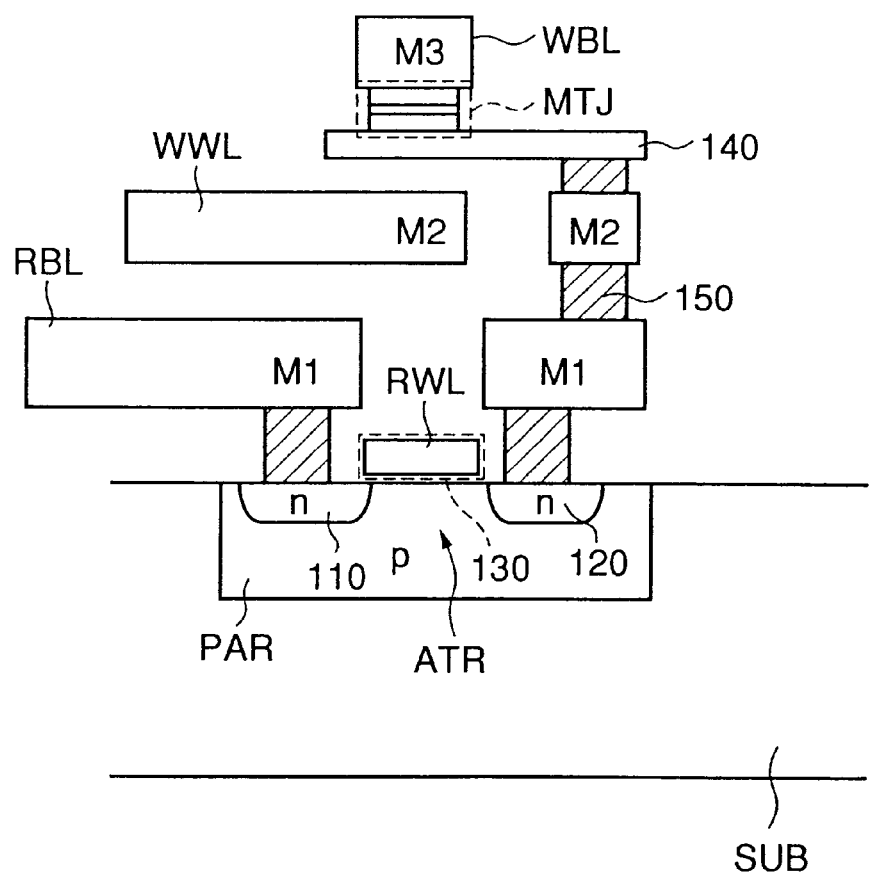
FIG. 39 is a structural diagram showing the arrangement of the MTJ memory cell according to the sixth modification of the sixth embodiment.

Referring to FIG. 39, in the MTJ memory cell according to the sixth modification of the sixth embodiment, the read bit line RBL is formed in the first metal wiring layer M1 so as to be electrically coupled to the source/drain region 110 of the access transistor ATR. The read word line RWL is formed in the same layer as that of the gate 130 of the access transistor ATR. The source/drain region 120 of the access transistor ATR is coupled to the magnetic tunnel junction MTJ through the metal wirings formed in the first and second metal wiring layers M1 and M2, the barrier metal 140, and the metal film 150 formed in the contact hole.

The magnetic tunnel junction MTJ is formed between the second and third metal wiring layers M2 and M3. The write bit line WBL is formed in the third metal wiring layer M3 so as to be electrically coupled to the magnetic tunnel junction MTJ. The write word line WLL is formed in the second metal wiring layer M2. At this time, the write word line WWL can be arranged so as to improve the magnetic coupling with the magnetic tunnel junction MTJ.

Figure 40:
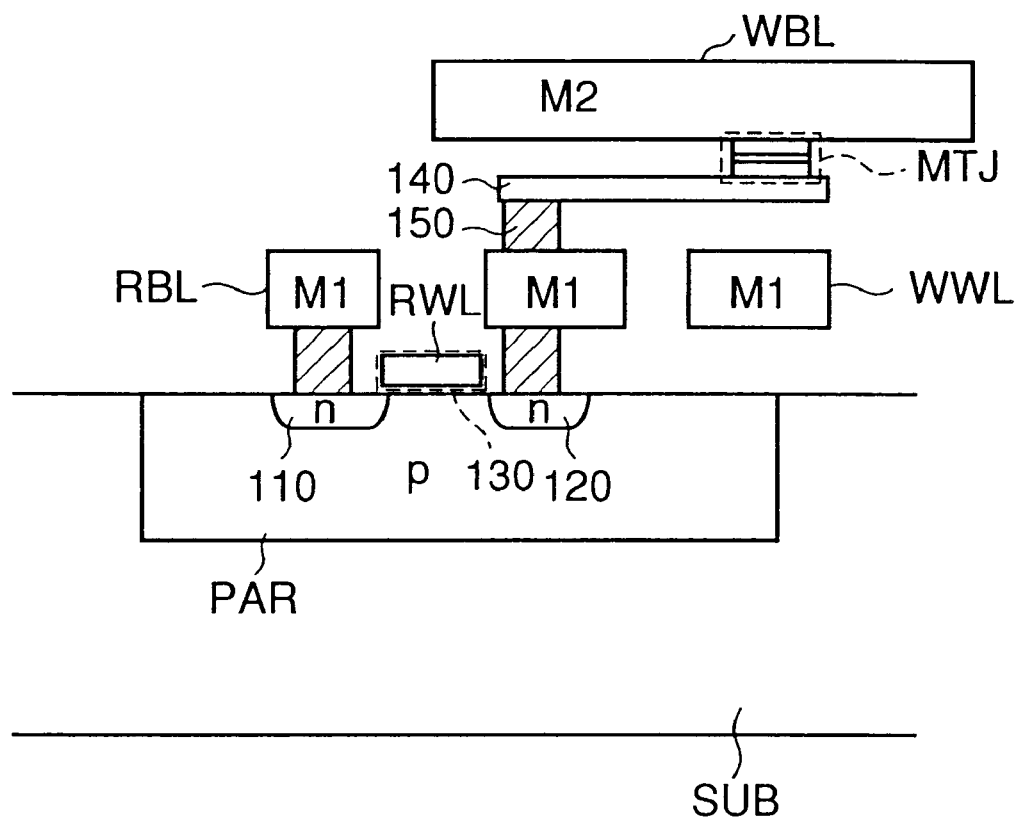
FIG. 40 is a structural diagram showing another example of the arrangement of the MTJ memory cell according to the sixth modification of the sixth embodiment.

In another exemplary structure shown in FIG. 40, the read bit line RBL and write word line WWL extending in the same direction are formed in the same metal wiring layer. Accordingly, the magnetic tunnel junction MTJ is formed between the first and second metal wiring layers M1 and M2, and the write word line WWL is formed in the same metal wiring layer M1 as that of the read bit line RBL in the vicinity of the magnetic tunnel junction MTJ. The write bit line WBL is formed in the second metal wiring layer M2 so as to be electrically coupled to the magnetic tunnel junction MTJ.

Accordingly, the number of metal wiring layers can be reduced as compared to the structure of the MTJ memory cell shown in FIG. 39. As a result, in addition to the effects obtained by the structure of the MTJ memory cell according to the sixth modification of the sixth embodiment, further reduction in manufacturing cost can be achieved.

As has been described above, according to the structures of the MTJ memory cell of the sixth embodiment and the first to fourth and sixth modifications thereof, the read word line RWL and write word line WWL can be made to extend perpendicularly to each other. Therefore, the write word line driver 30w and read word line driver 30r for driving the respective word lines can be separately provided. As a result, the freedom of layout can be improved.

Moreover, according to the structures of the MTJ memory cell of the first, fourth and fifth modifications of the sixth embodiment, the read bit lines RBL and write word lines WWL can be integrated into the common lines CML. Therefore, the number of wirings is reduced, whereby reduction in manufacturing cost can be achieved.

Moreover, according to the structures of the MTJ memory cell of the second, fourth and sixth modifications of the sixth embodiment, the read bit line RBL is coupled to the magnetic tunnel junction MTJ through the access transistor ATR, and therefore the capacitance of the read bit line RBL is reduced. As a result, the data read speed can be increased.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:
   a memory array having a plurality of magnetic memory cells arranged in rows and columns, each of the plurality of magnetic memory cells having a resistance value that varies according to a level of storage data to be written when a data write magnetic field applied by first and second data write currents is larger than a predetermined magnetic field;
   a plurality of write word lines provided corresponding to the respective rows of the magnetic memory cells, and selectively activated according to an address selection result in a data write operation so as to cause said first data write current to flow therethrough;
   a plurality of bit line pairs provided corresponding to the respective columns of the magnetic memory cells, and each including first bit line and second bit line;
   a data write control circuit for setting, in said data write operation, one of said first bit line and said second bit line included in one of said plurality of bit line pairs that is selected according to said address selection result, to one of a high potential state and a low potential state as well as setting the other bit line to the other potential state; and
   a plurality of bit line current control circuits provided respectively corresponding to said plurality of bit line pairs, for electrically coupling the corresponding first and second bit lines to each other in said data write operation so as to cause said second data write current to flow therethrough.

2. The thin film magnetic memory device according to claim 1, wherein the data write control circuit is driven with an external power supply potential that is externally supplied to the thin film magnetic memory device.

3. The thin film magnetic memory device according to claim 2, further comprising:
   a word line drive circuit for selectively driving said plurality of write word lines to an active state according to said address selection result; and
   a word line current control circuit for coupling each of said plurality of write word lines to a potential corresponding to an inactive state of said plurality of write word lines, wherein
   said word line drive circuit is driven with said external power supply potential.

4. The thin film magnetic memory device according to claim 1, further comprising:
   a data line pair provided in common to said plurality of bit line pairs and formed by first and second data lines; and
   a plurality of column selection gate circuits provided corresponding to the respective columns, each for connecting the corresponding first and second bit lines to the first and second data lines, respectively, according to said address selection result, wherein
   in said data write operation, said data write control circuit sets one of first and second internal nodes to one of said high potential state and said low potential state as well as set the other internal node to the other potential state, and
   said first and second internal nodes are respectively connected to said first and second data lines such that a wiring forming a path of said second data write current has an approximately constant resistance value regardless of a position of the column to be selected according to said address selection result.

5. The thin film magnetic memory device according to claim 4, wherein
   said plurality of bit line pairs extend in a column direction,
   said data line pair extends in a row direction,
   said first internal node is connected to said first data line in a region located on a top column side, and
   said second internal node is connected to said second data line in a region located on a last column side.

6. The thin film magnetic memory device according to claim 4, wherein
   said plurality of bit line pairs extend in a column direction,
   said data line pair extends in a row direction, and
   said first and second internal nodes are respectively connected to said first and second data lines in a region around middle one of the columns.

7. The thin film magnetic memory device according to claim 1, further comprising:
   a data line pair provided every M columns (where M is a natural number equal to or larger than 2), and formed by first and second data lines; and
   a plurality of column selection gate circuits provided corresponding to the respective columns, each for connecting the corresponding first bit line and the corresponding second bit line to the corresponding first and second data lines, respectively, according to said address selection result, wherein
   said data write control circuit is provided for each data line pair, and
   each of the data write control circuits operates according to said address selection result in said data write operation so as to set one of the corresponding first and second data lines to one of said high potential state and said low potential state as well as set the other data line to the other potential state.

8. The thin film magnetic memory device according to claim 7, wherein each of said data line pairs is provided in a middle of the corresponding M columns so as to extend in a same direction as that of said plurality of bit lines.

9. The thin film magnetic memory device according to claim 1, further comprising:
   a plurality of read word lines provided corresponding to the respective rows, and activated according to an address selection result in a data read operation for coupling the corresponding magnetic memory cells to the corresponding bit line pairs, respectively; and
   a data read control circuit for supplying a data read current to said first and second bit lines included in one of said plurality of bit line pairs that is selected according to said address selection result in said data read operation, wherein
   each of said bit line current control circuits electrically disconnects the corresponding first and second bit lines from each other in said data read operation.

10. The thin film magnetic memory device according to claim 9, wherein said magnetic memory cells in each column are coupled to one of the corresponding first and second bit lines, the thin film magnetic memory device further comprising:

a plurality of first dummy memory cells provided corresponding to the respective columns, and respectively coupled to said first bit lines;

a plurality of second dummy memory cells provided corresponding to the respective columns, and respectively coupled to said second bit lines;

a first dummy read word line provided corresponding to said plurality of first dummy memory cells, and activated according to said address selection result in said data read operation, for coupling said plurality of first dummy memory cells to the first bit lines, respectively;

a second dummy read word line provided corresponding to said plurality of second dummy memory cells, and activated according to said address selection result in said data read operation, for coupling said plurality of second dummy memory cells to said second bit lines, respectively; and a word line drive circuit for selectively activating one of said plurality of word lines and one of said first and second dummy read word lines according to said address selection result in said data read operation, wherein each of said magnetic memory cells having first or second resistance value according to the level of said storage data, each of said first and second dummy memory cells has an intermediate resistance value of said first and second resistance values.

11. The thin film magnetic memory device according to claim 9, further comprising:

a voltage down converter for down-converting an external power supply potential externally supplied to said thin film magnetic memory device into an internal power supply potential, wherein said data write control circuit is driven with said external power supply potential, and said data read control circuit is driven with said internal power supply potential.

12. A thin film magnetic memory device, comprising:

a memory array having a plurality of magnetic memory cells arranged in rows and columns, each of said plurality of magnetic memory cells having a resistance value that varies according to a level of storage data to be written when a data write magnetic field applied by first and second data write currents is larger than a predetermined magnetic field;

a plurality of write word lines provided corresponding to the respective rows of the magnetic memory cells, for causing said first data write current to flow therethrough according to an address selection result in a data write operation;

a plurality of bit lines provided corresponding to the respective columns of the magnetic memory cells;

a data line pair provided in common to said plurality of bit lines, and formed by first and second data lines;

a data write control circuit for setting one of said first and second data lines to one of a high potential state and a low potential state as well as setting the other data line to the other potential state in said data write operation;

a plurality of column selection gate circuits provided corresponding to the respective columns, for connecting the corresponding bit line to said first data line according to said address selection result; and a plurality of bit line current control circuits provided corresponding to the respective columns, for electrically coupling the corresponding bit line to said second data line so as to cause said second data write current to flow therethrough in said data write operation.

13. The thin film magnetic memory device according to claim 12, wherein, said data write control circuit sets one of first and second internal nodes to one of said high potential state and said low potential state as well as sets the other internal node to the other potential state in said data write operation, each of said bit line current control circuits electrically couples the corresponding bit line to said second data line according to said address selection result, the thin film magnetic memory device further comprising:

a data read control circuit for supplying a data read current to a third internal node in a data read operation; and a connection switching circuit for coupling said first and second internal nodes to said first and second data lines, respectively, in said data write operation, wherein said connection switching circuit electrically couples said first and second data lines to said third internal node and a fourth internal node for supplying a read reference potential, respectively, in said data read operation, and said data read control circuit performs said data read operation based on a potential on said third internal node.

14. The thin film magnetic memory device according to claim 12, wherein said data write control circuit sets one of first and second internal nodes to one of said high potential state and said low potential state as well as sets the other internal node to the other potential state in said data write operation, and each of said bit line current control circuits electrically couples the corresponding bit line to said second data line in a precharging operation prior to said data read operation, and electrically disconnecting the corresponding bit line from said second data line in said data read operation, wherein the thin film magnetic memory device further comprising:

a data read control circuit for supplying a data read current to the first data line in said data read operation; and a connection switching circuit for coupling said first and second internal nodes to said first and second data lines, respectively, in said data write operation, wherein said connection switching circuit electrically couples said first and second data lines to third and fourth internal nodes for supplying a read reference potential, respectively, in said precharging operation, and disconnects said first and second data lines from said first to fourth internal nodes in said data read operation, and said data read control circuit performs said data read operation based on a potential on the first data line.

15. A thin film magnetic memory device, comprising:

a memory array having a plurality of magnetic memory cells arranged in rows and columns, each of said plurality of magnetic memory cells including a magnetic storage portion having a resistance value that varies according to a level of storage data to be written when a data write magnetic field applied by first and second data write currents is larger than a predetermined magnetic field, and a memory cell selection gate for passing a data read current therethrough into said magnetic storage portion in a data read operation;

a plurality of read word lines provided corresponding to the respective rows of the magnetic memory cells, for actuating the corresponding memory cell selection gate according to an address selection result in said data read operation;

a plurality of write word lines provided corresponding to the respective columns of the magnetic memory cells, and selectively driven to an active state according to an address selection result in a data write operation so as to cause said first data write current to flow therethrough;

a plurality of write data lines provided corresponding to the respective rows, for causing said second data write current to flow therethrough in said data write operation; and a plurality of read data lines provided corresponding to said respective columns, for causing said data read current to flow therethrough in said data read operation.

16. The thin film magnetic memory device according to claim 15, wherein each of said plurality of read data lines is electrically coupled to each of said magnetic storage portions in the corresponding row through the respective memory cell selection gates.

17. The thin film magnetic memory device according to claim 15, wherein each of said plurality of read data lines and each of said plurality of write word lines share a same common line, the thin film magnetic memory device further comprising:

a current control circuit for coupling and disconnecting a first potential to and from each said common line in said data read and write operations, respectively, said first potential being different from a second potential corresponding to the active state.

18. The thin firm magnetic memory device according to claim 15, wherein said plurality of read data lines are precharged to a predetermined potential prior to said data read operation, said plurality of read data lines are further set at said predetermined potential in said write operation.

19. A thin film magnetic memory device, comprising:

a memory array having a plurality of magnetic memory cells arranged in rows and columns, each of the plurality of magnetic memory cells including a magnetic storage portion having a resistance value that varies according to a level of storage data to be written when a data write magnetic field applied by first and second data write currents is larger than a predetermined magnetic field, and a memory cell selection gate for passing a data read current therethrough into said magnetic storage portion in a data read operation;

a plurality of read word lines provided corresponding to the respective rows of the magnetic memory cells, for actuating the corresponding memory cell selection gate according to an address selection result in the data read operation;

a plurality of write data lines provided corresponding to one of the respective rows and the respective columns, for causing said first data write current to flow therethrough in said data write operation; and a plurality of common lines provided corresponding to the other of the respective rows and the respective columns, wherein each of the plurality of common lines selectively receives supply of said data read current according to said address selection result in said data read operation, and each of said plurality of common lines is selectively driven to a first potential so as to cause said second data write current to flow therethrough in said data write operation, the thin film magnetic memory device further comprising:

a current control circuit for coupling and disconnecting a second potential to and from each of said common lines in said data read and write operations, respectively, said second potential being different from said first potential.

20. The thin film magnetic memory device according to claim 19, wherein each of the plurality of common lines is electrically coupled to each of said magnetic storage portions in the corresponding the other of row and column through the respective memory cell selection gates.

21. The thin firm magnetic memory device according to claim 19, wherein said plurality of common lines are precharged to said second potential prior to said data read operation, non-selected common lines among said plurality of common lines according to said address selection result are set at said second potential in said write operation.

* * * * *